(12) United States Patent
Satoh

(10) Patent No.: US 6,243,295 B1
(45) Date of Patent: Jun. 5, 2001

(54) NONVOLATILE SEMICONDUCTOR MEMORY

(75) Inventor: Shinji Satoh, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/526,849

(22) Filed: Mar. 16, 2000

(30) Foreign Application Priority Data

Mar. 19, 1999 (JP) .................................................. 11-076061

(51) Int. Cl.[7] .................................................. G11C 16/04
(52) U.S. Cl. ............................................................ 365/185.17
(58) Field of Search ........................ 365/185.17, 185.24, 365/185.27, 185.29, 185.33

(56) References Cited

U.S. PATENT DOCUMENTS

| | | | |
|---|---|---|---|
| 5,088,060 | * 2/1992 | Endoh et al. | 365/185.17 |
| 5,946,230 | 8/1999 | Shimizu | 365/185.01 |
| 6,157,056 | * 12/2000 | Takeuchi et al. | 365/185.17 |

OTHER PUBLICATIONS

U.S. application No. 09/217,089, filed Dec. 21, 1999.
U.S. application No. 09/104,163, filed Jun. 25, 1999.

* cited by examiner

Primary Examiner—Trong Phan
(74) Attorney, Agent, or Firm—Hogan & Hartson, LLP

(57) ABSTRACT

A memory cell in a NAND cell unit is constructed by a main transistor and parasitic transistor, which share a floating gate electrode and control gate electrode, and are connected in series with each other. The parasitic transistor is formed at an edge portion of the main transistor and, more particularly, an edge portion of the floating gate electrode. The threshold value of the parasitic transistor is higher than that of the main transistor. The parasitic transistor is formed in an offset area defined by the space between the edge portion of the floating gate electrode and the source/drain region. The offset area can be provided by forming a spacer on side wall portions of the floating gate electrode and control gate electrode.

48 Claims, 56 Drawing Sheets

N: NATURAL NUMBER $$Vch = \frac{C1}{C1+C2} Vcg$$

$$BOOST\ RATIO = \frac{C1}{C1+C2}$$

MEMORY CELL

SELECT GATE
TRANSISTOR

Vth1, Vth3 ≠ Vth2 ALWAYS HOLDS, AND Vth1, Vth3 > Vth2 IS PREFERABLE.
EITHER Vth1 ≠ Vth3 OR Vth1 = Vth3 MAY HOLD, BUT Vth1 = Vth3 IS PREFERABLE.
Vth1, Vth2 AND Vth3 DEPEND ON STATE ("0" OR "1") OF MEMORY CELL.

MEMORY CELL

SELECT GATE TRANSISTOR

NONVOLATILE SEMICONDUCTOR MEMORY

CROSS-REFERENCE TO RELATED APPLICATIONS

This application is based upon and claims the benefit of priority from the prior Japanese Patent Application No. 11-076061, filed Mar. 19, 1999, the entire contents of which are incorporated herein by reference.

BACKGROUND OF THE INVENTION

The present invention relates to a nonvolatile semiconductor memory having a stacked gate structure and, more particularly, to a nonvolatile semiconductor memory used in a NAND flash EEPROM.

A NAND flash EEPROM (Electrically Erasable and Programmable Read Only Memory) is well known as a nonvolatile semiconductor memory which can electrically change program data, and has a memory cell structure suitable for high integration of elements (large memory capacity).

FIG. 1 shows a memory cell array of the NAND flash EEPROM. FIG. 2 shows an example of the memory cell structure of the NAND flash EEPROM.

The memory cell array of the NAND flash EEPROM comprises a plurality of NAND cell units disposed in a matrix. Each NAND cell unit is constructed by NAND cells each consisting of a series circuit of a plurality of (16 in this case) memory cells, and two select gate transistors respectively connected to the end cells.

The memory cells and select gate transistors in each NAND cell unit are disposed in a p-well 12 in an n-well 11 formed on a p-semiconductor substrate 10, i.e., in a twin-well.

The memory cells in the NAND cell have a so-called stacked gate structure formed by stacking control gate electrodes CG0, ..., CG15 on floating gate electrodes FG. Also, the select gate transistors have the same stacked gate structure as that of the memory cells, but only the lower layers serve as gate electrodes SGS and SGD in practice.

The control gate electrodes (word lines) CG0, CG1, ..., CG15 respectively run in the row direction of the memory cell array, and are commonly connected to the memory cells in the same rows. Likewise, the select gate electrodes (select gate lines) SGS and SGD run in the row direction of the memory cell array, and are commonly connected to the select gate transistors in the NAND cell units in the same rows.

In each NAND cell unit, two neighboring transistors (memory cells and/or select gate transistor) share a single diffusion layer (source or drain) 13. Also, two neighboring NAND cell units in the column direction share a drain diffusion layer 13a or source diffusion layer 13b.

The select gate transistor on one end side (on the drain diffusion layer 13a side) of the NAND cell is connected to a bit line (data line) BLi, and the select gate transistor on the other end side (on the source diffusion layer 13b side) to a source line (reference potential line) SL. The source line SL is commonly connected to all the NAND cell units.

As one of data programming methods in the NAND flash EEPROM, a method called self boost programming is known.

When self boost programming is used, since all MOS transistors connected to a given bit line, MOS transistors that construct a column decoder, and the like can be driven by an external power supply potential Vcc or an internal power supply potential Vdd which is generated based on the external power supply potential Vcc and has a value lower than the external power supply potential Vcc, so-called low-voltage operation is allowed. That is, when self boost programming is used, the need for a booster circuit for supplying high potential to these MOS transistors can be obviated, and the total area of peripheral circuits around the memory cell array can be reduced, thus attaining a reduction of the chip area.

The procedures of the data program step based on self boost programming will be explained below.

The data erase step is done to set memory cells in an erase state ("1"-state). After that, data programming is executed in units of pages or bytes.

In the normal program step, in each NAND cell unit, programming is done in units of cells in the order from a memory cell farthest from a bit line (a memory cell on the source line side) toward memory cells on the bit line side. On the other hand, in random programming, programming is done for an arbitrary one of a series circuit of a plurality of memory cells connected between the bit and source lines.

As shown in FIG. 3, in self boost programming, a gate electrode (select gate line) SG2 of select gate transistors S21 and S22 on the source line side is set at 0V to set these select gate transistors S21 and S22 in a cutoff state.

Next, 0V (data "0") is applied to a bit line (selected bit line) BL1 to which a memory cell A (M21) that is to undergo "0"-programming ("0"-programming memory cell) is connected, and a plus potential (data "1") is applied to a bit line (unselected bit line) BL2 to which a memory cell B (M22) that is to undergo "1"-programming ("1"-programming memory cell), i.e., a program inhibition cell, is connected. This plus potential is set at a value equal to or higher than a potential applied to a gate electrode (select gate line) SG1 of select gate transistors S11 and S12 on the drain side.

At this time, the select gate transistor S11 on the drain side is turned on, and the potential (0V) on the bit line BL1 is transferred to the channel of the memory cell A (M21). Also, the select gate transistor S12 on the drain side is initially turned on, and an initial potential is transferred to the diffusion layer (source/drain) of the memory cell B (M22). After that, the select gate transistor S12 on the drain side is cut off.

Note that the plus potential applied to a bit line BL2 may be lower than that to be applied to the gate electrode (select gate line) SG1 of the select gate transistors S11 and S12 on the drain side. In this case, it is necessary to cut off the select gate transistor S12 on the drain side.

In this state, a selected word line (control gate line) WL2 is set at a program potential Vpp, and unselected word lines (control gate lines) WL1 and WL3 to WLN in the selected block are set at a passing potential Vpass (Vpp>Vpass>Vcc) that at least turns on memory cells.

For example, these potentials Vpp and Vpass are applied at the following timings.

The potential of the select gate line SG1 of the select gate transistors on the bit line side are set at a power supply potential Vcc. When the potentials of all the unselected word lines (control gate lines) are set at a passing potential Vpass, since memory cells M11 to MN1 and the select gate transistor S11 in the NAND cell unit connected to the bit line BL1 are turned on, the potential (0V) on the bit line BL1 are transferred to the channels of the memory cells M11 to MN1.

Also, to the channels of memory cells M12 to MN2 in the NAND cell unit connected to the bit line BL2 charges are transferred from the bit line BL2 via the select gate transistor S12. Hence, the channel potentials of the memory cells M12 to MN2 in the NAND cell unit connected to the bit line BL2 gradually rise, and reach an initial potential obtained by subtracting a threshold value Vth of the select gate transistor S12 from a bit line potential VBL2.

When the channel potentials have reached the initial potential, the select gate transistor S12 is cut off, and the channels of the memory cells M12 to MN2 float. At this time, 0V or a plus potential VSL which is high enough to cut off the select gate transistor S22 on the source side is applied to the source line. When the unselected word lines are set at Vpass, the potentials of the channel and the diffusion layer of the memory cell are boosted.

After that, a program potential pulse Vpp is applied to the selected word line WL2.

Hence, the channel potential of the "0"-programming memory cell A (M21) is set at 0V, and the potential of the word line (control gate line) WL2 is set at Vpp, thus executing a "0"-programming operation (an operation for injecting electrons into the floating gate electrode) for the memory cell A (M21).

On the other hand, the initial potential of the channel of the "1"-programming memory cell B (M22) is VBL2–Vth. On the other hand, since the channel of the memory cell B (M22) is floating, when the passing potential pulse Vpass is applied to the unselected word line WL1, WL3–WLN, the channel potential of the memory cell M12–MN2 rises due to capacitive coupling across the channel of the memory cell and the control gate line.

Hence, in the "1"-programming memory cell B (M22), since no high voltage is applied across the channel and control gate line, no electrons are injected into the floating gate electrode. That is, a "1"-programming operation (an operation for maintaining an erase state) is done for the memory cell B (M22).

In order to maintain the memory cell B (M22) erased, the channel potential of the memory cell B (M22) can be set to be sufficiently high, so that no high voltage is applied across the channel of the memory cell B (M22) and control gate line. That is, as for the memory cell B (M22), the channel potential value is set so that a variation of a threshold voltage due to the program pulse Vpp falls within an allowable range.

The channel potential of the selected memory cell B (M22) rises with increasing value of Vpass, and a variation of the threshold voltage of the memory cell B (M22) can be minimized.

Note that the above description is premised on a case wherein two-level data ("1", "0") is stored in a memory cell. Of course, self boost programming can be applied to a case wherein multi-level data (three-level or higher data) is stored in a memory cell. When multi-level data is stored in a memory cell, "1" of two-level data can be replaced by "0", and "0" of two-level data can be replaced by "1", "2", . . . , "N".

The operation sequence of self boost programming has been explained. In this programming, program errors occur upon data programming.

More specifically, as shown in FIG. 3, when "0"-programming (program with a positive threshold value) is done for the selected memory cell A (M21) connected between the word line WL2 and bit line BL2, program errors occur in the selected "1"-programming memory cell B, and an unselected memory cell C (M31).

Note that program errors are likely to occur in memory cells other than B and C in FIG. 3. More specifically, a problem that has taken place in the memory cell B also takes place in "1"-programming memory cells which are connected to bit lines other than the bit line BL2, and a problem that has taken place in the memory cell C takes place in all unselected memory cells in the NAND cell unit including the memory cell A.

Program error in the memory cell B (M22) will be explained below. The selected word line (control gate line) WL2 is set at the program potential Vpp. On the other hand, the initial potential of the channel of the memory cell B (M22) is VBL2–Vth. After that, when the program potential Vpp is applied to the selected word line WL2, and the passing potential Vpass is applied to the unselected word lines WL1, WL3, . . . , WLN, the channel potential of the memory cell B (M2) rises to a value higher than the initial potential due to capacitive coupling.

Therefore, in order to prevent any program error in the memory cell B (M22), Vpass must be set at a largest possible value to set a sufficiently high channel potential of the memory cell B (M22) and to relax the voltage across the channel of the memory cell B (M22) and the control gate line.

Program error in the memory cell C (M31) will be explained below. Upon data programming, the unselected word lines (control gate lines) WL1, WL3, . . . , WLN are set at Vpass (Vpp>Vpass>Vcc). On the other hand, the channel potential of the memory cell C (M31) is maintained at 0V.

Hence, in order to prevent any program error in the memory cell C (M31), Vpass must be set at a smallest possible value to relax the voltage across the channel of the memory cell C (M31) and the control gate line.

In this way, in the "0"-programming operation for the memory cell A (M21), a variation of the threshold voltage of the "1"-programming memory cell B (M22), and that of the unselected memory cell C (M31) must be minimized. However, when Vpass is set at a large value, a variation of the threshold voltage of the memory cell B (M22) becomes small, but that of the memory cell C (M31) becomes large. Conversely, when Vpass is set at a small value, a variation of the threshold voltage of the memory cell C (M31) becomes small, but that of the memory cell B (M22) becomes large.

For this reason, Vpass is set at an optimal value so that variations of the threshold voltages of the memory cells B and C fall within an allowable range.

Note that the program error problem and the problem upon determining an optimal value of Vpp in self boost programming will be described in detail later.

FIGS. 4A and 4B show a capacitance formed in the memory cell.

The capacitance formed in the memory cell includes a capacitance C1 formed between the channel and control gate electrode CG, and a junction capacitance C2 formed between the channel ($n^+$-diffusion layer) and the p-well 12. The capacitance C1 consists of a capacitance formed between the channel and floating gate electrode (charge accumulation layer) FG, and a capacitance formed between the floating gate electrode FG and control gate electrode (CG).

For example, when a potential Vcg is applied to the control gate electrode CG, a channel potential Vch of the memory cell becomes {C1/(C1+C2)}×Vcg, as shown in FIG. 4B. That is, the potential Vcg of the control gate electrode CG and the channel potential Vch of the memory cell satisfy Vch=α×Vcg. This constant (C1/(C1+C2)) is called a boost ratio (or boost ratio) of the channel.

Upon data programming, a potential Vcg of a control gate electrode CG of a selected sell in a selected block is set at a high program potential Vpp, and potentials Vcg of control gate electrodes CG of unselected cells in the selected block are set at Vpass (Vcc<Vpass<Vpp).

In a NAND cell unit including the selected cell which is to undergo "1"-programming (to maintain it erased), channel potentials Vch of individual memory cells rise on the basis of potentials Vcg of the control gate electrodes CG and the boost ratio α. Finally, the channel potentials Vch of the respective memory cells in this NAND cell unit are finally uniformed and rise up to a predetermined value.

Normally, the values Vpass and Vpp are gradually stepped up like an initial potential, step potential, and final potential, and the pulse widths of Vpass and Vpp are optimized. Such step-up programming is effective for narrowing down the threshold voltage distribution range after "0"-programming of a selected cell which is to undergo "0"-programming (to raise the threshold value from an erase state), and to prevent "0"-programing (program errors) of a selected "1"-programming cell, and of unselected cells.

In the NAND flash EEPROM, the memory cell array is normally segmented into a plurality of blocks. Data erase is done in units of blocks (block erase) or is simultaneously done for all the blocks (chip erase). In block erase, data in memory cells within a predetermined block can be erased, and data in memory cells in a plurality of arbitrary blocks can be erased. Also, in chip erase, data in memory cells in all the blocks are simultaneously erased.

Chip erase is don e by setting all control gate lines (word lines) in the memory cell array at 0V, setting the potentials of all select gate line s at Vpp (e.g. 18V), and applying a high erase potential (e.g., 20V) to a p-well. At this time, electrons in floating gate electrodes are released into the p-well due to the tunnel effect, and the threshold values of memory cells change in the negative direction.

Block erase is done by setting all control gate lines (word lines) in a selected block at 0V, setting all control gate lines and all select gate lines in unselected blocks at Vpp (e.g., 18V), setting the bit and source lines BL and SL in a floating state, and applying a high erase potential (e.g., 20V) to the p-well. At this time, in memory cells in the selected block, electrons in floating gate electrodes are released into the p-well due to the tunnel effect, and the threshold values of the memory cells change in the negative direction.

Note that all the select gate lines in chip erase and the control gate lines and all the select gate lines in the unselected blocks may be set at a predetermined potential which is higher than 0V and is equal to or lower than the erase high potential (e.g., 20V) in place of Vpp, or may float.

After data erase, verify read is done to verify if threshold values of all the memory cells to be erased fall within a predetermined threshold value range within which an erase state is determined. Based on data read out from the memory cells by verify read, erase OK or NG is determined, and if erase NG (insufficient) is determined, data erase is redone.

When the threshold voltage of a memory cell which stores data "1" is negative, and that of a memory cell which stores data "0" is positive, data read is done by precharging the potential of the bit line BL to a precharge potential in advance, then applying a read potential (e.g., 3.5V) to the select gate lines in the selected blocks and unselected control gate lines so as to keep select gate transistors and unselected memory cells ON, and applying 0V to the selected control gate line.

At this time, since memory cells for one page connected to the selected control gate line are turned on or off in accordance with their threshold voltages, memory cell data ("0" or "1") can be read out by detecting a change in potential of the bit line BL by a sense amplifier. Since the select gate lines in unselected blocks are set at 0V, select gate transistors in the unselected blocks are kept OFF.

The device structure of the conventional NAND flash EEPROM will be explained below.

FIG. 5 is a plan view showing an example of the device structure of the conventional NAND flash EEPROM. FIG. 6 is a sectional view taken along a line VI—VI in FIG. 5, and FIG. 7 is a sectional view taken along a line VII—VII in FIG. 5.

The memory cell array of the NAND flash EEPROM comprises a plurality of NAND Cell units disposed in a matrix. Each NAND cell unit is constructed by NAND cells each consisting of a series circuit of a plurality of (16 in this case) memory cells, and two select gate transistors respectively connected to the end cells.

The memory cells and select gate transistors in each NAND cell unit are disposed in a p-well 12 in an n-well 11 formed on a p-semiconductor substrate 10, i.e., in a twin-well.

Each memory cell in the NAND cell has, on a gate insulating film (tunnel oxide film) 4, a so-called stacked gate structure formed by stacking a control gate electrode 7 on a floating gate electrode 5 via an interpoly insulating film (ONO film) 6. Also, each select gate transistor has the same stacked gate structure as that of the memory cell, but only the lower layer serves as a gate electrode in practice.

Control gate electrodes (word lines) 7 run in the row direction of the memory cell array, and are commonly connected to memory cells in the same rows. Likewise, select gate electrodes (select gate lines) run in the row direction of the memory cell array, and are commonly connected to select gate transistors in NAND memory cell units in the same rows.

In each NAND cell unit, two neighboring transistors (memory cells and/or select gate transistor) share a single diffusion layer (source or drain) 1a. Also, two NAND cell units neighboring in the column direction share a drain diffusion layer 1b or source diffusion layer 1c.

The select gate transistor on one end side (on the drain side) of the NAND cells is connected to a bit line (data line) 9 via a bit line contact portion 14 formed in an insulating interlayer 8, and the select gate transistor on the other end side (on the source side) to a source line (reference potential line) 15 via a source line contact portion 16 formed in the insulating interlayer 8. The source line 15 is commonly connected to, e.g., all the NAND cell units.

In the NAND flash EEPROM shown in FIGS. 5 to 7, an isolation region 3a that surrounds an element region 3 is a field oxide film formed by LOCOS. Instead, as shown in, e.g., FIGS. 8 and 9, the isolation region 3a may be formed by a silicon oxide film with an STI (Shallow Trench Isolation) structure.

In the conventional NAND flash EEPROM using self boost programming, the following problems are posed in association with the memory cell structure, process, operation (e.g., the channel potential of a "1"-programming cell upon programming), and the like.

FIG. 10 shows the timing waveforms of potentials to be applied to the memory cells upon self boost programming.

A potential VBL1 of a bit line BL1 to which a "0"-programming memory cell is connected is set at 0V, and a potential VBL2 of a bit line BL2 to which a "1"-programming memory cell is connected is set at a power supply potential Vcc (e.g., 3.3V). Also, a potential vsg2 of a select gate line SG2 on the source side is set at 0V, and a potential Vsg1 of a select gate line SG1 on the bit line side is set at the power supply potential Vcc. At this time, two select gate transistors in a NAND cell unit which includes the "1"-programming memory cell are turned off, and the channels and diffusion layers of the memory cells in this NAND cell unit electrically float.

After that, when a potential VWL2 of a selected word line WL2 is set at a program potential Vpp, and potential VWL1 and VWL3 to VWLN of unselected word lines WL1 and WL3 to WLN are set at a passing potential Vpass (Vcc<Vpass<Vpp), a potential Vch of the channel (in the floating state) of the "1"-programming memory cell is boosted to a predetermined value.

Note that the channel potential of the "1"-programming memory cell and potentials to be applied to the memory cells satisfy:

$$Vch=Vsg-Vsgth (Vchinit)+Cr1(Vpass-Vpassth-Vchinit)+ Cr2(Vpp-Vchinit)-(Tpw/16Cch)\times I \qquad (1)$$

where Vsg corresponds to the potential Vsg1 of the select gate line SG1 on the bit line side (drain side), and is set at, e.g., the power supply potential Vcc. Vchinit is the initial potential transferred from the bit line to the channel of each memory cell, Vsgth(Vchinit) is the threshold value of the select gate transistor on the bit line side when the channel potential is Vchinit, Cr1 is the boost ratio of the channel of each memory cell to which Vpass is applied, and Cr2 is the boost ratio of the channel of each memory cell to which a program pulse Vpp is applied.

Also, Vpassth is the potential required for the memory cell applied with Vpass to turn it on when the channel potential is Vch, Tpw is the pulse width of the program pulse Vpp, Cins is the capacitance per memory cell, Cch is the sum of the capacitance of a depletion layer lying under the channel, and the junction capacitance between the diffusion layer and p-well, and I is the total of currents that flow from the channel to the wells and bit line.

More specifically, by applying the program potential Vpp to the selected word line, and applying the passing potential Vpass (Vcc<Vpass<Vpp) to unselected word lines, the potential of the channel (floating state) of a "1"-programming memory cell is boosted to Vch. For this reason, in the "1"-programming memory cell, hardly any electrons are injected into the floating gate electrode, and an erase state is maintained, thus preventing program errors ("0"-programming).

However, the channel potential of the "1"-programming cell does not sufficiently rise, and program errors occur.

For example, variations of the concentration profile of an impurity (e.g., boron) in the p-well in which the select gate transistors and memory cells are formed, the concentration profile of an impurity doped into the channels of the select gate transistors and memory cells, and the concentration profile of an impurity in the diffusion layers (source/drain) of the select gate transistors and memory cells often lower the initial potential Vchinit transferred from the bit line to the channels. Also, an increase in capacitance formed in the depletion layer under the channels lower the boost efficiencies (Cr1, Cr2) of the channels. In this case, the channel potential of a "1"-programming memory cell does not sufficiently rise upon programming, the threshold value of that memory cell rises, and as a result, a program error ("0"-programming) occurs in that memory cell.

FIG. 11 shows the relationship between the variations of the threshold values of memory cells which do not undergo "0"-programming and the value of the passing potential Vpass to be applied to unselected word lines in the program operation.

Assume that cells A, B, and C indicate those shown in FIG. 3, and data in these memory cell are set in a "1"-state (erase state). Also, cell A is a "0"-programming cell, cell B is a "1"-programming cell, and cell C is an unselected cell (non-programming cell).

When Vpass is set at a low value, the channel potential of selected "1"-programming cell B does not sufficiently rise upon "0"-programming of selected cell A, and electrons are injected into the floating gate electrode of selected cell B. For this reason, as indicated by the dotted curve in FIG. 11, the threshold value of selected "1"-programming cell B gradually rises from an initial value Vth1, and exceeds the boundary between "1"- and "0"-states indicated by the one-dashed chain line. As a consequence, a program error ("0"-programming) takes place in selected "1"-programming cell B.

On the other hand, when Vpass is set at a sufficiently high value, the channel potential of selected "1"-programing cell B sufficiently rises upon "0"-programming of selected cell A. For this reason, as indicated by the solid curve in FIG. 11, the threshold value of selected "1"-programming cell B maintains Vth1 (erase state), and any program error ("0"-programming) can be prevented (i.e., "1"-programming is done).

As for unselected cell C, 0V is transferred from the bit line to its channel and its channel potential is fixed at 0V, as in selected cell A.

Therefore, when the Vpass value is too high, upon "0"-programming of selected cell A a high voltage is applied across the control gate electrode and channel of unselected cell C, and electrons are injected into the floating gate electrode of unselected cell C. For this reason, as indicated by the broken curve in FIG. 11, the threshold value of unselected cell C gradually rises from the initial value Vth1, and exceeds the boundary between "1"- and "0"-states indicated by the one-dashed chain line. As a consequence, a program error ("0"-programming) takes place in unselected cell C.

When the Vpass value is set to be sufficiently low upon "0"-programming of selected cell A, the voltage applied across the control gate electrode and channel of unselected cell C is relaxed. As a result, as indicated by the broken curve in FIG. 11, the threshold value of unselected cell C maintains Vth1 (erase state), and any program error ("0"-programming) is prevented.

In this way, a sufficiently high Vpass value must be set to prevent any program error in selected "1"-programming cell, while a sufficiently low Vpass value must be set to prevent any program error in unselected cell C.

Therefore, in order to prevent any program errors in all cells which do not undergo "0"-programming, the range of the passing potential Vpass must be selected so that the threshold values (solid and broken curves) after the program operation are always set below the boundary (one-dashed chain curve) between the "1"- and "0"-states, and the Vpass value must be determined from that range.

However, variations of the threshold values of the memory cells upon data programming are also influenced by variations of the gate width, gate length, and wing width (the width of the floating gate electrode on the isolation region) of each memory cell, the thickness of a tunnel oxide film, the thickness of an interpoly insulating film (an insulating film on the floating gate electrode), and the like during the wafer process.

That is, even when the Vpass value is set at an optimal value, program errors often occur in cells which do not undergo "0"-programming upon data programming due to variations of the dimensions and the like of the memory cells in the wafer process.

Upon programming, the passing potential Vpass and program potential Vpp are applied to memory cells in a selected block in the memory cell array. For this reason, when the dimensions of the memory cells vary in the wafer process, variations of the threshold values upon programming become larger with increasing number of memory cells (the number of bits) per block.

Hence, when memory cells are miniaturized to increase the number of memory cells per NAND cell unit or those connected to a single word line, the aforementioned problem of program errors occurs. That is, the program error problem upon programming disturbs miniaturization of memory cells.

As memory cells shrink further in feature size, the breakdown voltage in the source-to-drain path of the select gate transistor poses a problem. In order to set the breakdown voltage at a sufficiently large value, the amount of impurity doped into the channels of the memory cells and select gate transistors must be increased.

When the trench depth of the isolation region of the STI structure becomes smaller upon higher integration of memory cells, punch through, field inversion (inversion of the conductivity type of a semiconductor layer immediately under the isolation region), and the like occur, and a leakage current is generated between two memory cells which oppose each other to sandwich the isolation region therebetween (or between neighboring bit lines). To prevent such leakage current, the impurity concentration of a trench bottom portion of the isolation region of the STI structure must be increased or the concentration of the well must be increased.

However, when the impurity concentration of the trench bottom portion of the isolation region of the STI structure or the well concentration is increased, the boost ratio of the channel of each memory cell decreases. That is, miniaturization of memory cells results in a decrease in boost ratio of their channels, and the channel potential Vch of a selected "1"-programming cell cannot be sufficiently boosted.

When the trench width (the width in the direction in which the word line runs, i.e., in the row direction) of the isolation region of the STI structure becomes smaller as a result of higher integration of memory cells, the capacitance formed between the channels or diffusion layers of two memory cells neighboring in the row direction increases. Such increase in capacitance also results in a decrease in boost ratio of the channel. For this reason, upon programming, the channel potential Vch of a selected "1"-programming cell cannot be sufficiently boosted.

In this manner, variations of dimensions resulting from the structure and manufacturing process of memory cells and select gate transistors largely influence program errors in cells which do not undergo "0"-programming. For this reason, in order to achieve miniaturization and high integration of memory cells, the structure, manufacturing process, and operation of memory cells and select gate transistors must be improved to solve the program error problem resulting from variations of dimensions of memory cells and select gate transistors.

As one technique for achieving miniaturization of memory cells while preventing program errors in terms of the device structure, the present inventor has already proposed a NAND flash EEPROM having a channel boost capacitance (CBC) gate structure.

FIG. 12 is a plan view of a NAND flash EEPROM having the CBC gate structure. FIG. 13 is a sectional view taken along a line XIII—XIII in FIG. 12.

The structure of memory cells and select gate transistors is substantially the same as that of the conventional NAND flash EEPROM, except that a channel boost capacitance gate 17 is formed on each control gate electrode CG via a thin silicon oxide film. The channel boost capacitance gate 17 is electrically connected to the diffusion layer of each memory cell.

Since this structure can increase the coupling capacitance between the control gate electrode CG and channel, the channel potential of a "1"-programming cell which does not undergo "0"-programming can be sufficiently boosted upon self boost programming, thus preventing program errors.

Also, the CBC gate structure can lower the Vpass value compared to any non-CBC gate structure. That is, a variation of the threshold value of unselected cell C in a NAND cell unit including selected "0"-programming cell A can be reduced, and any program errors for unselected cell C can be prevented. Furthermore, even when Vpass is decreased, since the channel potential of "1"-programming memory cell B can be sufficiently boosted, program errors for this memory cell B can also be prevented.

Moreover, as the program potential Vpp can be set at a low value, a booster circuit for generating Vpp can be reduced in scale, thus contributing to a reduction of the chip size.

However, in the CBC gate structure, the channel boost capacitance gate must be connected to the diffusion layer of each memory cell, resulting in a complicated manufacturing process and high cost.

As the conventional programming schemes of the NAND flash EEPROM, so-called local self boost programming is known in addition to the aforementioned self boost programming.

FIG. 14 shows an example of potentials applied to memory cells in the program operation based on local self boost programming.

In local self boost (to be abbreviated as LSB hereinafter) programming, a power supply potential Vcc is applied to a select gate line SG1 on the bit line side, and 0V is applied to a select gate line SG2 on the source line side. Zero V is transferred from a bit line BL1 to the channel of a selected cell M21 in a NAND cell unit including a "0"-programming memory cell. Also, an initial potential Vcc–Vth is transferred from a bit line BL2 to the channel of a selected cell M22 in a NAND cell unit including a "1"-programming memory cell.

The potentials of a selected word line WL2, and word lines WL1 and WL3 on both sides of the line WL2 are kept at 0V, and those of other unselected word lines WL4 to WLN are raised to Vpass. At this time, the channel potential of the selected cell M22 in the NAND cell unit including the "1"-programming memory cell rises, and at least the selected cell M22 and unselected cells M12 and M32 on both sides of the cell M22 are cut off due to the back bias effect of the channels.

After that, when a program potential Vpp is applied to the selected word line WL2, a high voltage is applied across the control gate electrode (Vpp) and channel (0V) in the selected cell M21, thus making "0"-programming. On the other hand, in the selected cell M22 which does not undergo "0"-programming, the channel potential rises due to capacitive coupling between the control gate electrode and channel, thus avoiding "0"-programming.

Assuming that the program potential Vpp is 18V, and the boost ratio of the channel of the memory cell M22 is 0.5, the channel potential of the memory cell M22 is boosted up to about 8 to 9V. This value is high enough to prevent any program errors in the memory cell M22.

The aforementioned LSB programming is promising when it is applied to a multi-level memory that stores three-level or higher data in a single memory cell, but suffers the following problems in the current stage.

In LSB programming, when the program potential Vpp is applied to the selected word line WL2, the memory cells M12 and M32 on both sides of the memory cell M22 which is connected to the selected word line WL2 and does not undergo "0"-programming must be cut off. However, since these memory cells M12 and M32 have arbitrary threshold values, they may be in an erase state. For this reason, in order to cut off the memory cells M12 and M32, Vpass must be set at a sufficiently large value or the memory cells M12 and M32 must have sufficiently small erase threshold values (negative values with smaller absolute values).

However, if Vpass value is set at a large value, since high voltages are applied across the control gate electrodes and channels of unselected cells M41 to MN1 whose channel potentials are set at 0V, and program errors are highly likely to occur, it is difficult to set Vpass at a sufficiently large value. Upon erase operation, the threshold value distribution range of each erased memory cell may be narrowed down, and a sufficiently small erase threshold value may be set. However, since the erase time becomes very long in this case, such control cannot be adopted in terms of memory operations.

In LSB programming as well, each channel preferably has a largest possible boost ratio. For this reason, LSB programming may be used in the aforementioned NAND flash EEPROM with the CBC gate structure. However, in this case, problems of the complicated manufacturing process, an increase in layout area of memory cells, and the like due to addition of the CBC gates still remain unsolved.

As described above, a future subject of the NAND flash EEPROM is to develop the device structure, process, or operation method that can simultaneously meet the following requirements in self boost programming or LSB programming:

(1) to improve the boost ratio of each channel without increasing the number of manufacturing steps or complicating the manufacturing process;

(2) to assure a sufficiently high boost ratio even when memory cells are miniaturized;

(3) to prevent a decrease in boost ratio of each channel and avoid program errors even when the amount of impurity doped into the channels of memory cells increases due to miniaturization;

(4) to obviate the need for controlling the threshold value distribution of memory cell after erase in LSB programming, and to obviate the need for any special circuit compared to the conventional NAND flash EEPROM; and (5) to avoid program errors even when the upper limit of a threshold value increases in a multi-level memory constructed by memory cells having a plurality of threshold values.

Of these objectives, the objective of preventing program errors can be achieved by sufficiently raising the channel potential of the selected "1"-programming cell connected to the selected word line to which Vpp is applied. When a high channel potential is set, program errors can be sufficiently prevented even when the threshold value of the unselected memory is highest in a multi-level memory constructed by memory cells having a plurality of threshold values.

However, the channel potential cannot be sufficiently increased for the following reason especially in a NAND flash EEPROM manufactured according to the design rule of 0.20 $\mu$m or less.

The select gate transistor of the conventional NAND flash EEPROM mainly has two roles. One role is to disconnect NAND cell units in an unselected block from the bit line in the read mode, and the other role is to disconnect a NAND cell unit which does not include any "0"-programming memory cell from the bit line and to set the channels of the memory cells in that NAND cell unit in a floating state.

The ion implantation conditions for the channels and diffusion layers (source/drain) of the select gate transistors, well concentration, and the like are set to satisfy these roles. However, in recent years, as the device geometries shrink further, it is demanded to perform ion implantation for the channels and diffusion layers of the select gate transistors in the same process as that for the channels and diffusion layers of the memory cells.

When these ion implantation processes are to be done in a single step, the ion implantation conditions are set to make each select gate transistor fulfill the above-mentioned two roles. However, in this case, in each memory cell, a large capacitance is formed between the channel or diffusion layer (source/drain) and well, the channel boost ratio lowers, and a large channel potential cannot be obtained.

In self boost programming and LSB programming, it is important that the breakdown voltage of the drain be large in association with the cutoff characteristics, as well as the boost performance of the channel of each memory cell.

Upon boosting the channel of each memory cell, the drain or source potential of the select gate transistor rises to 5 to 8V. At this time, if a leakage current is generated in the source-to-drain path of the select gate transistor, and the cutoff characteristics become insufficient, the channel and diffusion layer (source/drain) of each memory cell cannot be sufficiently boosted, resulting in program errors.

Therefore, the leakage current must be prevented from being generated, and the cutoff characteristics of the select gate transistor must be sufficiently improved. In general, in order to prevent the leakage current of the select gate transistor and to sufficiently improve its cutoff characteristics, it is effective to increase the threshold value of the select gate transistor and to suppress a depletion layer from forming from the drain junction surface to the channel by setting a high impurity concentration of the channel.

In particular, when miniaturization progresses and the gate length becomes small, the amount of impurity doped into the channel must be increased. For this reason, the boost ratio of the channel further decreases, and program errors readily occur. Also, as miniaturization evolves, variations of the program characteristics become large due to, e.g., the short channel effect or the like and, as a result, program errors increase.

When ion implantation for the channel is made to satisfy the cutoff characteristics of each select gate transistor, the initial potential to be transferred from the bit or source line to the channel of each memory cell via the select gate transistor decreases, and the channel potential after boost drops.

In this case, the program characteristics of each memory cell excessively improve, and a change in threshold value of a memory cell to which Vpass is applied becomes large.

Such problems commonly occur when the NAND flash EEPROM adopts self boost programming or LSB programming.

In the future, the voltages to be supplied to the chip are projected to drop further. In such case, if the power supply voltage Vcc drops due to some cause, the initial potential Vchinit to be transferred to the channel of a memory cell which does not undergo "0"-programming lowers, and program errors readily occur.

As miniaturization progresses, due to the short channel effect of select gate transistors and memory cells, the threshold values and program/erase characteristics of these transistors vary, and the program/erase time becomes longer, thus producing leakage currents in the select gate transistors.

BRIEF SUMMARY OF THE INVENTION

The present invention has been made to solve the aforementioned problems and has as its object to provide a NAND flash EEPROM which has a novel structure that can sufficiently boost the channel potential of a memory cell which is connected to the selected word line and does not undergo "0"-programming, and can prevent program errors, upon self boost or LSB programming, even when device miniaturization evolves.

A nonvolatile semiconductor memory according to the present invention comprises a NAND cell series including a plurality of memory cells connected in series, a first select gate transistor connected between one end of the NAND cell series and a bit line, and a second select gate transistor connected between another end of the NAND cell series and a source line. Each of the plurality of memory cells consists of a main transistor, and parasitic transistors that sandwich the main transistor. The main transistor and the parasitic transistors share a gate electrode, and threshold values of the parasitic transistors are higher than a threshold value of the main transistor.

A nonvolatile semiconductor memory according to the present invention comprises a NAND cell series including a plurality of memory cells connected in series, a first select gate transistor connected between one end of the NAND cell series and a bit line, and a second select gate transistor connected between another end of the NAND cell series and a source line. Each of the plurality of memory cells consists of a main transistor, and a parasitic transistor connected in series with the main transistor. The main transistor and the parasitic transistor share a gate electrode, and a threshold value of the parasitic transistor is higher than a threshold value of the main transistor.

A nonvolatile semiconductor memory according to the present invention comprises a NAND cell series including a plurality of memory cells connected in series, a first select gate transistor connected between one end of the NAND cell series and a bit line, and a second select gate transistor connected between another end of the NAND cell series and a source line. At least one of the first and second select gate transistors consists of a main transistor, and parasitic transistors that sandwich the main transistor. The main transistor and the parasitic transistors share a gate electrode, and threshold values of the parasitic transistors are higher than a threshold value of the main transistor.

A nonvolatile semiconductor memory according to the present invention comprises a NAND cell series including a plurality of memory cells connected in series, a first select gate transistor connected between one end of the NAND cell series and a bit line, and a second select gate transistor connected between another end of the NAND cell series and a source line. At least one of the first and second select gate transistors consists of a main transistor, and a parasitic transistor connected in series with the main transistor. The main transistor and the parasitic transistor share a gate electrode, and a threshold value of the parasitic transistor is higher than a threshold value of the main transistor.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

A nonvolatile semiconductor memory according to the present invention will be described in detail hereinafter with reference to the accompanying drawings.

Figure 15:
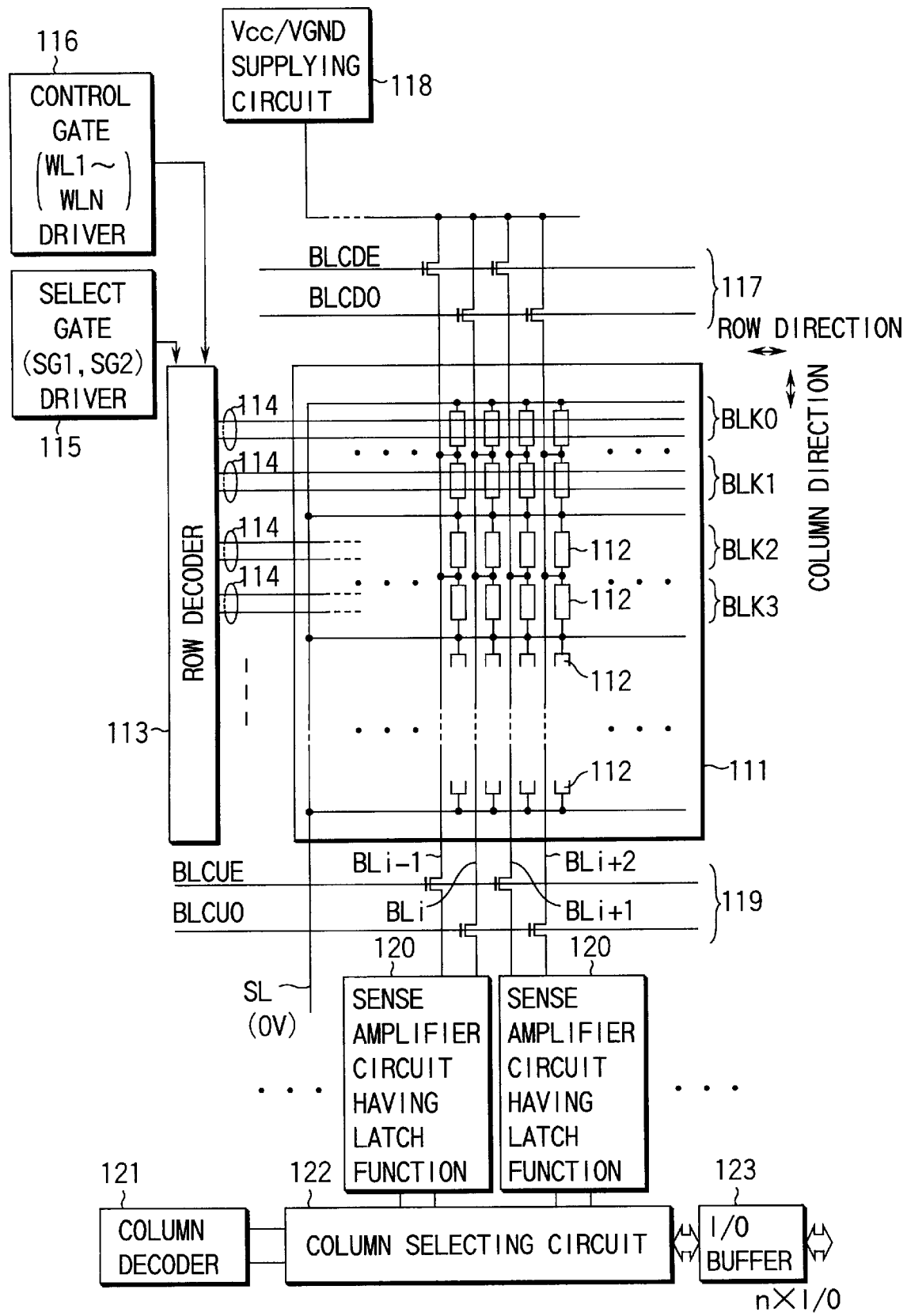
FIG. 15 is a circuit diagram showing an example of an EEPROM to which the present invention is applied.

FIG. 15 shows an example of principal part of a NAND flash EEPROM to which the present invention is applied.

The present invention is mainly applied to a technique such as self boost programming, LSB programming, or the like, which prevents program errors by boosting the channel potential of a memory cell which is connected to a selected word line and does not undergo "0"-programming (inhibits programming).

A memory cell array 111 has a plurality of NAND cell units 112 which are laid out in a matrix. A characteristic feature of the present invention lies in the structure of memory cells and select gate transistors in each NAND cell unit 112, and details of the structure will be explained later. The memory cell array 111 is constructed by a plurality of blocks BLK0, BLK1, . . . segmented in the column direction.

Each block BLKi has a line group 114 including a word line (control gate line) and select gate line running in the row direction. Each line group 114 is connected to a row decoder 113. A select gate driver 115 and control gate driver 116 supply predetermined potentials to the select gate line and word line (control gate line) in, e.g., a selected block in accordance with the operation mode of the memory.

On the memory cell array 111, bit lines BLi-1, BLi, . . . run in the column direction. A Vcc/GND supply circuit 118 is connected to one end of each of the bit lines BLi-1, BLi, . . . via a switch circuit 117. The Vcc/GND supply circuit 118 supplies a predetermined potential to the bit lines BLi-1, BLi, . . . upon, e.g., reading.

Each of sense amplifier circuits 120 having a latch function is connected to the other end of each of the bit lines BLi-1, BLi, . . . In this embodiment, one sensor amplifier circuit 120 having a latch function is commonly connected to two bit lines BLi-1 and BLi. The sense amplifier circuits 120 are connected to an I/O buffer 123 via a column selecting circuit 122. The column selecting circuit 122 is controlled by an output signal from a column decoder 121.

One example of principal part of the NAND flash EEPROM has been briefly explained. As described above, the present invention is mainly applied to a technique such as self boost programming, LSB programming, or the like, which prevents program errors by boosting the channel potential of a memory cell which is connected to a selected word line and does not undergo "0"-programming (inhibits programming). Also, the present invention exhibits its effect independently of the element isolation structure (LOCOS, trench), the numbers of memory cells and select gate transistors per NAND cell unit, the manufacturing process, and the like.

The structure of the memory cells and select gate transistors according to the present invention will be described in detail below.

Figure 16:
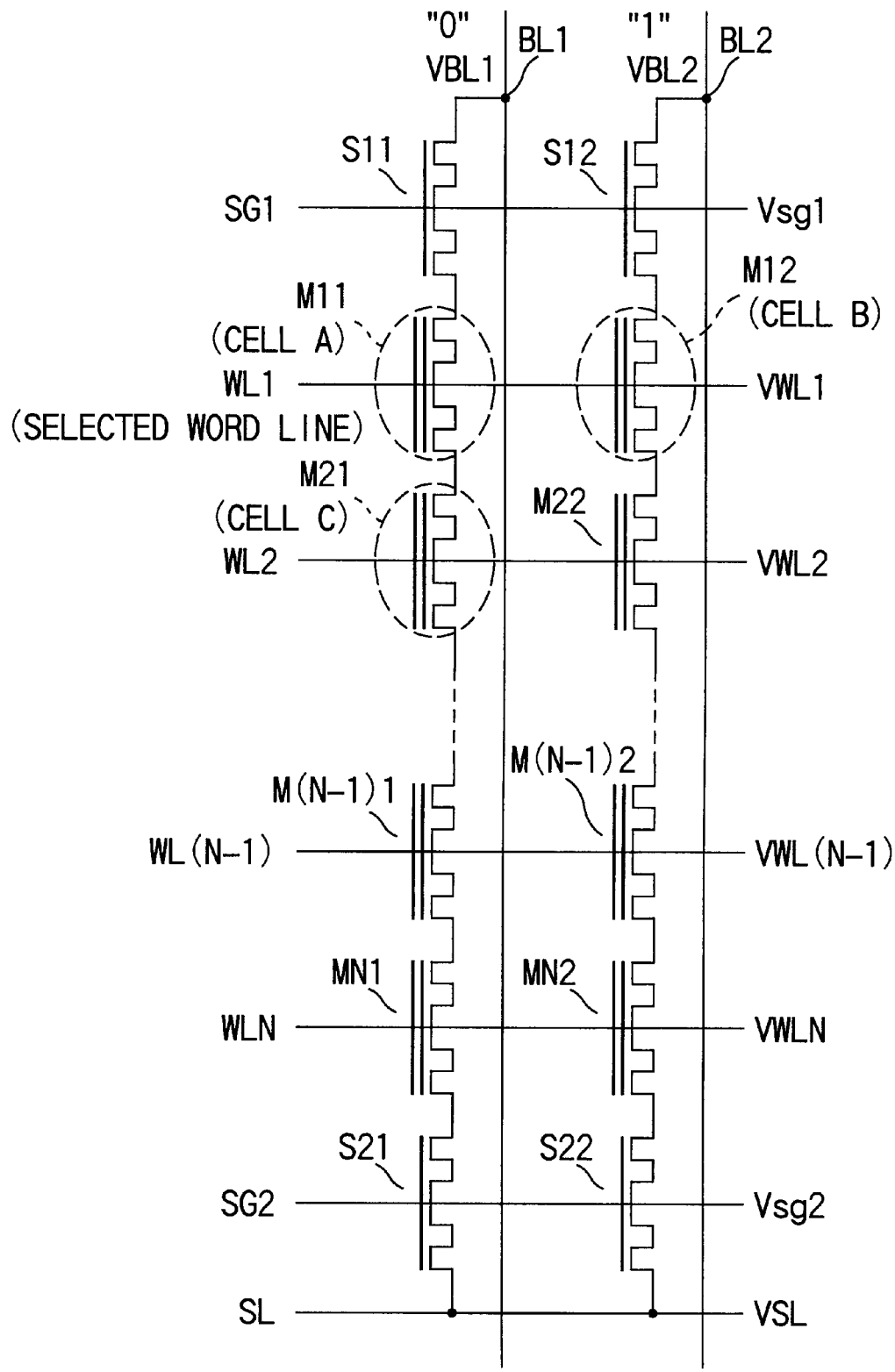
FIG. 16 is an equivalent circuit diagram of a NAND cell unit of the present invention.
Figure 17A:
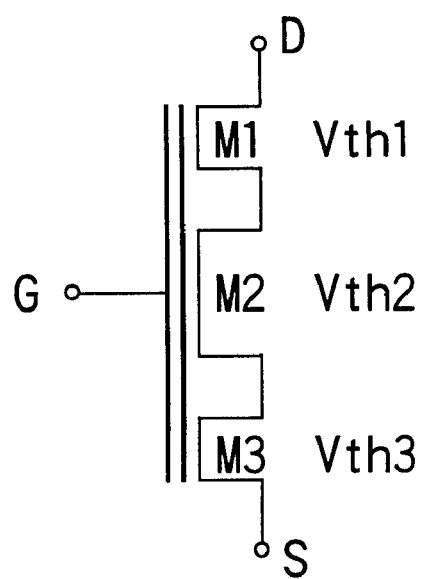
FIG. 17A is an equivalent circuit diagram of a memory cell of the present invention.
Figure 17B:
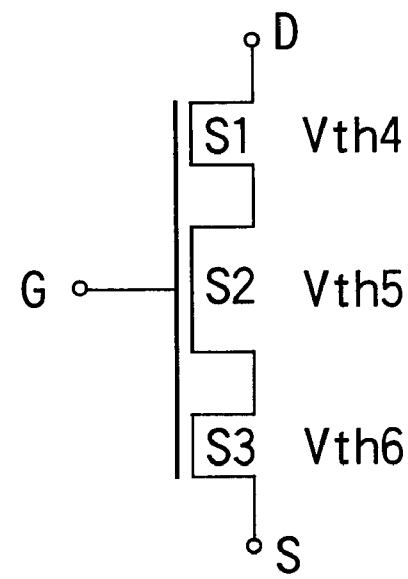
FIG. 17B is an equivalent circuit diagram of a select gate transistor of the present invention.

FIG. 16 shows an equivalent circuit of the memory cells and select gate transistors in one NAND cell unit. FIG. 17A shows an equivalent circuit of one memory cell, and FIG. 17B shows that of one select gate transistor.

The memory cell of the present invention comprises a main transistor M2 and two parasitic transistors M1 and M3 respectively formed on the drain and source sides of this transistor M2. The threshold values of the transistors M1 and M3 are substantially equal to each other, but are different from that of the transistor M2. The three transistors M1, M2, and M3 respectively have a common floating gate electrode and control gate electrode.

The channel lengths of the parasitic transistors M1 and M3 of the transistor M2 are set to be smaller than that of the transistor M2. The threshold values of the transistors M1, M2, and M3 vary depending on whether the memory cell is in a program state ("0" in a two-level memory; "1", "2", . . . , "n" in a multi-level memory) or an erase state ("1" in the two-level memory; "0" in the multi-level memory). However, threshold values Vth1 and Vth3 of the transistors M1 and M3 are always larger than a threshold value Vth2 of the transistor M2, and the substrate bias effects of the transistors M1 and M3 are larger than that of the transistor M2.

Note that the main transistor M2 must be composed of a single transistor in terms of the equivalent circuit and device structure, but each of the parasitic transistors M1 and M3 of the transistor M2 may be a combination of a plurality of transistors.

The select gate transistor of the present invention has the same structure as that of the memory cell. In this case, a method of manufacturing a device having a cell structure of the present invention can be facilitated. This point will be explained later in the paragraphs of the manufacturing method.

More specifically, the select gate transistor comprises a main transistor S2, and two parasitic transistors S1 and S3 which are respectively formed on the drain and source sides of the transistor S2, as in the memory cell. The threshold values of the transistors S1 and S3 are substantially equal to each other, but are different from that of the transistor S2. The three transistors S1, S2, and S3 respectively have a common gate electrode.

The channel lengths of the parasitic transistors S1 and S3 of the transistor S2 are set to be smaller than that of the transistor S2. Threshold values Vth4 and Vth6 of the transistors S1 and S3 are always larger than a threshold value Vth5 of the transistor S2, and the substrate bias effects of the transistors S1 and S3 are larger than that of the transistor S2.

The main transistor S2 must be composed of a single transistor in terms of the equivalent circuit and device structure, but each of the parasitic transistors S1 and S3 of the transistor S2 may be a combination of a plurality of transistors.

In this embodiment, both the memory cell and select gate transistor are constructed by the main transistor and parasitic transistors. However, in the present invention, at least one of the memory cell and select gate transistor need only be constructed by the main transistor and parasitic transistors.

For example, when the memory cell is comprised of a main transistor and parasitic transistors, the select gate transistor may have the same structure as the conventional structure, i.e., may comprise the main transistor S2 alone. On the other hand, when the select gate transistor is comprised of a main transistor and parasitic transistors, the memory cell may have the same structure as the conventional structure, i.e., may comprise the main transistor M2 alone.

Furthermore, at this time, only one of end select gate transistors of the NAND cell unit, e.g., the select gate transistor on the bit line side may be constructed by a main transistor and parasitic transistors, and the select gate transistor on the source line side may have the same structure as the conventional structure, i.e., only a main transistor.

The substrate bias effects of the memory cell shown in FIG. 17A and select gate transistor shown in FIG. 17B will be explained below.

Figure 18A:
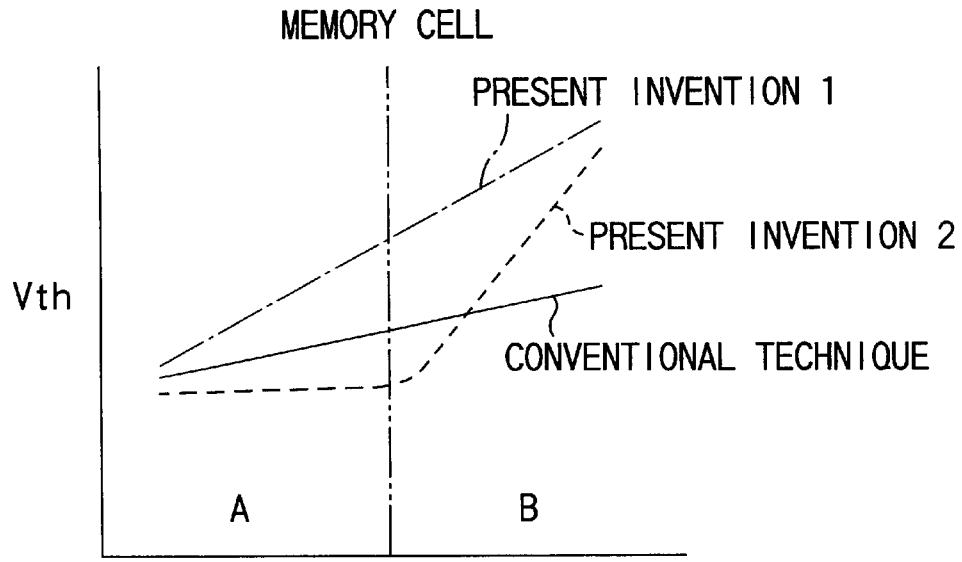
FIG. 18A is a graph showing the substrate bias effect of the memory cell of the present invention.

The substrate bias effect of the memory cell of the present invention shown in FIG. 17A is as shown in FIG. 18A. Referring to FIG. 18A, reference symbol Vsub denotes a substrate potential (channel potential); φf, a Fermi potential; and Vth, the threshold value of the memory cell. Note that the solid curve represents the characteristics of the conventional memory cell having no parasitic transistor.

In the memory cell of the present invention, the substrate bias effect (slope) is larger than the conventional memory cell as a whole (one-dashed chain curve), or the substrate bias effect (slope) immediately becomes larger than the conventional memory cell within the range in which the substrate potential Vsub is larger than a predetermined value (broken curve). Such characteristics are unique to a memory cell having parasitic transistors, and are suitable for cutting off the parasitic transistors of the memory cell connected to an unselected word line and boosting the channel potential of a "1"-programming memory cell to a sufficiently large value by a program potential upon data programming.

Figure 18B:
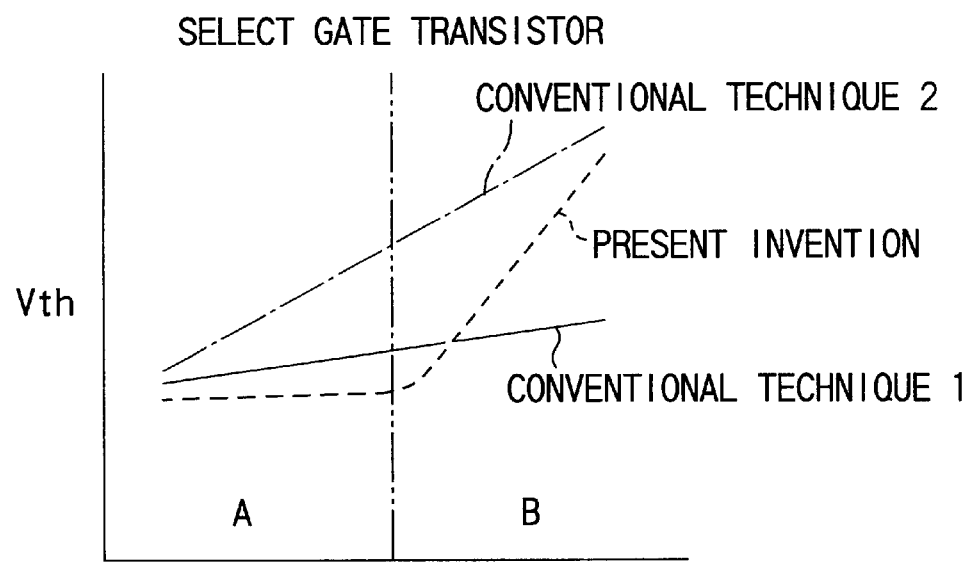
FIG. 18B is a graph showing the substrate bias effect of the select gate transistor of the present invention.

The substrate bias effect of the select gate transistor of the present invention shown in FIG. 17B is as shown in FIG. 18B. Referring to FIG. 18B, reference symbol Vsub denotes a substrate potential (channel potential); φf, a Fermi potential; and Vth, the threshold value of the select gate transistor. Note that the solid curve represents the characteristics of the conventional select gate transistor having no parasitic transistor.

In the select gate transistor of the present invention, the substrate bias effect (slope) is larger than the conventional select gate transistor as a whole (one-dashed chain curve), or the substrate bias effect (slope) immediately becomes larger than the conventional select gate transistor within the range in which the substrate potential Vsub is larger than a predetermined value (broken curve). Such characteristics are unique to a select gate transistor having parasitic transistors.

In the conventional select gate transistor having no parasitic transistor, in order to improve the cutoff characteristics upon data programming (to disconnect a "1"-programming memory cell connected to the selected word line from the bit line), the concentration of impurity doped into the channel must be increased so as to increase the slope of the solid curve shown in FIG. 18B to become closer to the one-dashed chain curve.

However, in this case, since the coupling ratio between the control gate electrode and channel of the memory cell decreases, the channel potential of the "1"-programming memory cell which is connected to the selected word line cannot be sufficiently boosted, as described above.

Since the select gate transistor of the present invention comprises parasitic transistors, the substrate bias effect (slope) can be increased without increasing the impurity concentration of the channel. For this reason, the select gate transistor connected to the "1"-programming memory cell, which is connected to the selected word line, can be cut off, and the channel potential of the memory cell can be boosted to a sufficiently larger value by a program potential Vpp or the program potential and a passing potential Vpass.

In the memory cell and select gate transistor of the present invention, the characteristics indicated by the broken curve are ideal bias characteristics, since the substrate bias effect (slope) is small in the low substrate potential range, and is large in the high substrate potential range, as will be described below.

In the low substrate potential range (A) in FIGS. 18A and 18B, since the substrate bias effect (slope) is small, such characteristics assure excellent current/voltage transfer performance of the memory cell and select gate transistor. The characteristics in this range are used when the potential of the bit line is determined in a read mode or when an initial potential Vchinit is transferred from the bit line to the channel in a program mode.

In the high substrate potential range (B) in FIGS. 18A and 18B, the substrate bias effects of the memory cell and select gate transistor are large, and such characteristics assure easy cutoff characteristics. The characteristics in this range are used when the program potential Vpp and passing potential Vpass are applied to a word line (control gate line) in the program mode (upon self boost programming).

The characteristics that the memory cell of the present invention exhibits in association with the potential Vpass of the control gate electrode, the channel potential Vch, and the threshold values Vth1, Vth2, and Vth3 of the transistors M1, M2, and M3 will be examined below.

Assume that a threshold value Vth(MC) of the memory cell (e.g., n-channel type) of the present invention is the potential of the control gate electrode when a cell current flows from the drain to source, and the threshold values Vth1, Vth2, and Vth3 of the transistors M1, M2, and M3 are the potential of the control gate electrode when the channel of each transistor is strongly inverted.

Note that these threshold values have different values before and after boosting the channel and diffusion layer (source/drain). The threshold values Vth1, Vth2, and Vth3 of the transistors M1, M2, and M3 after boosting the channels have values including the influence of the back gate bias effect.

For example, 0V is applied to the control gate electrode, and 20V are applied to the well to set the source/drain in a floating state, thus erasing the memory cell (a state with a negative threshold value). A case will be examined below wherein the threshold value of the memory cell is sufficiently deep (it assumes a negative value having a large absolute value, e.g., −4V or less).

The threshold value Vth(MC) of the memory cell depends on the threshold values Vth1, Vth2, and Vth3 of the transistors M1, M2, and M3. Especially, since the channel length of the transistor M2 is set to be larger than those of the transistors M1 and M3, the threshold value Vth2 of the transistor M2 has the largest influence on the threshold value of the memory cell.

When Vpass is applied to the control gate electrode as the source/drain floats, the potentials of the channel and source/drain rise to a program inhibit potential due to capacitive coupling between the control gate electrode and channel (source/drain).

Figure 19:
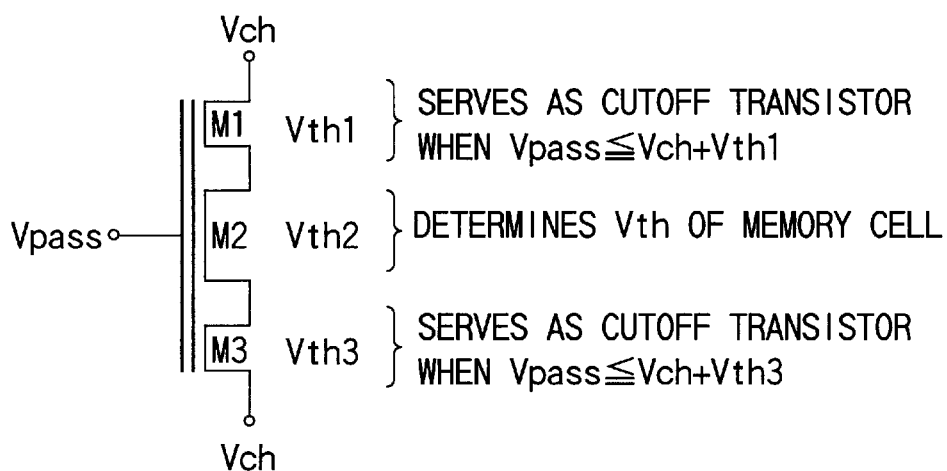
FIG. 19 is an equivalent circuit diagram of a memory cell of the present invention.

FIG. 19 shows the relationship between the threshold values of the respective transistors that form the memory cell, and the potential of the control gate electrode. Table 1 below shows the relationship among the ON/OFF states of the memory cell and transistors M1, M2, and M3, channel potential, and a variation of the threshold value of a non-programming cell. Note that the memory cell is a combination of the transistors M1, M2, and M3, and a memory cell having an offset area (to be described later) corresponds to this.

word line are largely influenced by Vpass applied to the control gate electrode of a memory cell connected to an

TABLE 1

| | Threshold value of memory cell | | | |
|---|---|---|---|---|
| | (multi-level data) 2-level data | ("0") "1" | 0 | ("1", "2", "3", ... "N") "0" |
| | | Negative ← | | → Positive |
| Memory cell component | | A | B | C |
| Memory cell | ON state | OFF state | | OFF state |
| M1 | ON state | OFF state | | OFF state |
| M2 | ON state | ON → off (transition state) | | OFF state |
| M3 | ON state | OFF state | | OFF state |
| Vch | large | large | | large |
| Variation of threshold value of program inhibit cell | small | small | | small |

Vch Cr (Vpass-Vth-Vchinit), Vpass is around 6 to 10 V
program inhibit cell: cell which is connected to selected word line and is to remain erased → cell B shown in FIG. 16

The channel potential Vch of the memory cell rises as Vpass rises. This channel potential Vch is proportional to:

$$Cr \times (Vpass - Vth(MC) - Vchinit) + Vchinit$$

where Cr is the boost ratio of the channel, and Vchinit is the initial potential of the channel. Also, Vth(MC) is the threshold value of the memory cell, and is zero in this case since it assumes a negative value.

For example, if the boost ratio Cr is 0.7, the initial potential Vchinit of the channel is 2V, and Vpass is 8V, the boosted channel potential Vch of the memory cell is around 6.2V. This value can sufficiently suppress any variation of the threshold value of a program inhibit cell (cell B in FIG. 16). At this time, any variation of the threshold value of an unselected cell (cell C in FIG. 16) can also be sufficiently suppressed since Vpass is as sufficiently small as 8V.

A case will be examined below wherein the erase threshold value of the memory cell is sufficiently small (it assumes a negative value having a small absolute value, e.g., less than −2V).

In this case, the threshold value Vth(MC) of the memory cell exhibits a negative value, but Vth1 and Vth3 are larger than Vth2. For this reason, Vpass≦Vch+Vth1 and Vpass≦Vch+Vth3 hold as the channel potential Vch rises, and the transistors M1 and M3 are cut off (state B in Table 1). At this time, Vth1 and Vth3 desirably have sufficiently large values. Furthermore, a large back gate bias effect is desirable so as to assure large effective rise of the threshold value of the memory cell upon applying the channel potential Vch.

In state B in Table 1, the transistors M1 and M3 are cut off and the transistor M2 is ON since the memory cell is erased. However, if the threshold value of the memory cell is in the neighborhood of 0V, the transistor M2 may be turned off. Hence, when the threshold value of the memory cell is in the neighborhood of 0V, the transistor M2 is turned on or off depending on its threshold value.

However, it is important to set the transistors M1 and M3 OFF, and the threshold value of the transistor M2 is not so important. The channel of the memory cell floats while maintaining Vch when the transistors M1 and M3 are OFF.

Normally, the boosted potentials of the channel and source/drain of a memory cell connected to the selected unselected word line. The capacitance between the transistor M2 and well is small, and a sufficiently large channel potential Vch can be obtained by this Vpass. Hence, a variation of the threshold value of the program inhibit cell (e.g., cell B in FIG. 16) can be minimized.

A case will be examined below wherein a high voltage pulse of, e.g., 18V is applied to the control gate electrode to set a positive threshold value of the memory cell while at least one of the source and drain of the memory cell is set at 0V.

In this case, all the transistors M1, M2, and M3 are OFF, as shown in state C in Table 1.

The operations will be examined in correspondence with those of NAND cells.

Normally, NAND cells (memory cells in the NAND cell unit) are programmed cell by cell in turn from a memory cell farthest from the bit line (a memory cell on the source line side) toward a memory cell on the bit line side. For example, as shown in FIG. 16, data programming is done for memory cells connected to a word line WLN first, and for those connected to a word line WL1 last.

Upon programming, in case of, e.g., a two-level memory, a bit line BL1 to which "0"-programming memory cells are connected is set at 0V, and a bit line BL2 to which no "0"-programming memory cell is connected at the power supply potential Vcc (e.g., 2.5V). Also, a select gate line SG1 on the bit line side is set at the power supply voltage Vcc (e.g., 2.5V), a select gate line SG2 on the source side is set at 0V, and a potential around 1V is applied to a source line SL.

Figure 10:
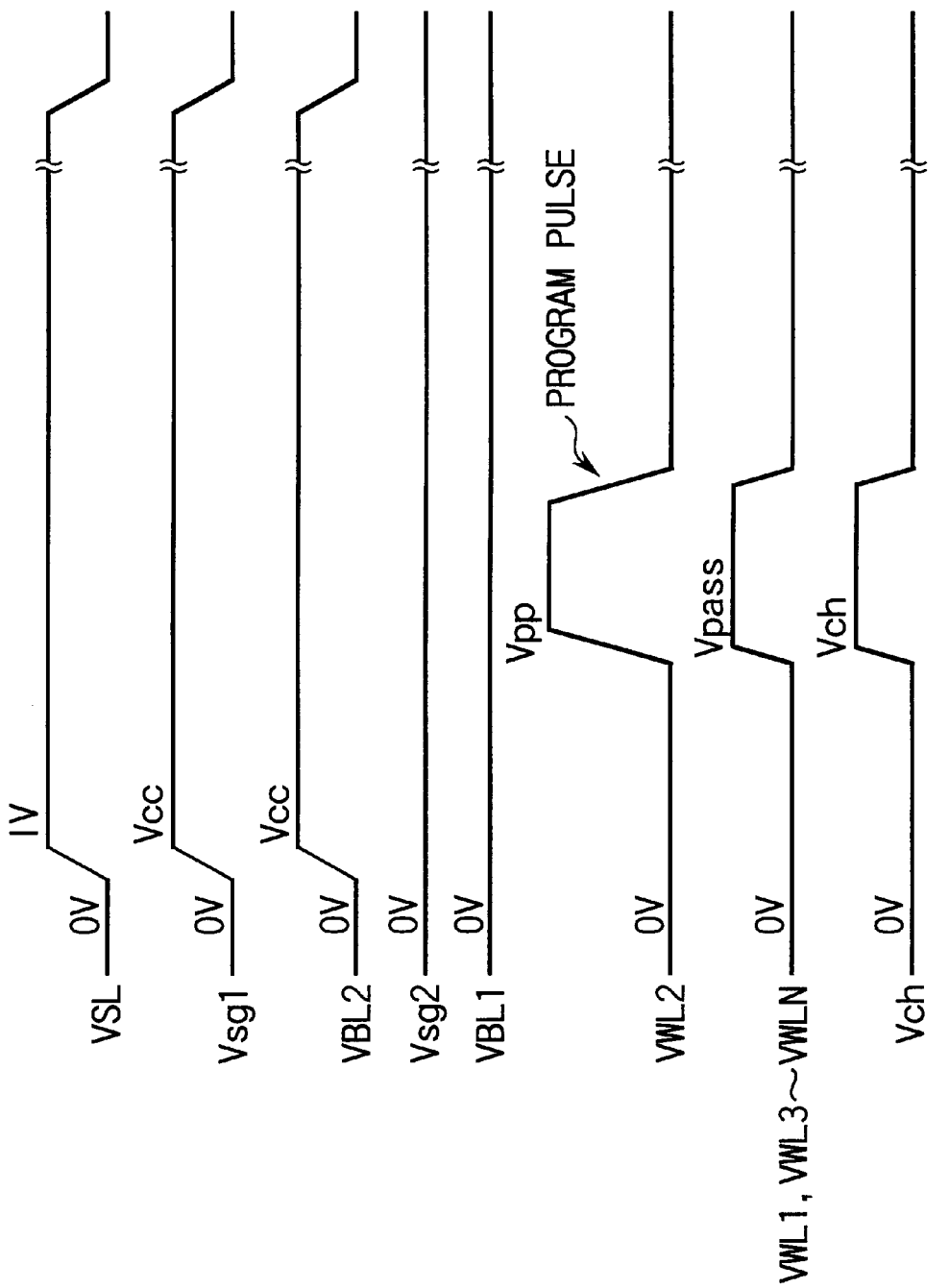
FIG. 10 is a timing chart showing the relationship among potentials upon self boost programming.
Figure 11:
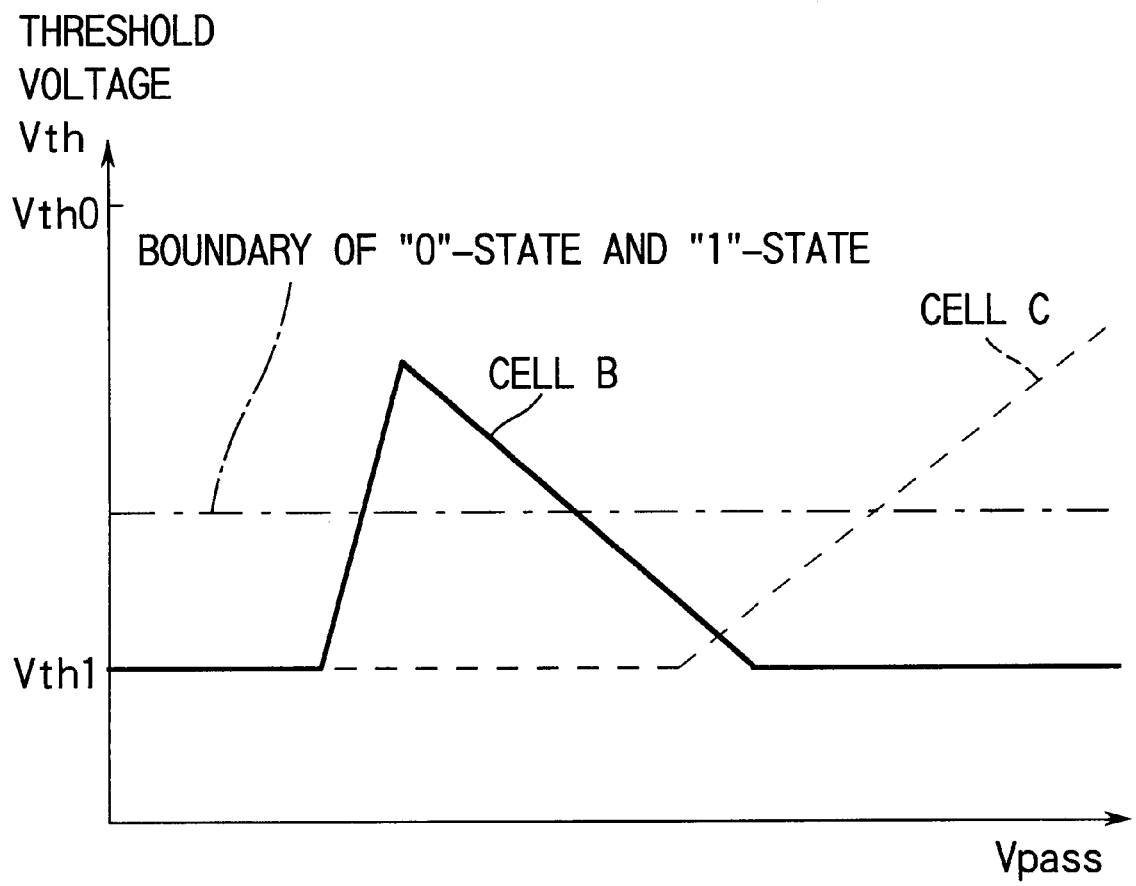
FIG. 11 is a graph showing the characteristics of conventional memory cells.
Figure 12:
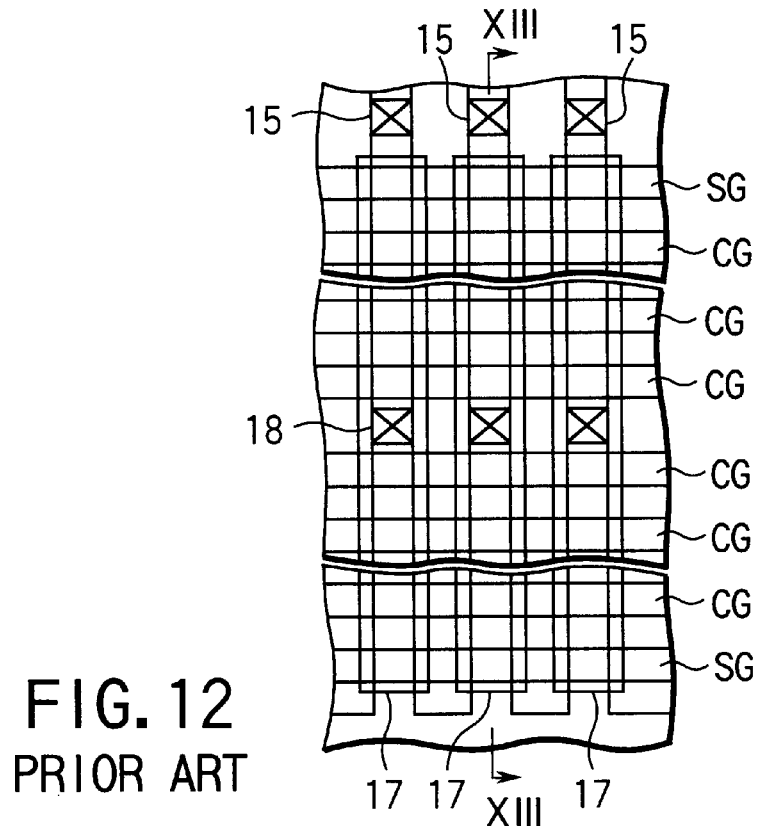
FIG. 12 is a plan view showing a NAND flash EEPROM with a CBC gate structure.
Figure 13:
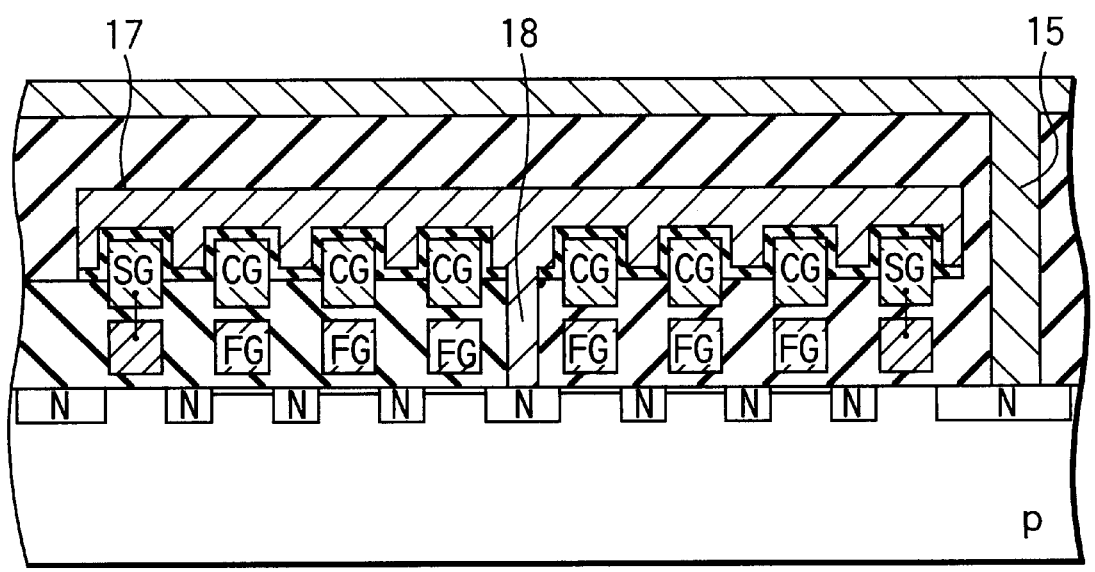
FIG. 13 is a sectional view taken along a line XIII—XIII in FIG. 12.

In this state, at the timings shown in, e.g., FIG. 10, the program potential Vpp is applied to a selected word line WL2, and the passing potential Vpass is applied to unselected word lines WL1 and WL3 to WLN. In the timing chart shown in FIG. 10, pulses having the program potential Vpp and passing potential Vpass are illustrated as one-shot pulses, but the pulses are normally output a plurality of times while alternating with verify operations.

The potentials (widths) of the pulses having the program potential Vpp and passing potential Vpass are normally gradually increased from initial values in proportion to the number of times of programming. The pulse width of this pulse is around 10 to 30 μsec. In FIG. 16, one select gate transistor is connected to each of the two ends of a NAND cell series, but two or more transistors may be connected. Also, the select gate transistor may have the same structure as that of the memory cell.

A case will be examined below wherein a memory cell MN1 closest to the source line SL undergoes "0"-programming in the NAND cell unit connected to the bit line BL1. In this case, the program potential Vpp is applied to the selected word line WLN, and the passing potential Vpass (e.g., 8V) is applied to the unselected word lines WL1 to WL(N-1) at substantially the same time. Note that the time required for the program potential Vpp to reach a maximum value is normally longer than the time required for the passing potential Vpass to reach a maximum value.

Before programming, all memory cells in the selected block are normally erased ("1"-state). Therefore, when the memory cell MN1 closest to the source line SL undergoes "0"-programming, all the memory cells in the selected block are erased. That is, the memory cells are in state A or B (threshold values are smaller than zero) in Table 1.

If the threshold value of each erased memory cell is sufficiently larger (it is negative and has a large absolute value), that memory cell is turned on, and the transistors M1 and M3 shown in FIG. 17A are not cut off. However, the channel potential Vch boosted by the passing potential Vpass becomes very large when the back pattern is such erase state.

Note that the back pattern corresponds to the states (erase or program states) of all memory cells, the control gate electrodes of which are applied with Vpass, of those in a NAND cell unit that is connected to an unselected bit line, i.e., does not include any "0"-programming cell.

Hence, when "0"-programming is done for the memory cell MN1 closest to the source line SL, the channel potential can be sufficiently boosted by Vpass (6 to 8V), thus preventing program errors.

As can be seen from the above description, if the back pattern is the erase state, program errors hardly occur irrespective of which one of the word lines WL1 to WLN is selected.

A case will be examined below wherein the threshold value of an erased memory cell is as very small as, e.g., -1V (i.e., it is negative and has a small absolute value). In this case, since the threshold value of the memory cell rises due to the back gate bias effect, the channel potential Vch is suppressed from rising in the conventional structure.

However, when a memory cell having the structure of the present invention is used, if the memory cell is in state B in Table 1 above, and the passing potential Vpass is applied to unselected word lines, the transistors M1 and M3 shown in FIG. 17A are cut off as a result of the boosted channel potential Vch.

Therefore, all memory cells present on the bit line side of the memory cell connected to the selected word line are cut off, i.e., the same state as in LSB programming. That is, the channel potential Vch of a memory cell which is connected to the selected word line and does not undergo "0"-programming is boosted by the program potential Vpp applied to the selected word line.

For example, if the program potential Vpp is 18V and the channel boost ratio is 0.5, since the channel potential Vch of the memory cell having the structure of the present invention rises up to around 9 to 11V, no program errors occur.

A case will be examined below wherein the second memory cell M(N-1)1 from the source side of those in the NAND cell unit undergoes "0"-programming.

In a NAND cell unit which does not include any "0"-programming memory cell, i.e., a NAND cell unit connected to the bit line BL2, when the memory cell MN2 is in an erase state ("1"-state), no program errors occur irrespective of the absolute value of the threshold value.

No problem is posed as well when the memory cell MN2 is in a program state ("0"-state). That is, when all memory cells M12 to M(N-2)2 present on the bit line side of a memory cell M(N-1)2 connected to a selected word line WL(N-1) are erased, and the passing potential Vpass is applied to the control gate electrode, as described above, the channel potential of the memory cell MN2 rises irrespective of the absolute value of the threshold value. Then, the memory cell MN2 is easily cut off due to the substrate bias effect (back gate bias effect) by the boosted channel potential.

In this manner, since the channel potentials Vch of the memory cells M12 to M(N-2)2 rise, no program errors occur.

A case will be examined below wherein, for example, a word line WL8 is selected. In this case, since memory cells M12 to M72 are erased, they contribute to rise of the channel potential Vch by Vpass independently of the absolute values of the threshold values of the memory cells. When all memory cells M92 to MN2 on the source line side of a memory cell M82 are erased, the potentials of the channel and source/drain diffusion layer are sufficiently boosted, as described above.

If memory cells present on the source line side of the memory M82 include at least one memory cell in a program state, the transistors M1 and M3 on both sides of the main transistor M2 shown in FIG. 16 are cut off during the boost process of the channel potential Vch. For this reason, the memory cell itself is cut off, as well as all memory cells on the source line side of that memory cell.

More specifically, if a memory cell in a program state is present, since all memory cell present on the source line side of that memory cell are cut off, they never disturb channel boost.

A case will be examined below a memory cell M11 closest to the bit line undergoes "0"-programming. In this case, when all memory cells M22 to MN2 on the source line side of a memory cell M12 in a NAND cell unit which does not include any "0"-programming memory cell, i.e., a NAND cell unit connected to the bit line BL2 are in an erase state ("1"-state), no program errors occur, as described above.

However, when the memory cell M11 closest to the bit line undergoes "0"-programming, a program error readily occurs in a certain mode, i.e., when the memory cell M22 is in a program state, and all memory cells M32 to MN2 present on the source line side of the memory cell M22 are erased.

At this time, when the threshold value of the memory cell M22 in the program state is small (it assumes a positive value with a small absolute value), and those of the memory cells M32 to MN2 in the erase state are large (they assume negative values with large absolute values), a program error readily occurs in the memory cell (cell B) M12.

Program errors occur for the following reason.

Since the memory cell M22 is in the program state, it is cut off during the boost process of the channel. However, if the threshold value of the memory cell M22 is low, the memory cell M22 is hard to cut off. Thus, in order to cut off the memory cell M22, the channels of the memory cells M32 to MN2 on the source line side of the memory cell M22 must be sufficiently boosted by Vpass.

However, when the memory cell M22 is in a program state, the initial potential Vchinit transferred from the bit line BL2 via a select gate transistor S12 is not transferred to the channels of the memory cells M32 to MN2 until Vpass that turns on the memory cell M22 is applied. That is, since the initial potential Vchinit is consequently not transferred to the channels of the memory cells M32 to MN2, the final channel potential is reduced by this initial potential Vchinit, and the memory cell M22 is hard to cut off.

Therefore, in order to cut off the memory cell M22, Vpass must have a large value.

However, even when the memory cell M22 is not sufficiently cut off, if the number of erased memory cells (a serial circuit of memory cells in a NAND cell unit) is large, since the channel and source/drain diffusion layer are sufficiently boosted, a variation of the threshold value of a program inhibit cell which does not undergo "0"-programming is minimized, and the program error program can be solved. When two or more memory cells are in a program state, since they are easy to cut off, the program error problem can be solved.

On the other hand, when the back pattern (cells other than a "1"-programming cell) of the NAND cell unit that includes a "1"-programming cell represents a program state, since all those cells in the program state are cut off, the channel potential of the memory cell M12 connected to the selected word line WL1 can be sufficiently boosted by the program potential Vpp. Hence, no program error problem is posed.

The program operations of the memory cell of the present invention are as has been described above. A major characteristic feature of this memory cell lies in that LSB programming can be implemented by self boost programming.

Hence, any variation of the threshold value of, e.g., cell B shown in FIG. 16 can be suppressed to nearly zero. Since the required passing potential Vpass is as low as around 6 to 9V, and need not be large unlike the conventional memory, the threshold value of, e.g., cell C shown in FIG. 16 varies little. That is, according to the present invention, any variation of the threshold values of all erased memory cells, which do not undergo "0"-programming can be minimized in program operation.

When LSB programming is adopted, the cell structure of the present invention is superior to the conventional cell structure in that the variation of threshold value of, e.g., cell C shown in FIG. 16 can be minimized irrespective of the absolute values of the erase threshold values of the memory cells. That is, as LSB programming for the conventional cell structure must control erase threshold values, and this control results in a long program/erase time, this scheme cannot be applied to actual products. By contrast, when the memory cell of the present invention is used, erase threshold values need not be controlled in LSB programming, and the program/erase time is never prolonged.

Figure 1:
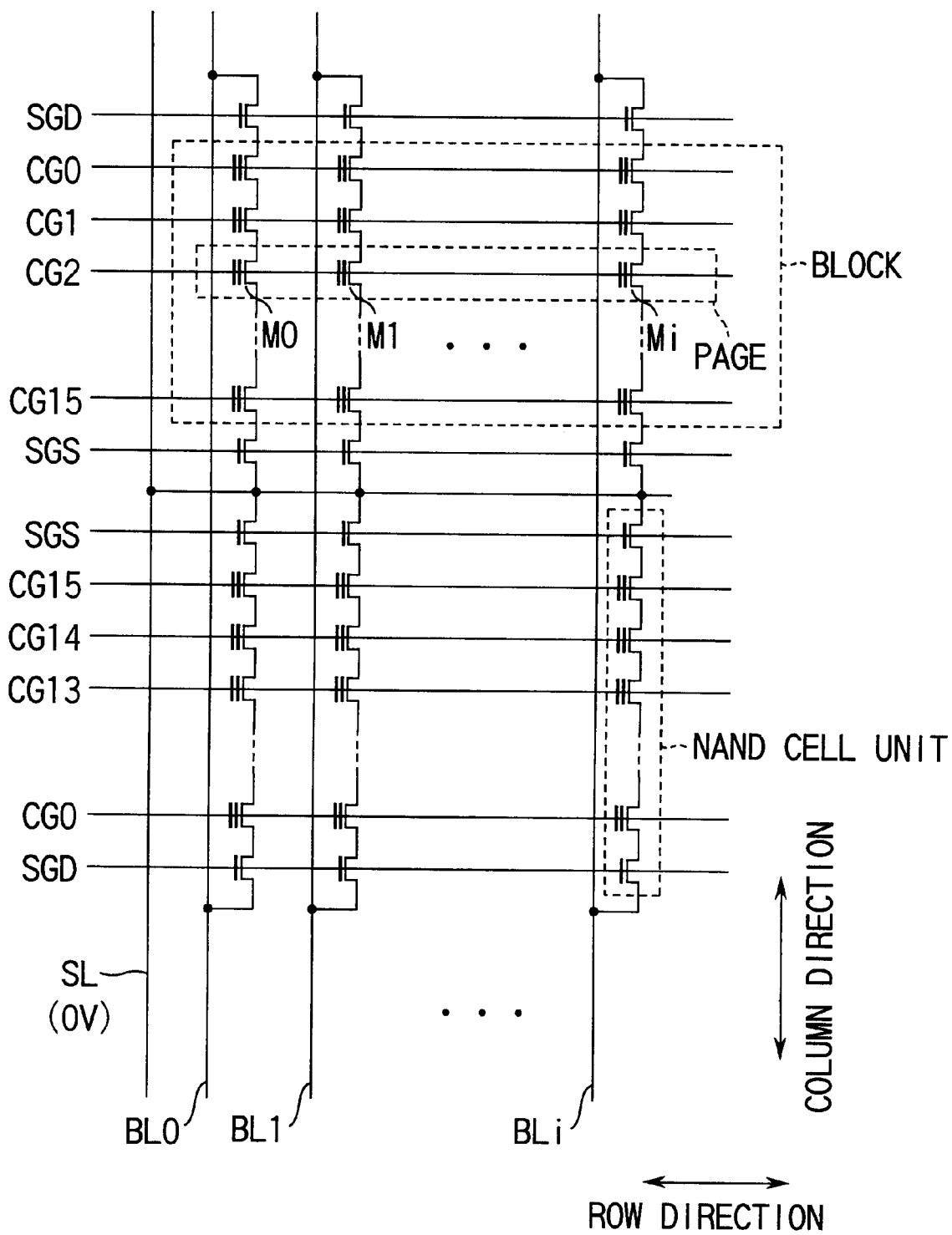
FIG. 1 is an equivalent circuit diagram of a NAND flash EEPROM.
Figure 2:
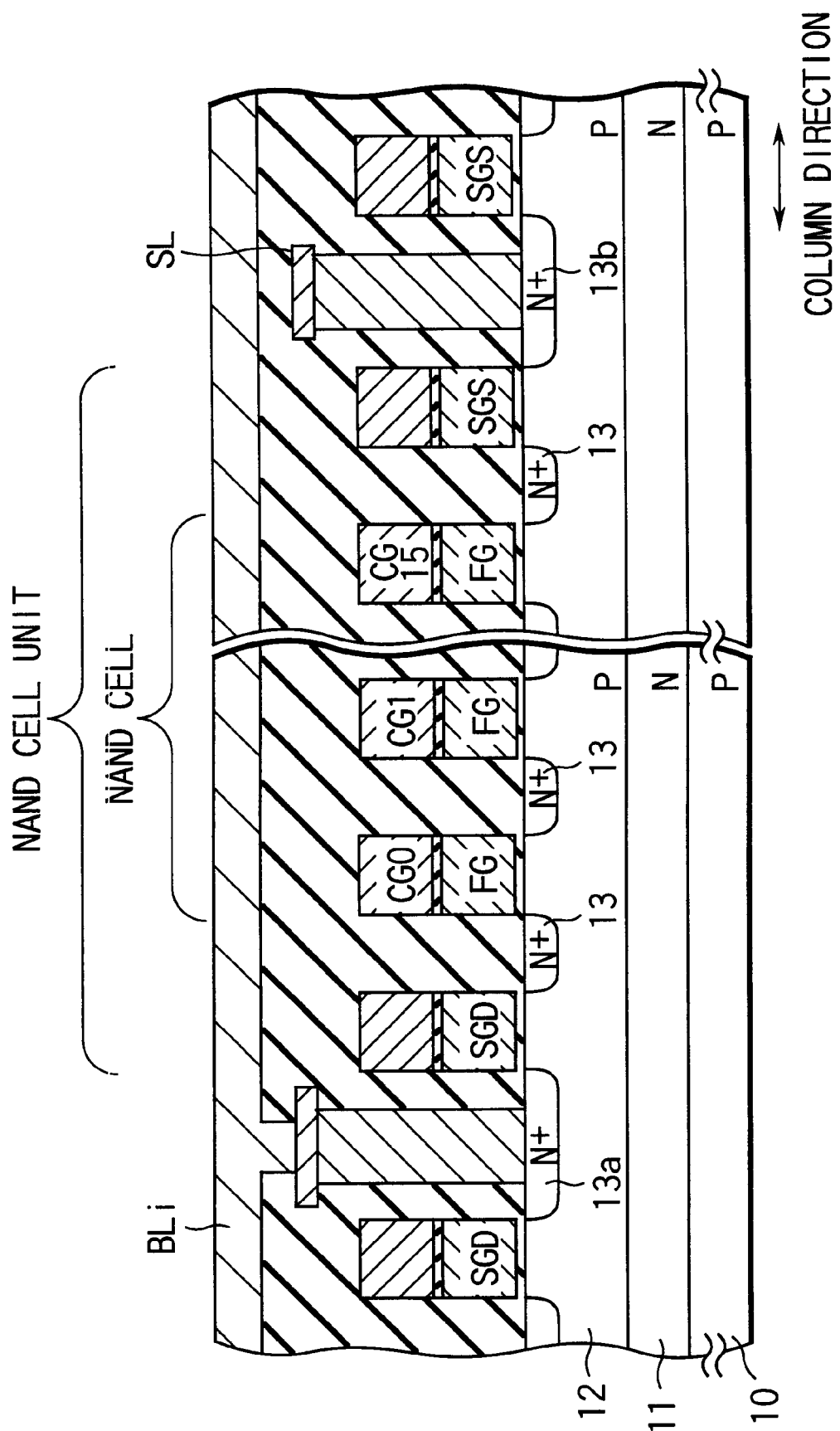
FIG. 2 is a sectional view showing the device structure of a conventional NAND cell unit.
Figure 3:
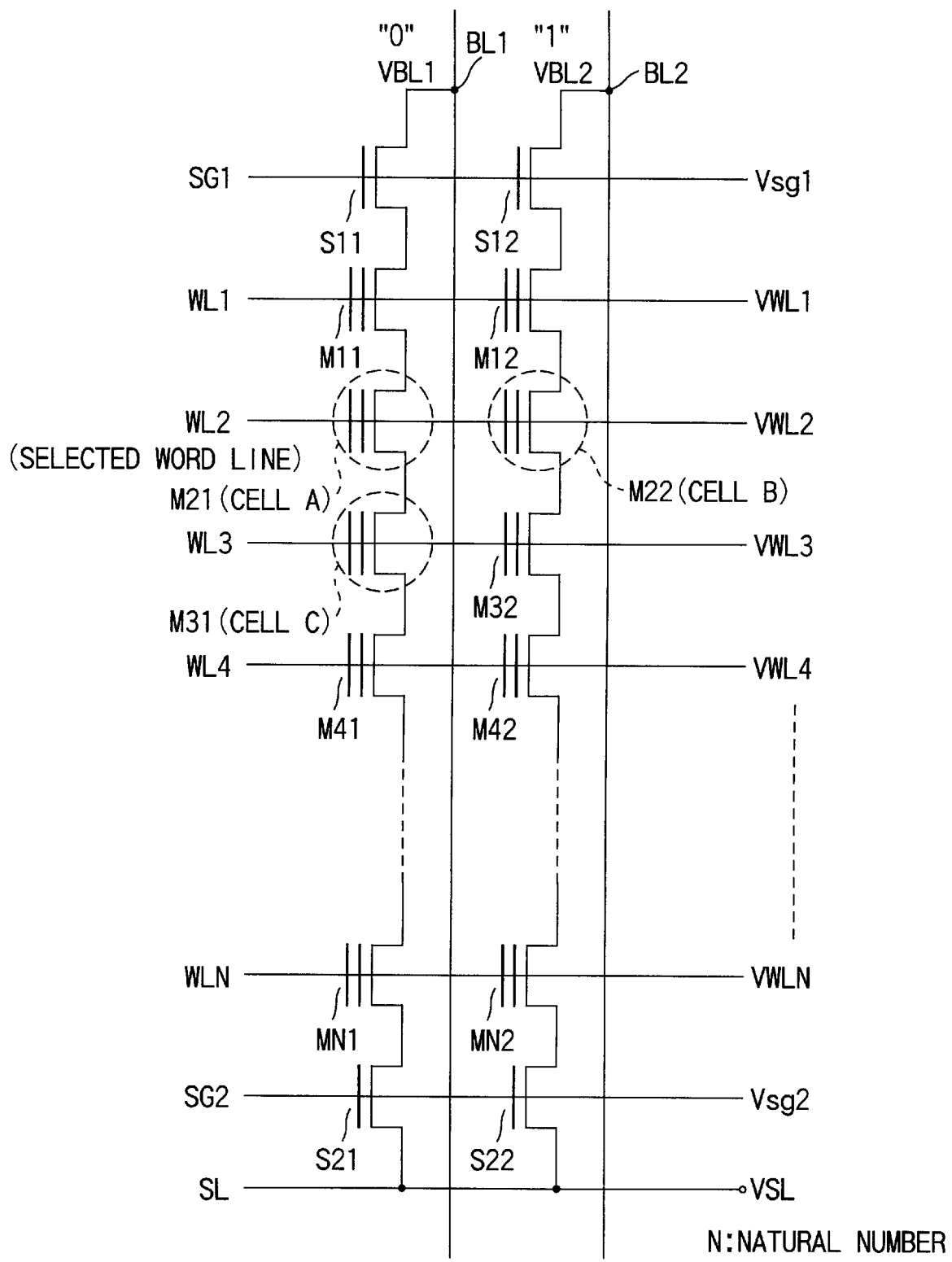
FIG. 3 is a diagram for explaining the program error program of the conventional NAND cell.
Figure 4A:
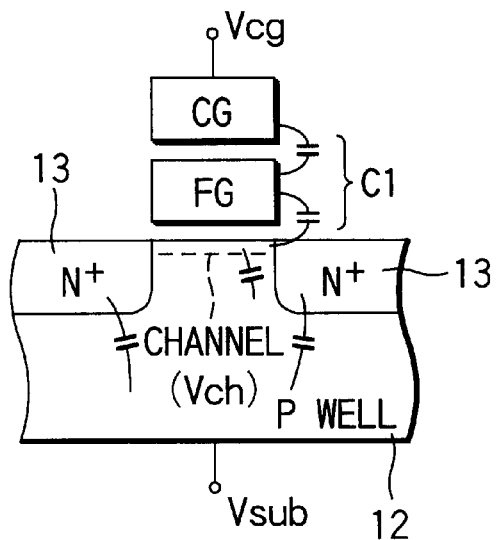
FIG. 4A is a sectional view showing the parasitic capacitance of a memory cell.
Figure 4B:
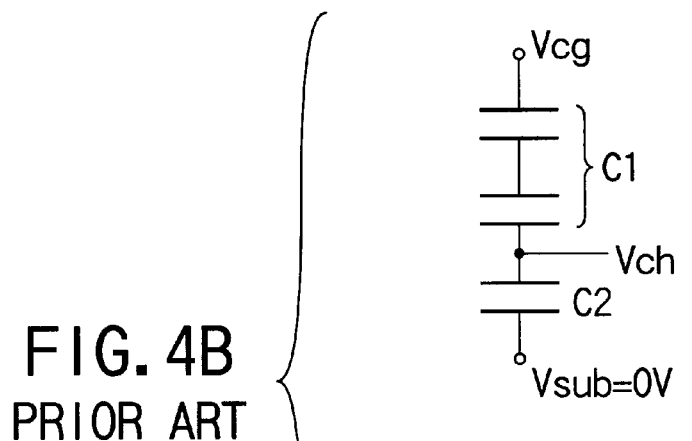
FIG. 4B is an equivalent circuit diagram of the parasitic capacitance of the memory cell shown in FIG. 4A.
Figure 5:
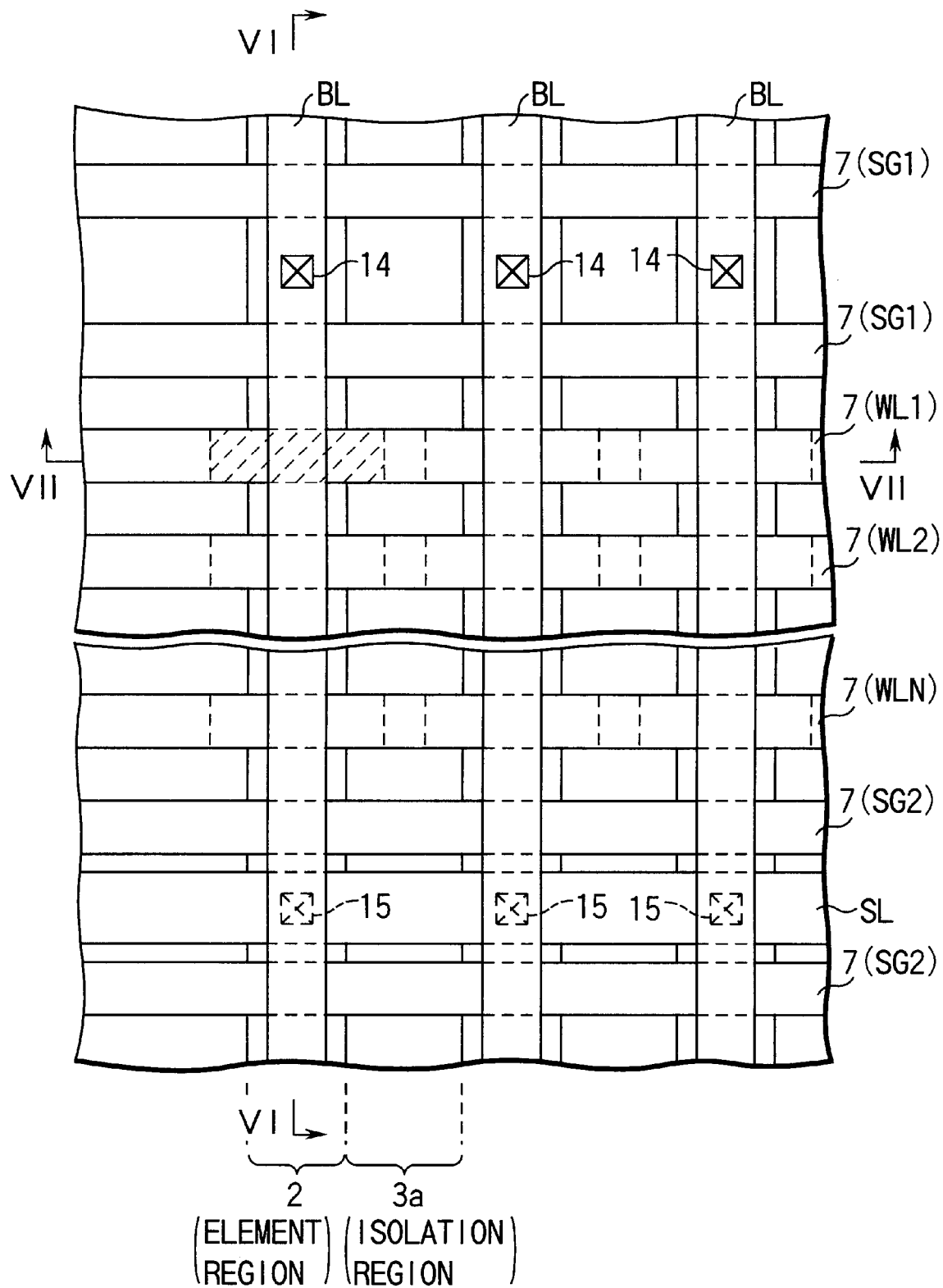
FIG. 5 is a plan view showing an example of the device structure of a conventional NAND flash EEPROM.
Figure 6:
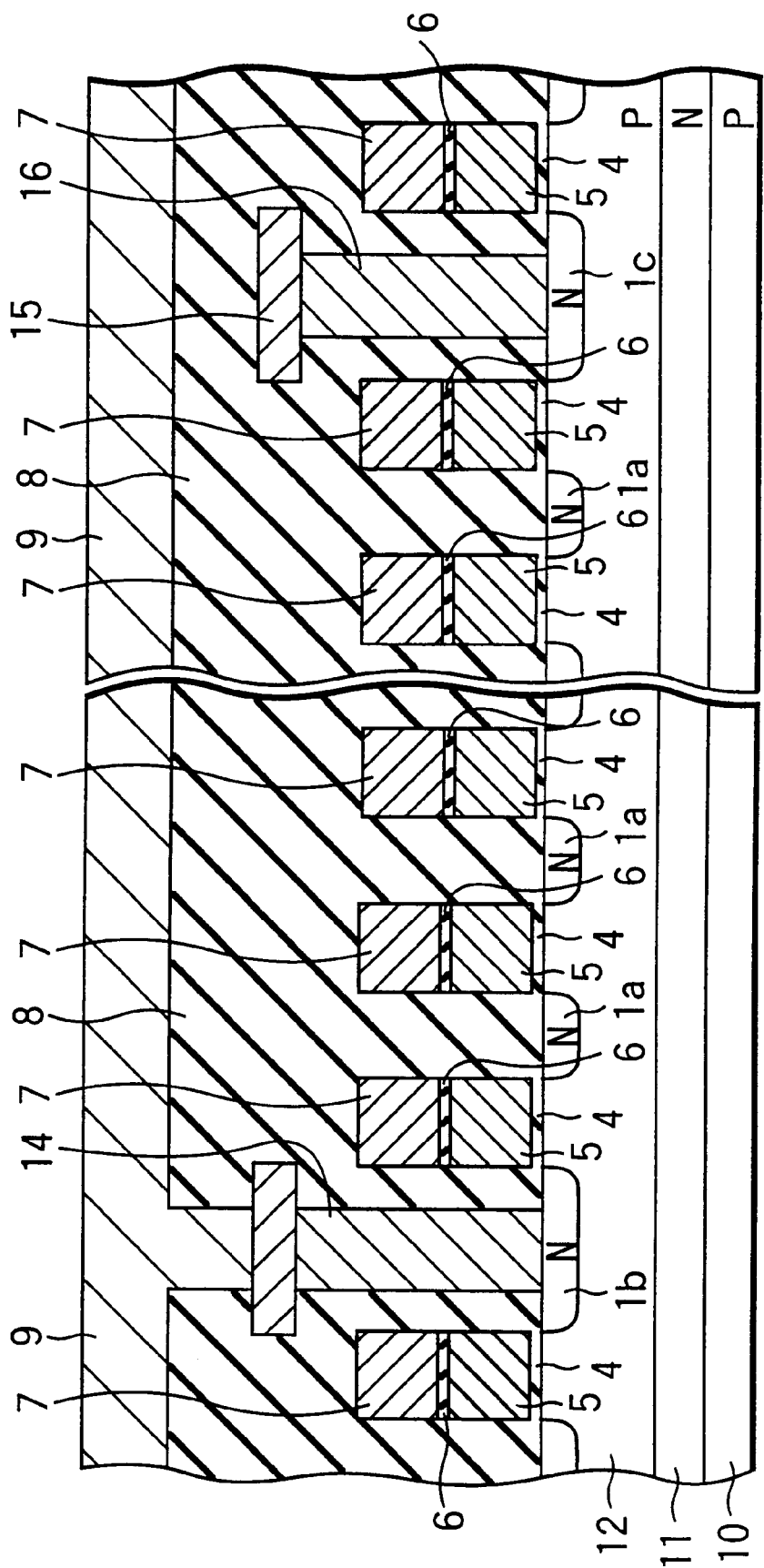
FIG. 6 is a sectional view taken along a line VI—VI in FIG. 5.
Figure 7:
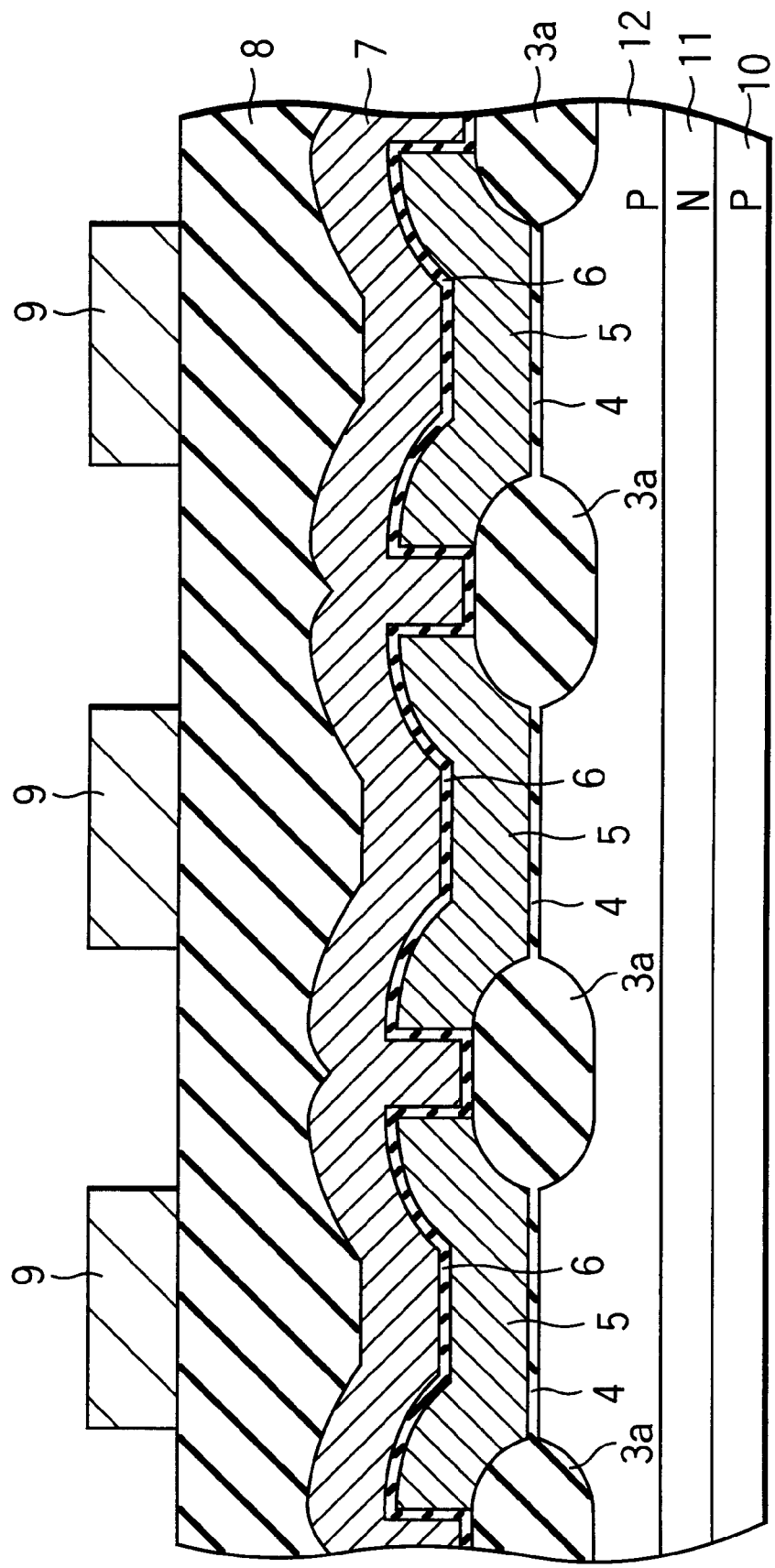
FIG. 7 is a sectional view taken along a line VII—VII in FIG. 5.
Figure 8:
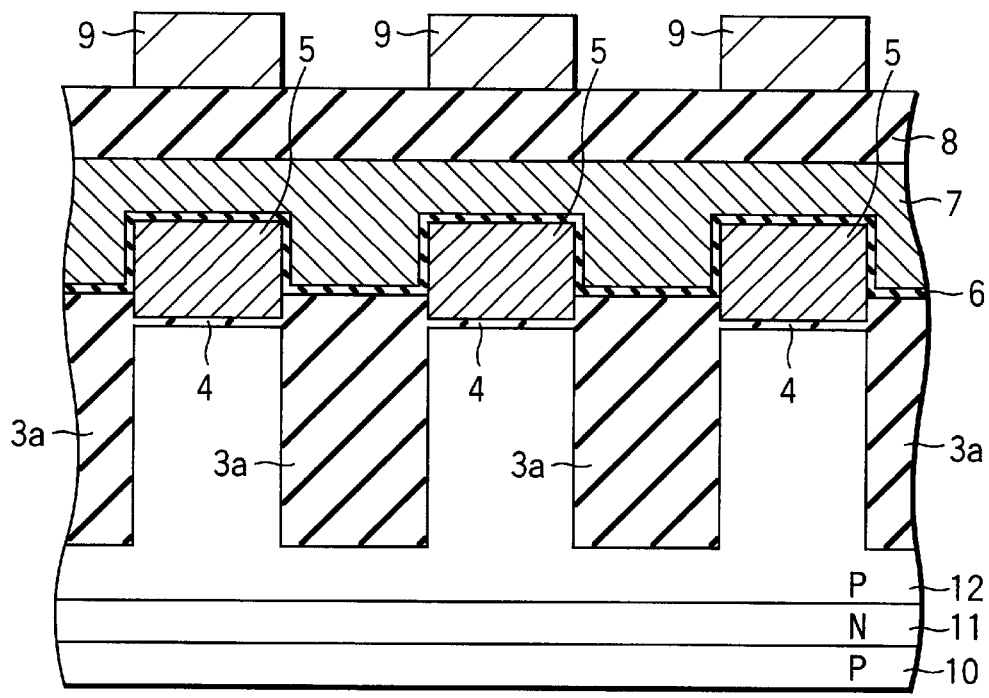
FIG. 8 is a plan view showing another example of the device structure of a conventional NAND flash EEPROM.
Figure 9:
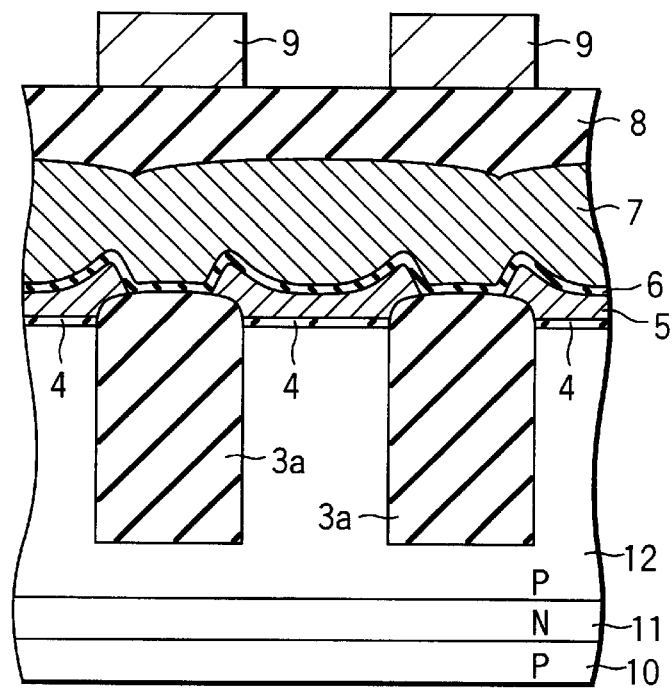
FIG. 9 is a plan view showing still another example of the device structure of a conventional NAND flash EEPROM.

Furthermore, the memory cell of the present invention is most suitable for a multi-level memory. In the conventional cell structure, when three-level or higher data is to be stored in memory cells as the number of bits required for the multi-level configuration increases, and a maximum value is stored in a memory cell, the threshold value becomes very high, and the potentials of the channel and source/drain diffusion layer cannot be sufficiently boosted upon self boost programming. As a result, program errors are highly likely to occur in cells B and C shown in FIG. 3.

Figure 14:
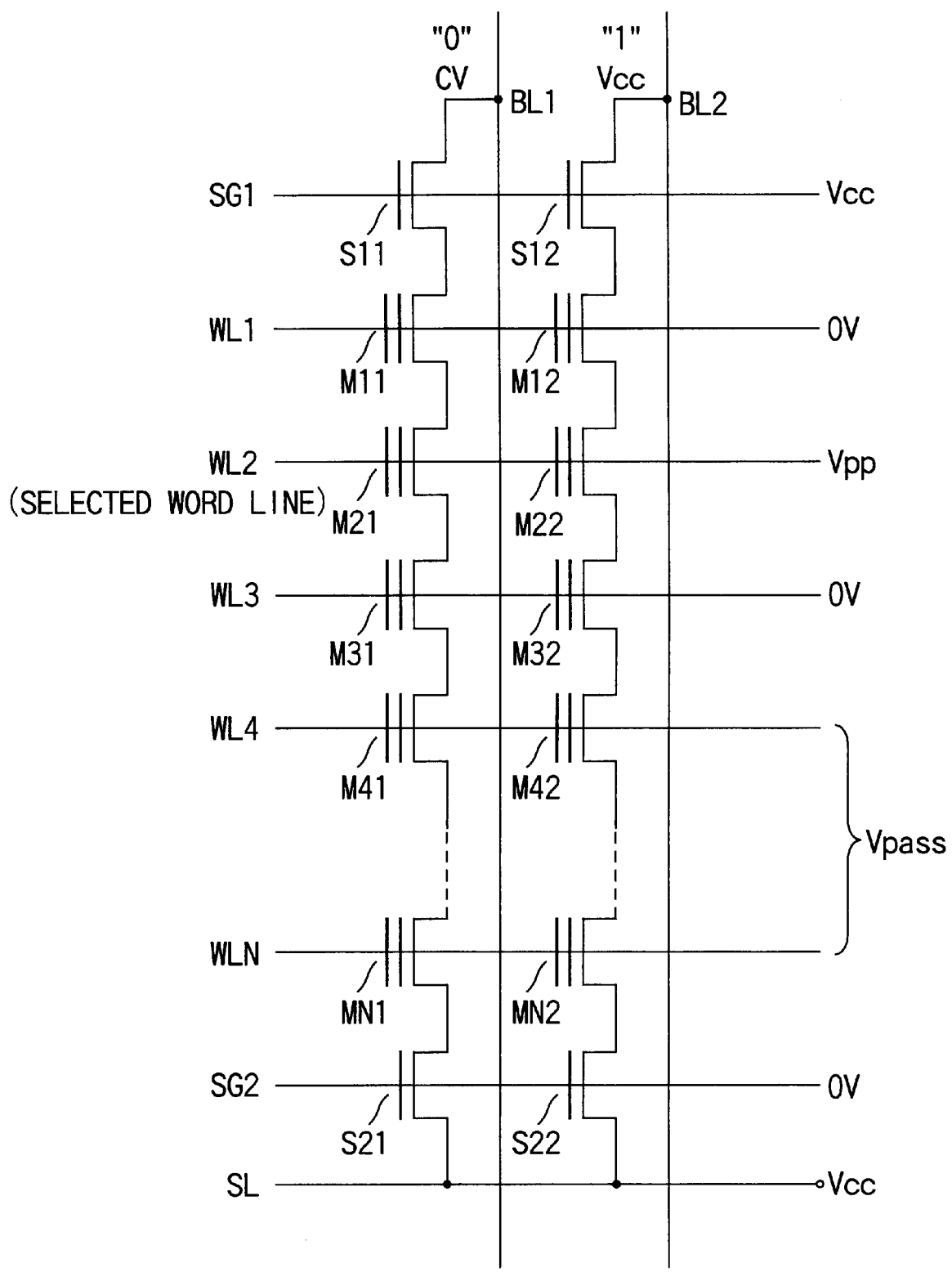
FIG. 14 is a diagram showing the relationship among potentials upon local self boost programming.

In LSB programming, the potentials of the channels and source/drain diffusion layers of memory cells M42 to MN2 on the source line side of the memory cell M32 must be sufficiently boosted to cut off memory cells M12 and M32 shown in FIG. 14. However, when the memory cells M42 to MN2 are in a program state and their threshold values are large, their channel potentials cannot be sufficiently boosted, and a program error may occur in the memory cell M22.

When a large passing potential Vpass is set to avoid such problem, the possibility of any program error that occurs in the memory cell M22 reduces, but the threshold values of memory cells M41 to MN1 largely vary in turn, and program errors occur in these memory cells M41 to MN1.

Under the circumstance, when a multi-level memory is built using the conventional cell structure, a memory cell having a negative threshold value may vary to a positive threshold value with increasing maximum value of the threshold value of a memory in a program state upon self boost or LSB programming. For this reason, in order to increase the number of bits required for the multi-level configuration, minimizing the threshold value distribution of each data and reducing the maximum value of a threshold value after programming are important techniques for preventing program errors.

By contrast, when the cell structure of the present invention is used, the memory cell becomes easier to cut off upon self boost programming as the threshold value of the memory cell becomes larger in the positive direction. Therefore, the problem that program errors occur more readily as the number of bits required for the multi-level configuration increases can be prevented.

Figure 20A:
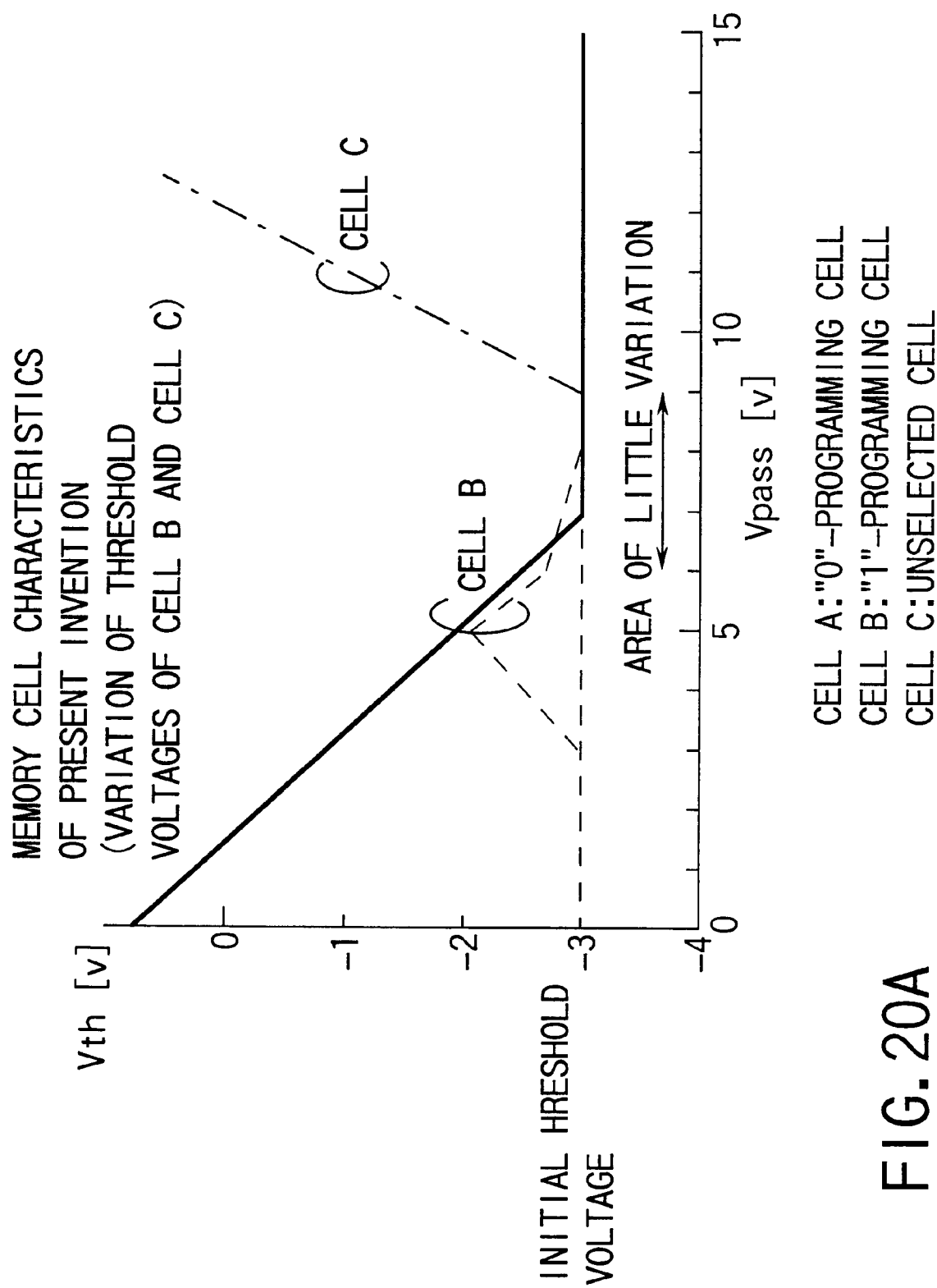
FIG. 20A is a graph showing the characteristics of the memory cell of the present invention.
Figure 20B:
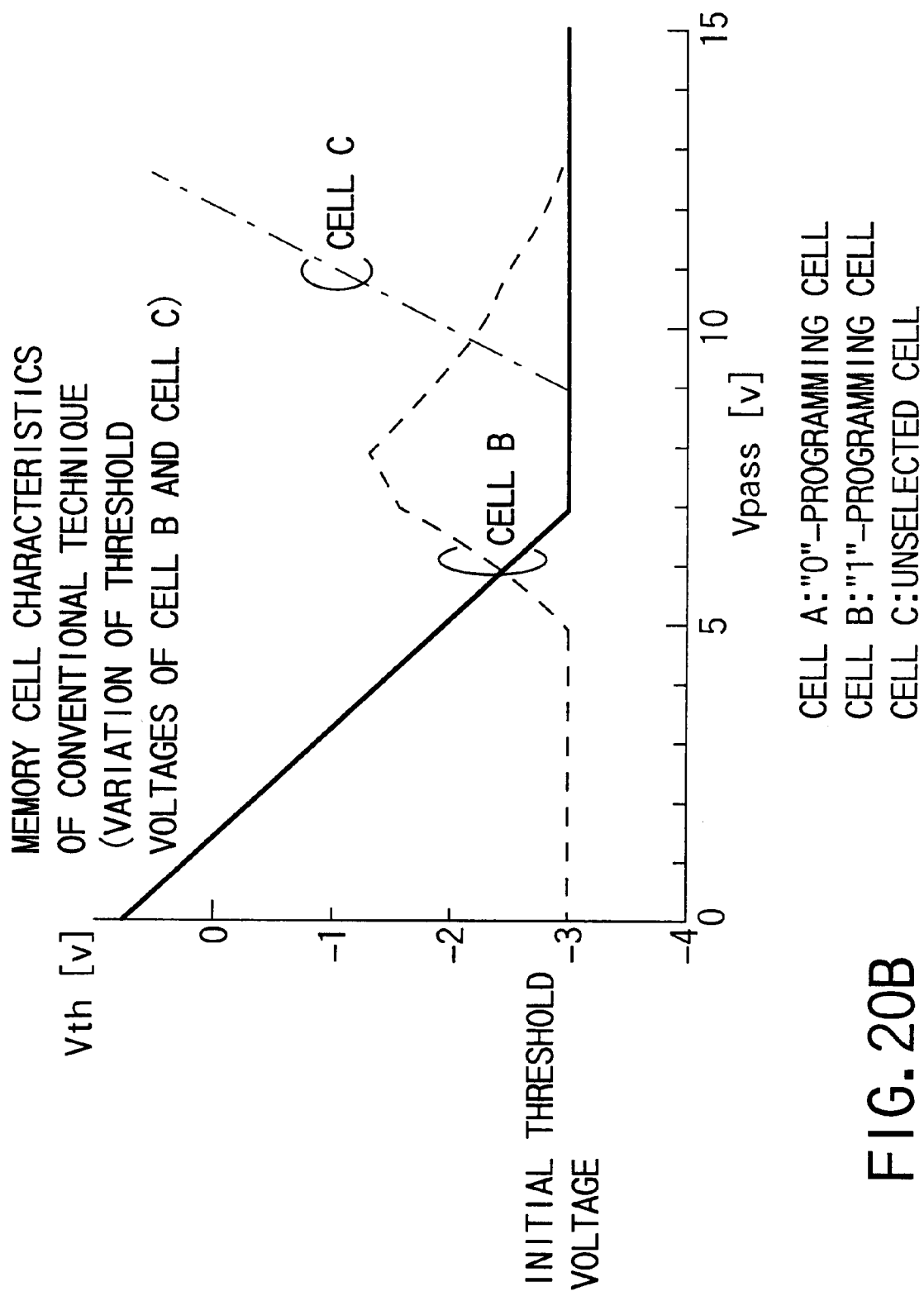
FIG. 20B is a graph showing the characteristics of a conventional memory cell.

FIG. 20A shows a variation of threshold values of cells B and C upon executing self boost programming for the memory cells of the present invention. FIG. 20B shows a variation of threshold values of cells B and C upon executing self boost programming for conventional memory cells.

Note that cells B and C indicate those in FIGS. 16 (present invention) and 3 (prior art). Also, a threshold value is defined to be a control gate potential when a current of 0.5 $\mu$A flows in a bit line.

Assume that both cells B and C are erased, and their threshold values are −3.0V. First, a potential ("1"-programming stress) as the sum of, e.g., a program potential Vpp and 1.5V, is kept applied to the control gate electrode of cell B for 500 $\mu$sec. Note that the program potential Vpp increases the threshold value of a "0"-programming cell to 1.0V when the programming stress is kept applied thereto for 500 $\mu$sec. On the other hand, a passing potential Vpass is kept applied to the control gate electrode of cell C for 750 $\mu$sec.

Note that the aforementioned stress condition and definition of the threshold value are merely examples, and may be changed. Even in such case, substantially the same test results are obtained.

In this example, the stress condition and definition of the threshold value are presented as concrete numerical values, but they are largely influenced by the characteristics of memory cells such as the program characteristics of memory cells, the boost ratio of the channel, and the like. That is, in the present invention, even when the stress condition and the absolute value of the threshold value vary more or less, no problem is posed.

The characteristics of memory cells with the conventional structure will be explained first with reference to FIG. 20B. Note that the characteristics of memory cells are expressed as changes in threshold value of cells B and C upon executing "0"-programming for cell A shown in FIG. 3.

The solid curve represents the relationship between the passing potential Vpass and a change in threshold value of cell B when the back pattern indicates an erase state. When the back pattern indicates an erase state, a change in threshold value of cell B becomes zero when the passing potential Vpass becomes equal to or higher than 7V.

The broken curve represents the relationship between the passing potential Vpass and a change in threshold value of cell B when the back pattern indicates a program state (threshold value =2.0V). When the back pattern indicates a program state (threshold value =2.0V), the threshold value varies from −3.0V to the vicinity of −2.0V even when 10V are applied as the passing voltage Vpass. This is because the channel potential drops when the threshold value of the back pattern is large. Therefore, in a multi-level memory in which the threshold value of the back pattern becomes large, a variation of the threshold value especially becomes large, and program errors frequently occur.

The one-dashed chain curve represents the relationship between the passing potential Vpass and a change in threshold value of cell C. The change in threshold value of cell C is determined by the program characteristics of memory cells since it is not associated with self boost.

The characteristics of memory cells with the cell structure according to the present invention will be explained below with reference to FIG. 20A. Note that the characteristics of memory cells are expressed as changes in threshold value of cells B and C upon executing "0"-programming for cell A shown in FIG. 16.

The solid curve represents the relationship between the passing potential Vpass and a change in threshold value of cell B when the back pattern indicates an erase state. When the back pattern indicates an erase state, a change in threshold value of cell B becomes zero when the passing potential Vpass becomes equal to or higher than 7V as in the characteristics of the conventional cell structure.

The broken curve (thin curve) represents the relationship between the passing potential Vpass and a change in threshold value of cell B when the back pattern indicates a program state (threshold value=2.0V). When the back pattern indicates a program state, i.e., the threshold value of the back pattern is positive, the threshold value varies little regardless of the passing potential Vpass. That is, in the cell structure of the present invention, a variation of the threshold value of cell B decreases with increasing threshold value of the back pattern.

The broken curve (bold curve) represents the relationship between Vpass and a change in threshold value of cell B when the back pattern is in a state wherein program errors most readily occur. Program errors most readily occur, i.e., the threshold value varies most largely when the second memory cell from the bit line side is in a program state upon selecting the word line closest to the bit line, its threshold value is small (absolute value is small), all of memory cells from the third memory cell on the bit line side to the memory cell closest to the source line are in an erase state, and their threshold values are large (absolute values are large), as described above. In such case, a change in threshold value of cell B becomes maximum when Vpass is around 5V, but its amount is small and is normally smaller than a change in threshold value when the back pattern indicates an erase state under the same condition.

Therefore, according to the cell structure of the present invention, the Vpass range which suffers little change in threshold value independently of conditions can be assured for a memory cell which does not undergo "0"-programming. For this reason, upon self boost or LSB programming, program errors in cells B and C can be perfectly prevented.

The one-dashed chain curve represents the relationship between the passing potential Vpass and a change in threshold value of cell C. A change in threshold value of cell C is determined by the program characteristics of memory cells, as in FIG. 20B, since it is not associated with programming schemes (self boost, LSB, and the like).

When the cell structure of the present invention is adopted, since the parasitic transistors (M1, M3, S1, and S3 in FIGS. 17A and 17B) serve as resistances in read operation, the cell current decreases, and the read time becomes long. However, the read time can be prevented from being prolonged by devising the circuit design and the memory cell array segmentation method. Note that a detailed description of such device will be omitted.

As for a decrease in cell current due to the resistances of the parasitic transistors, the cell current itself may be increased. However, the result obtained in this case is equivalent to that by the substrate bias effect due to a voltage drop, and the threshold values of memory cells vary. The threshold values of memory cells closer to the bit line readily vary. For this reason, a small current is preferably set in read operation.

Therefore, since a large cell current cannot be consequently set, it is desirable to provide a high-performance read circuit which can attain a high-speed read operation even with a small cell current (read current) by devising the arrangement of a read circuit in each sense amplifier connected to the bit lines.

In the conventional memory cell and select gate transistor, when the gate length becomes shorter as miniaturization evolves, the short channel effect is produced, and their threshold values vary. Also, a variation of the threshold value of the memory cell results in variations of its cell current and program/erase characteristics. A variation of the threshold value of the select gate transistor results in a variation of the cutoff frequency.

By contrast, since the memory cell of the present invention is constructed by the main transistor M2 and the parasitic transistors M1 and M3 formed on both sides of the transistor M2, the short channel effect can be suppressed, and any variation of the program/erase characteristics can be avoided. Since the select gate transistor of the present invention has the same structure as the memory cell, its threshold value and cutoff characteristics can be prevented from varying.

Therefore, according to the present invention, a NAND flash EEPROM with higher reliability than the conventional one can be realized.

Figure 21A:
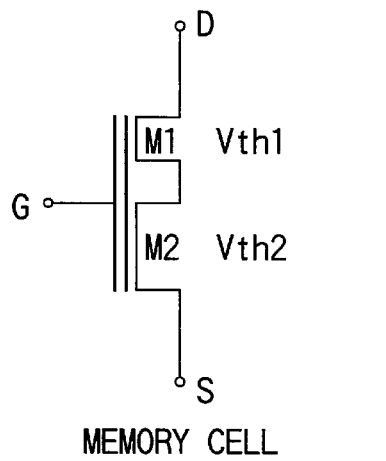
FIG. 21A is an equivalent circuit diagram of a memory cell of the present invention.
Figure 21B:
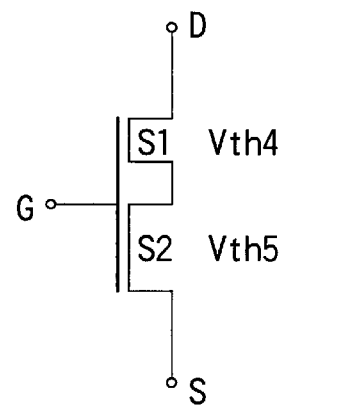
FIG. 21B is an equivalent circuit diagram of a select gate transistor of the present invention.

FIG. 21A shows another example of the memory cell according to the present invention. FIG. 21B shows another example of the select gate transistor according to the present invention.

In the example shown in FIGS. 17A and 17B, each of the memory cell and select gate transistor is constructed by the main transistor and two parasitic transistors respectively connected to the two terminals of the main transistor. By contrast, in this example, each of the memory cell and select gate transistor is constructed by a main transistor and one parasitic transistor connected to the drain side (bit line side) of the main transistor.

In the memory cell, transistors M1 and M2 respectively have a common floating gate electrode and control gate electrode. The channel length of the transistor M1 is set to be smaller than that of the transistor M2. The threshold values of the transistors M1 and M2 vary depending on whether the memory cell is in a program state ("0" in a two-level memory; "1", "2", . . . , "n" in a multi-level memory) or an erase state ("1" in the two-level memory; "0" in the multi-level memory), but a threshold value Vth1 of the transistor m1 is always larger than that of a threshold value Vth2 of the transistor M2.

The select gate transistor has the same structure as the memory cell. That is, transistors S1 and S2 have a common gate electrode. The channel length of the transistor S1 is set to be smaller than that of the transistor S2. Also, a threshold value Vth4 of the transistor S1 is larger than a threshold value Vth5 of the transistor S2.

In the memory cell and select gate transistor, the main transistor must be composed of a single transistor in terms of the equivalent circuit and device structure, but the parasitic transistor may be a combination of a plurality of transistors.

When the memory cell and select gate transistor of this example are used, since the parasitic transistor serves as a cutoff transistor upon self boost or LSB programming, programming free from any program errors can be done even when device miniaturization progresses, as in the example shown in FIGS. 17A and 17B. Also, the cell structure of this example is very effective for products which use programming such as self boost programming, LSB programming, or the like, which boosts the channel of a program inhibit cell especially in multi-level memories.

In this example, since the threshold value of the parasitic transistor is set to be higher than that of the main transistor, the parasitic transistor serves as a resistance in a read operation, as in the example shown in FIGS. 17A and 17B. However, in this example, the parasitic transistor is connected to only the drain side of the main transistor. For this reason, the structure of this example is free from any decrease in cell current unlike the example shown in FIGS. 17A and 17B, and no extreme drop of the data reading speed is experienced compared to the conventional cell structure.

An example of the device structure that implements the memory cell and select gate transistor of the present invention will be described below.

Figure 22:
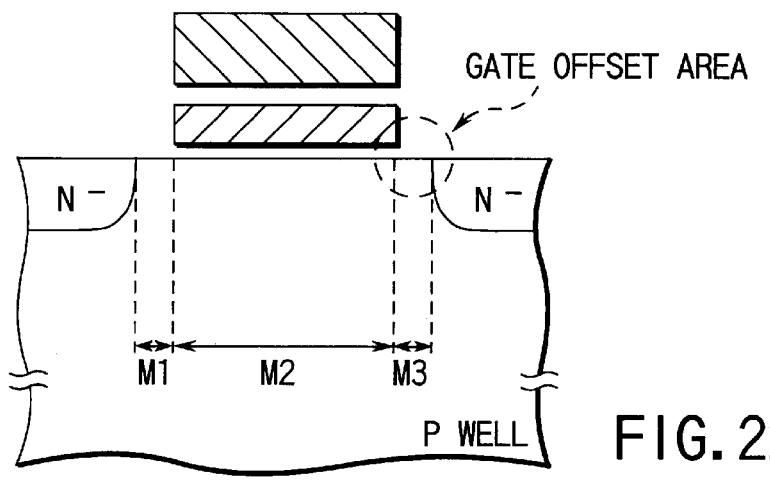
FIG. 22 is a sectional view showing an example of the device structure of the memory cell of the present invention.
Figure 23:
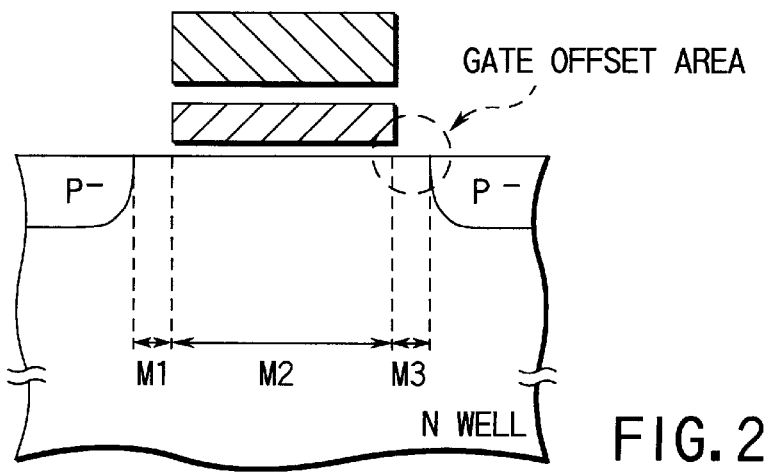
FIG. 23 is a sectional view showing another example of the device structure of the memory cell of the present invention.

FIGS. 22 and 23 are sectional views of the memory cell that forms the NAND cell unit in the column direction (the direction in which the bit line runs).

FIG. 22 shows an example of an n-channel memory cell, and FIG. 23 shows an example of a p-channel memory cell. Note that the select gate transistor has the same device structure as that of the memory cell, but, for example, only the lower layer of a two-layered polysilicon gate serves as an actual gate electrode.

Upon implementing the memory cell of the present invention, the simplest and highly practical device structure has a gate offset area between the source/drain diffusion layer and gate edge.

Note that the gate offset area is a space assured between the edge of the source/drain diffusion layer and gate edge. Normally, the edge of the source/drain diffusion layer is present immediately below the gate edge or gate electrode. However, in the present invention, the edge of the source/drain diffusion layer is formed at a position separated from the gate edge to assure the gate offset area.

The gate offset area is formed by, e.g., the following method.

Ion implantation for controlling the threshold value (i.e., so-called channel implantation) is done with respect to a substrate (p-well), and a tunnel oxide film, isolation insulating film, first polysilicon film, interpoly insulating film, and second polysilicon film are respectively formed. After that, a gate electrode is formed, and ion implantation for the source/drain diffusion layer is done using the gate electrode as a mask. The gate offset area can be easily formed by, e.g., forming a side-wall insulating film (spacer) on the side wall of the gate electrode. Note that a practical example of the method of forming the gate offset area will be given later with reference to the manufacturing method.

Electrically viewed from the control gate electrode side, the gate offset area is a parasitic transistor which has a floating gate electrode and a thick gate insulating film. Therefore, the memory cell (the same applies to the select gate transistor) shown in FIGS. 22 and 23 can be expressed by an equivalent circuit shown in FIGS. 17A and 17B. The threshold value of this parasitic transistor is susceptible to the influence of the charge amount in the floating gate electrode. Note that the parasitic transistor is harder to turn on than the main transistor, and the threshold value of the parasitic transistor is positively large and is largely influenced by the substrate bias effect.

Hence, the parasitic transistor is easily cut off when the potential of the source/drain diffusion layer rises by boosting the channel potential upon self boost or LSB programming. For this reason, even when the memory cell is erased, if its erase threshold value is small (i.e., it is negative and has a small absolute value), the parasitic transistor which is parasitic on the gate offset area is cut off.

That is, according to the NAND flash EEPROM built by memory cells (which can be of either n- or p-channel type) having the aforementioned device structure, when device miniaturization evolves or the number of bits required for the multi-level configuration increases, a variation of the threshold value of each memory cell that must remain erased can be suppressed even when the memory is driven by self boost or LSB programming, thus preventing program errors.

Figure 24:
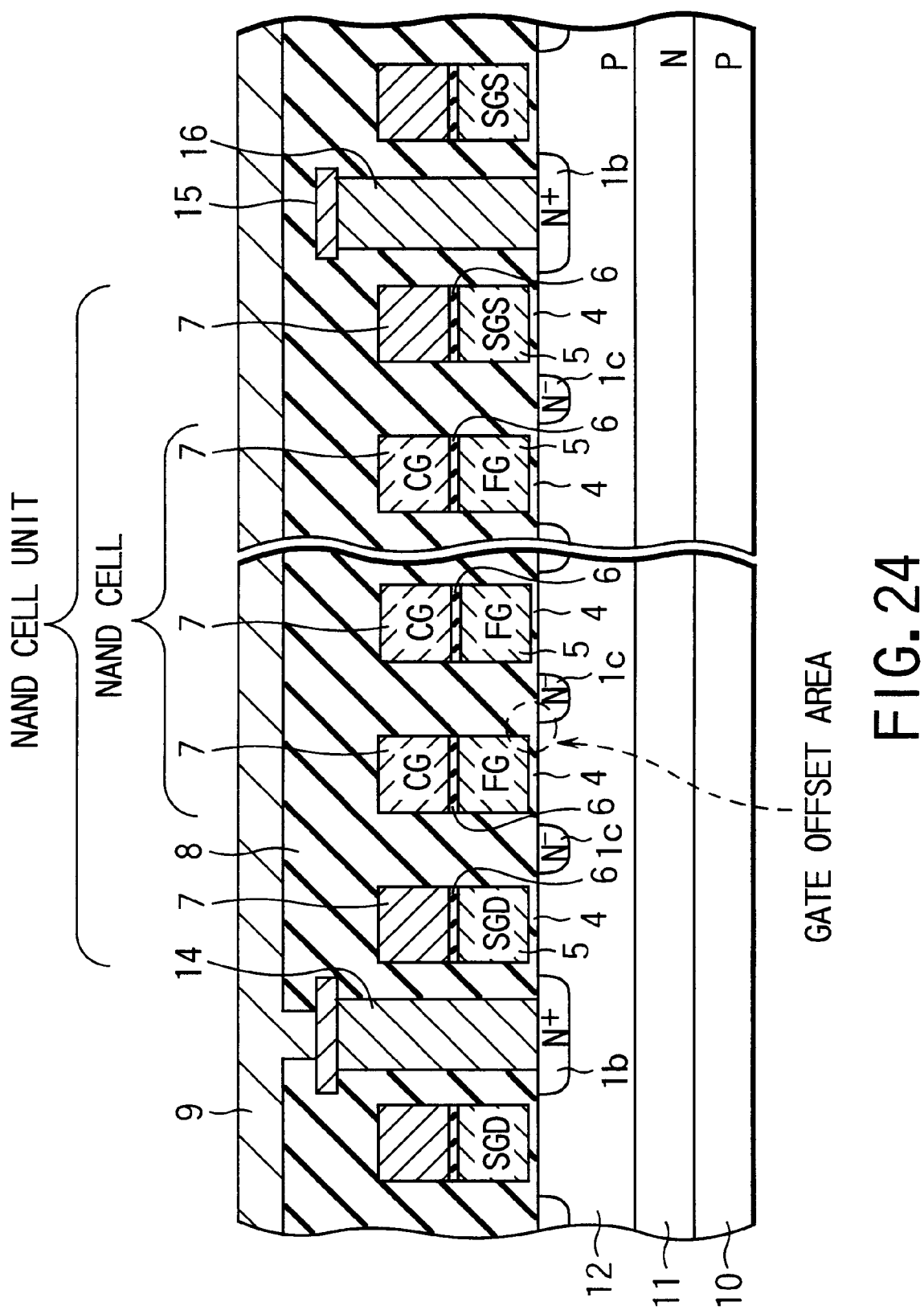
FIG. 24 is a sectional view showing an example of the device structure of the memory cells and select gate transistors of the present invention.

FIG. 24 is a sectional view of the device structure of the NAND cell unit, to which the present invention is applied, in the column direction.

The NAND cell unit is constructed by NAND cells each consisting of a series circuit of a plurality of (e.g., 16) memory cells, and two select gate transistors respectively connected to the end cells.

The memory cells and select gate transistors in the NAND cell unit are disposed in a p-well 12 in an n-well 11 formed on a p-semiconductor substrate 10, i.e., in a twin-well.

Each memory cell in the NAND cell has a so-called stacked gate structure formed by stacking a control gate electrode 7 on a floating gate electrode 5 via an interpoly insulating film (ONO film) 6. Also, each select gate transistor has the same stacked gate structure as that of the memory cell on a gate insulating film on a gate insulating film (tunnel oxide film) 4, but only the lower layer serve as a gate electrode in practice.

The control gate electrodes (word lines) 7 run in the row direction of the memory cell array, and are commonly connected to memory cells in the same rows. Likewise, select gate electrodes (select gate lines) run in the row direction of the memory cell array, and are commonly connected to select gate transistors in NAND memory cell units in the same rows.

In the NAND cell unit, two neighboring transistors (memory cells and/or select gate transistor) share a single n--diffusion layer (source or drain) 1c. Also, two NAND cell units neighboring in the column direction share an n+-drain diffusion layer 1b.

A characteristic feature of the present invention lies in that gate offset areas are formed between the edges of the n+-diffusion layer 1b and n--diffusion layer 1c and the gate edges. The gate offset areas are formed for both the memory cell and select gate transistor.

The select gate transistor on one end side (on the drain side) of the NAND cells is connected to a bit line (data line) 9 via a bit line contact portion 14 formed in an insulating interlayer 8, and the select gate transistor on the other end side (on the source side) to a source line (reference potential line) 15 via a source line contact portion 16 formed in the insulating interlayer 8. The source line 15 is commonly connected to, e.g., all the NAND cell units.

In this example, only the sectional view in the column direction is presented, but the plan view and sectional view in the row direction are substantially the same as those (FIGS. 5, 7, 8, and 9) of the conventional structure. Also, an element isolation structure may use either a field oxide film or STI (Shallow Trench Isolation).

The first example of a method of manufacturing a memory cell array of a NAND flash EEPROM having the memory cells and select gate transistors of the present invention will be explained below.

In the manufacturing method to be described below, the memory cells and select gate transistors are of n-channel type, but the following manufacturing method can also be applied to p-channel type by changing the types of impurities and ion implantation conditions (dose, acceleration voltage, and the like).

Also, so-called peripheral circuits formed around the memory cell array are formed parallel to formation of the memory cell array, but since a method of manufacturing peripheral circuits is not particularly important, a description thereof will be omitted.

Figure 25:
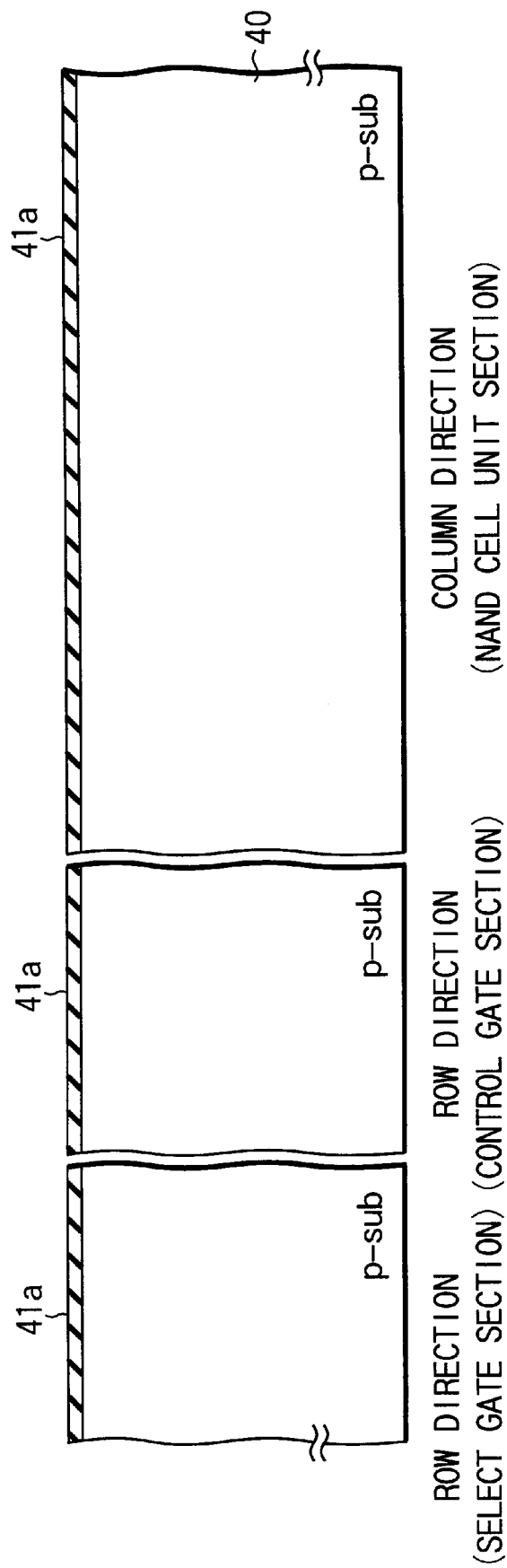
FIG. 25 is a sectional view showing one step of the first example of a manufacturing method of the present invention.

As shown in FIG. 25, a 10-nm thick silicon oxide film 41a is formed on a p-silicon substrate 40 by, e.g., thermal oxidation.

Figure 26:
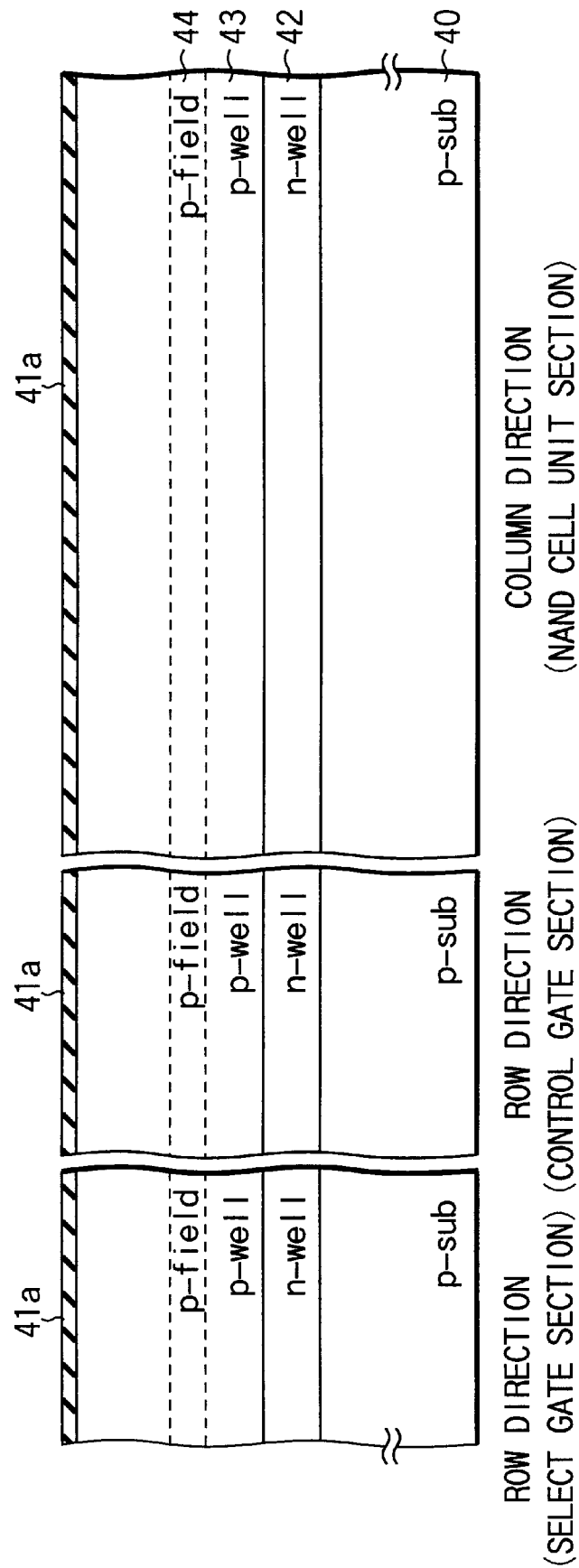
FIG. 26 is a sectional view showing one step of the first example of the manufacturing method of the present invention.

As shown in FIG. 26, an n-impurity (e.g., phosphorus (P)) is ion-implanted into the silicon substrate 40 using an n-well formation mask, thus forming an n-well region 42. Note that the n-well region 42 is formed by ion-implanting phosphorus into the silicon substrate 40 at, e.g., an acceleration energy of 1.5 MeV and a dose of $4.0 \times 10^{13}$ cm$^{-2}$.

Alternatively, the n-well region 42 may be formed by, e.g., three-step ion implantation. That is, phosphorus is ion-implanted into the silicon substrate at, e.g., an acceleration energy of 1.5 MeV and a dose of $4.0 \times 10^{12}$ cm$^{-2}$ in the first step, at, e.g., an acceleration energy of 750 KeV and a dose of $8.0 \times 10^{12}$ cm$^{-2}$ in the second step, and at, e.g., an acceleration energy of 150 KeV and a dose of $1.0 \times 10^{12}$ cm$^{-2}$ in the third step.

A p-impurity (e.g., boron (B)) is ion-implanted into the silicon substrate 40 using a p-well formation mask to form a p-well region 43. Note that the p-well region 43 is formed by ion-implanting boron into the silicon substrate 40 at, e.g., an acceleration energy of 300 KeV and a dose of $3.0 \times 10^{13}$ cm$^{-2}$.

Alternatively, the p-well region 43 may be formed by, e.g., two-step ion implantation. That is, boron is ion-implanted into the silicon substrate at, e.g., an acceleration energy of 400 KeV and a dose of $4.0 \times 10^{13}$ cm$^{-2}$ in the first step, and at, e.g., an acceleration energy of 200 KeV and a dose of $1.0 \times 10^{12}$ cm$^{-2}$ in the second step.

In the p-well region 43, a p-field region 44 having a higher impurity concentration than the p-well region 43 is formed. Also, boron is ion-implanted (so-called channel implantation) into a surface portion of the p-well region 43 at, e.g., an acceleration energy of 10 KeV and a dose of $3.0 \times 10^{13}$ cm$^{-2}$. After that, the silicon oxide film 41a is removed.

Note that so-called channel implantation may be done after the silicon oxide film 41a is removed. That is, after the silicon oxide film 41a is removed, a 10-nm thick silicon oxide film is formed again on the p-silicon substrate 40 by thermal oxidation, and is patterned for channel implantation. Then, boron is ion-implanted (channel implantation) at, e.g., an acceleration energy of 10 KeV and a dose of $3.0 \times 10^{13}$ cm$^{-2}$ and, after that, the silicon oxide film is removed.

Figure 27:
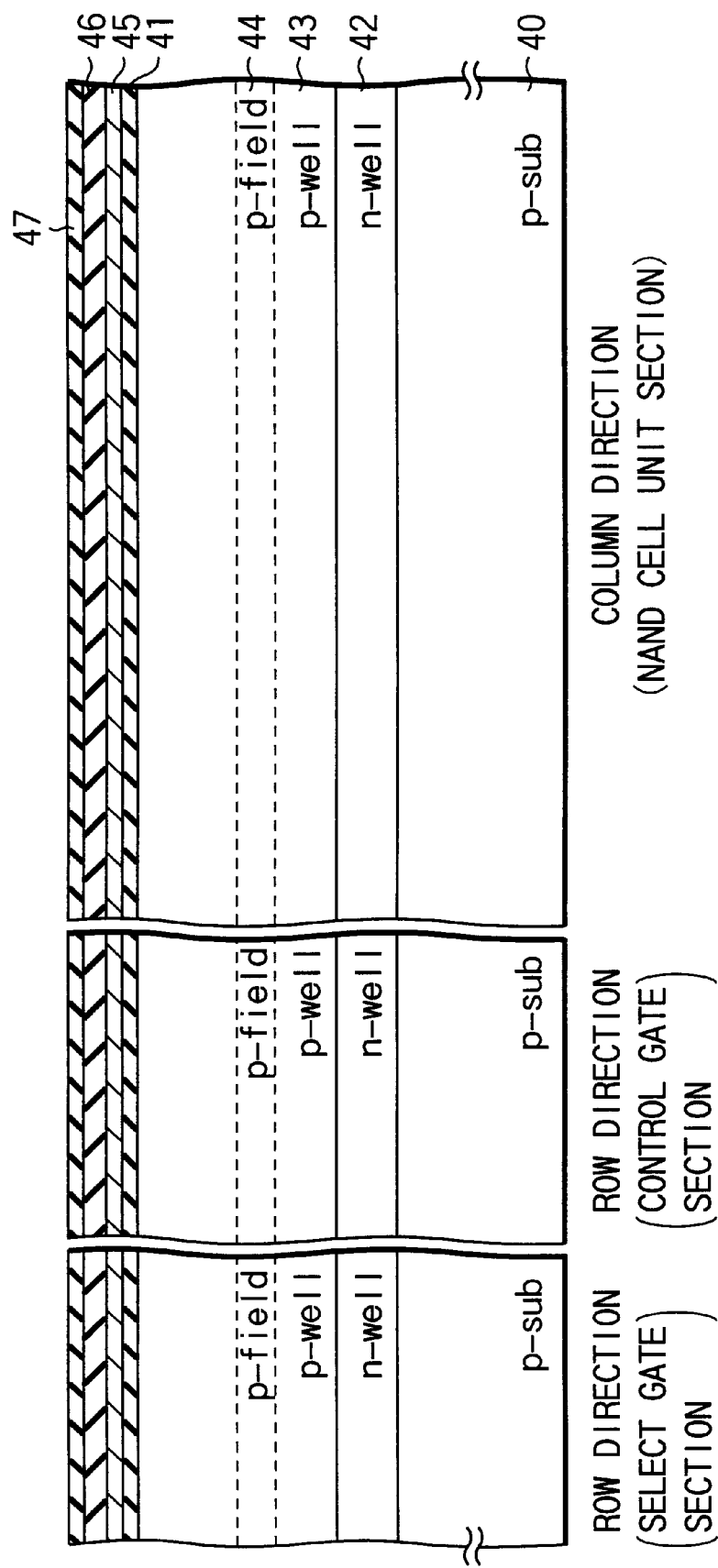
FIG. 27 is a sectional view showing one step of the first example of the manufacturing method of the present invention.

As shown in FIG. 27, thermal oxidation is done in an oxygen atmosphere at a temperature of around 750° C. to form an 8-nm thick silicon oxide film 41 on the silicon substrate 40. Also, a 50-nm thick n-polysilicon film 45 containing an n-impurity (e.g., phosphorus) at a concentration of about $2 \times 10^{20}$ cm$^{-3}$ is formed on the silicon oxide film 41 by, e.g., CVD.

Furthermore, a 100-nm thick silicon nitride film 46 is formed on the polysilicon film 45 by, e.g., CVD. Subsequently, a 150-nm thick silicon oxide film (TEOS film) 47 is formed on the silicon nitride film 46 by, e.g., CVD.

A resist pattern is formed on the silicon oxide film 47 by PEP (photoetching process). Using this resist pattern as a mask, the silicon oxide film 47 is etched by RIE (reactive ion etching). Also, using the silicon oxide film 47 as a mask, the silicon nitride film 46 is etched by RIE and, after that, the silicon nitride film 47 is removed.

Figure 28:
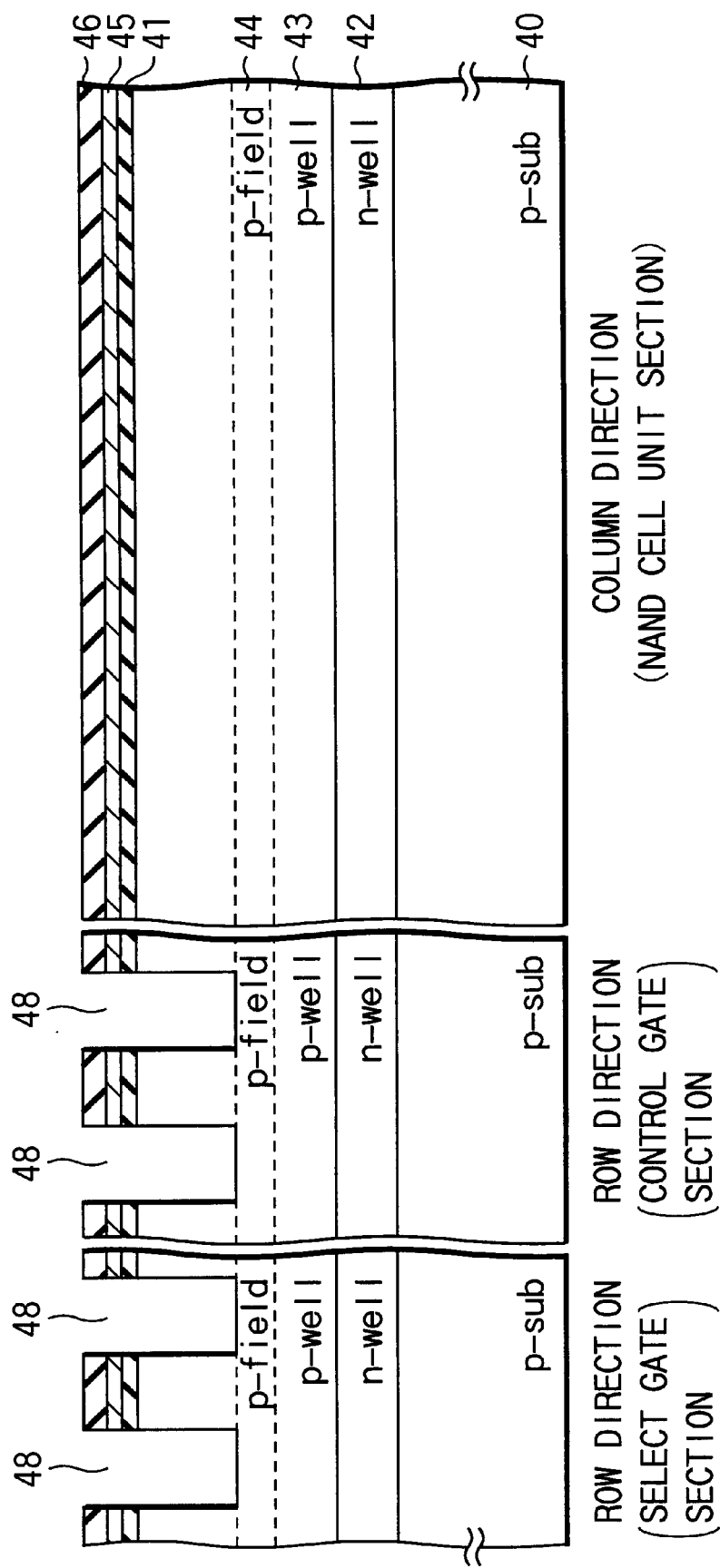
FIG. 28 is a sectional view showing one step of the first example of the manufacturing method of the present invention.

As shown in FIG. 28, using the silicon nitride film 46 as a mask, the polysilicon film 45 and silicon oxide film 41 are etched in turn by RIE. The silicon substrate 40 is etched using the silicon nitride film 46 as a mask to form trenches 48, the bottom portions of which reach the p-field region 44. Note that the depth of each trench 48 is, e.g., around 0.3 $\mu$m.

Figure 29:
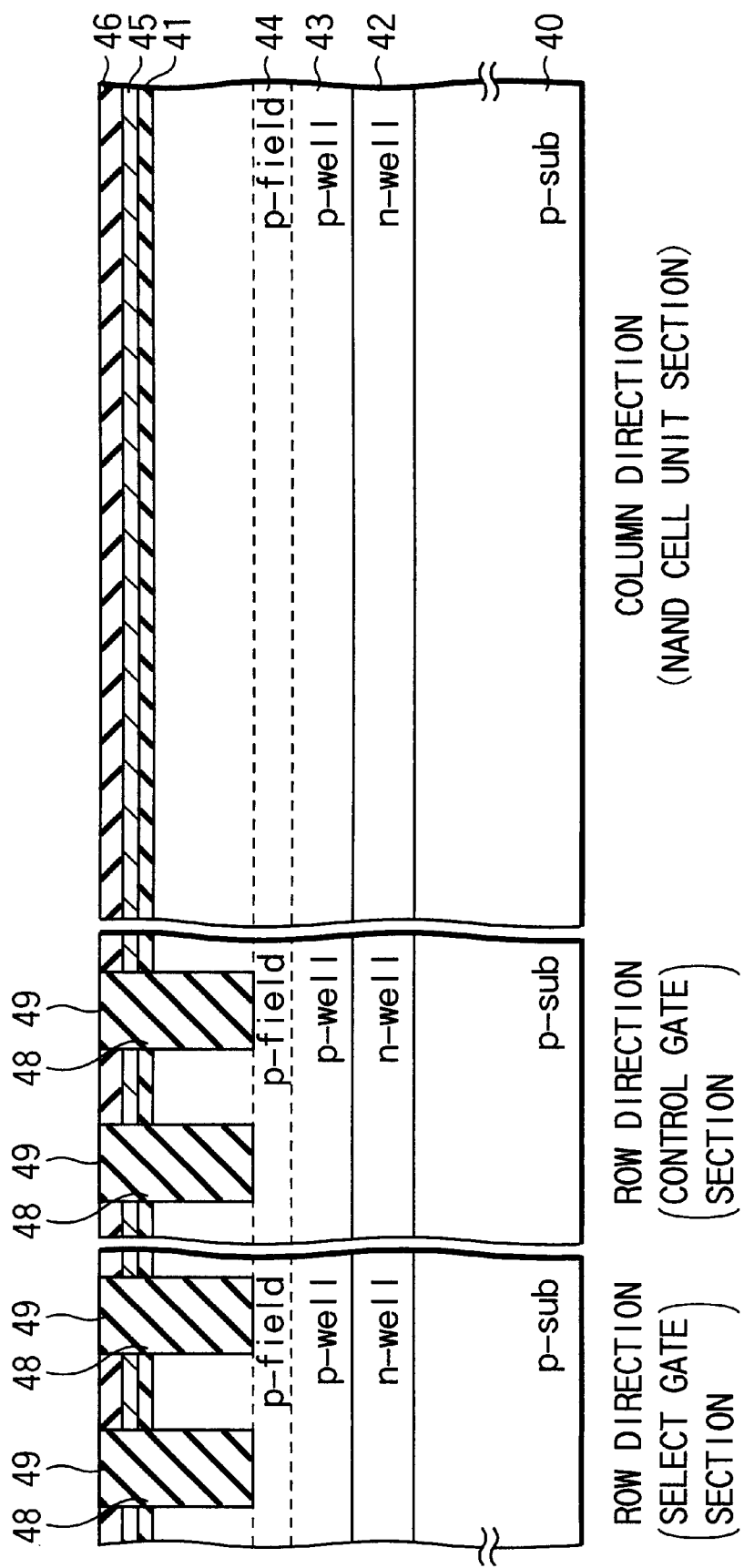
FIG. 29 is a sectional view showing one step of the first example of the manufacturing method of the present invention.

As shown in FIG. 29, an 800-nm thick TEOS film 49 is formed on the silicon nitride film 46 by CVD to completely fill the trenches 48. The TEOS film 49 is polished by CMP (chemical mechanical planarization) to leave the TEOS film 49 in the trenches 48, thus completing the STI (Shallow Trench Isolation) structure.

Note that since the silicon nitride film 46 serves as an etching stopper upon CMP, the surface level of the TEOS film 49 substantially agrees with that of the silicon nitride film 46 (in general, the surface level of the TEOS film 49 is slightly lower than that of the silicon nitride film 46). After that, the silicon nitride film 46 is removed.

Figure 30:
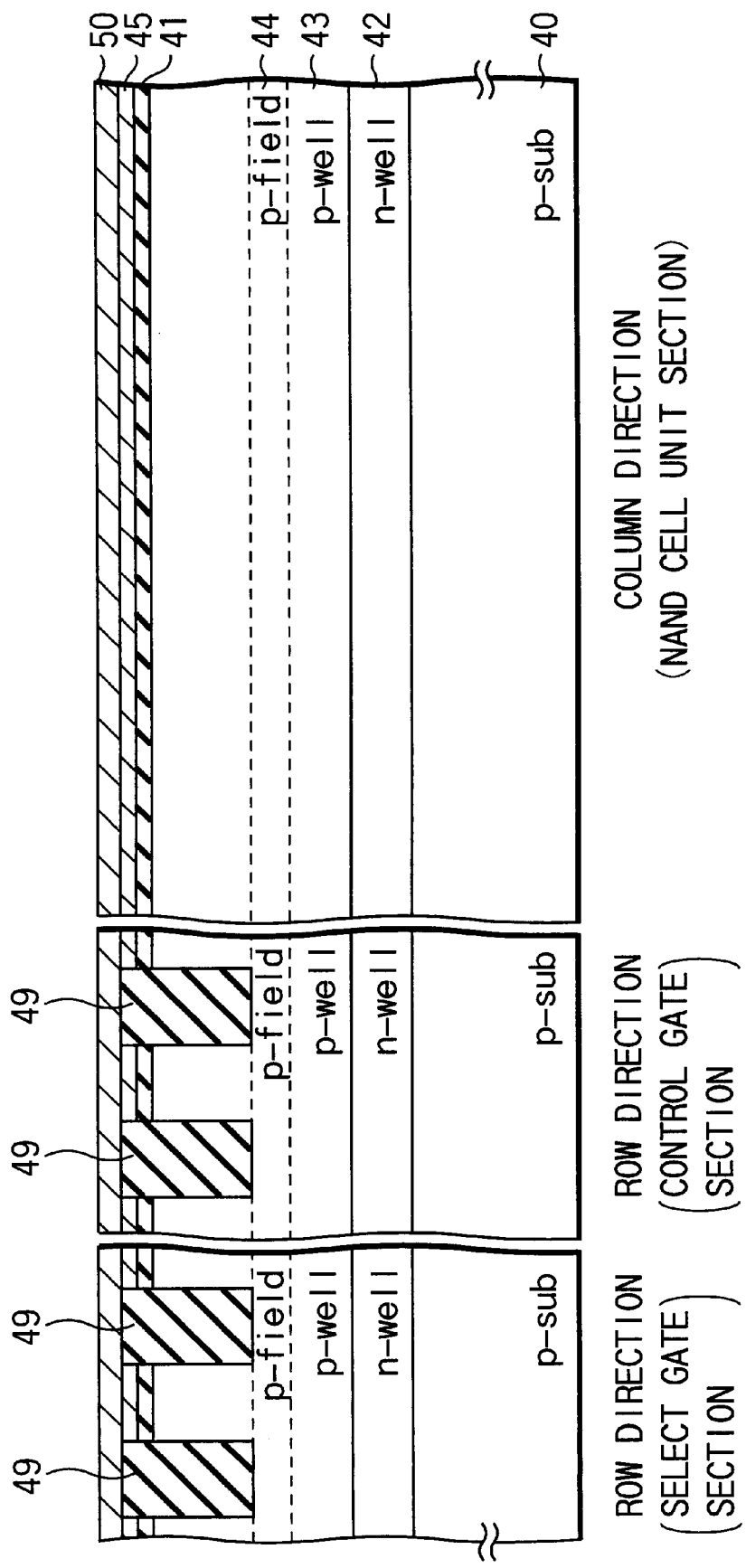
FIG. 30 is a sectional view showing one step of the first example of the manufacturing method of the present invention.

As shown in FIG. 30, a 100-nm thick polysilicon film 50 is formed on the polysilicon film 45 by, e.g., CVD. After that, an n-impurity (e.g., phosphorus) is doped into the polysilicon film 50 at a concentration of about $2 \times 10^{20}$ cm$^{-3}$ by, e.g., thermal diffusion, thus decreasing the resistance of the polysilicon film 50.

Figure 31:
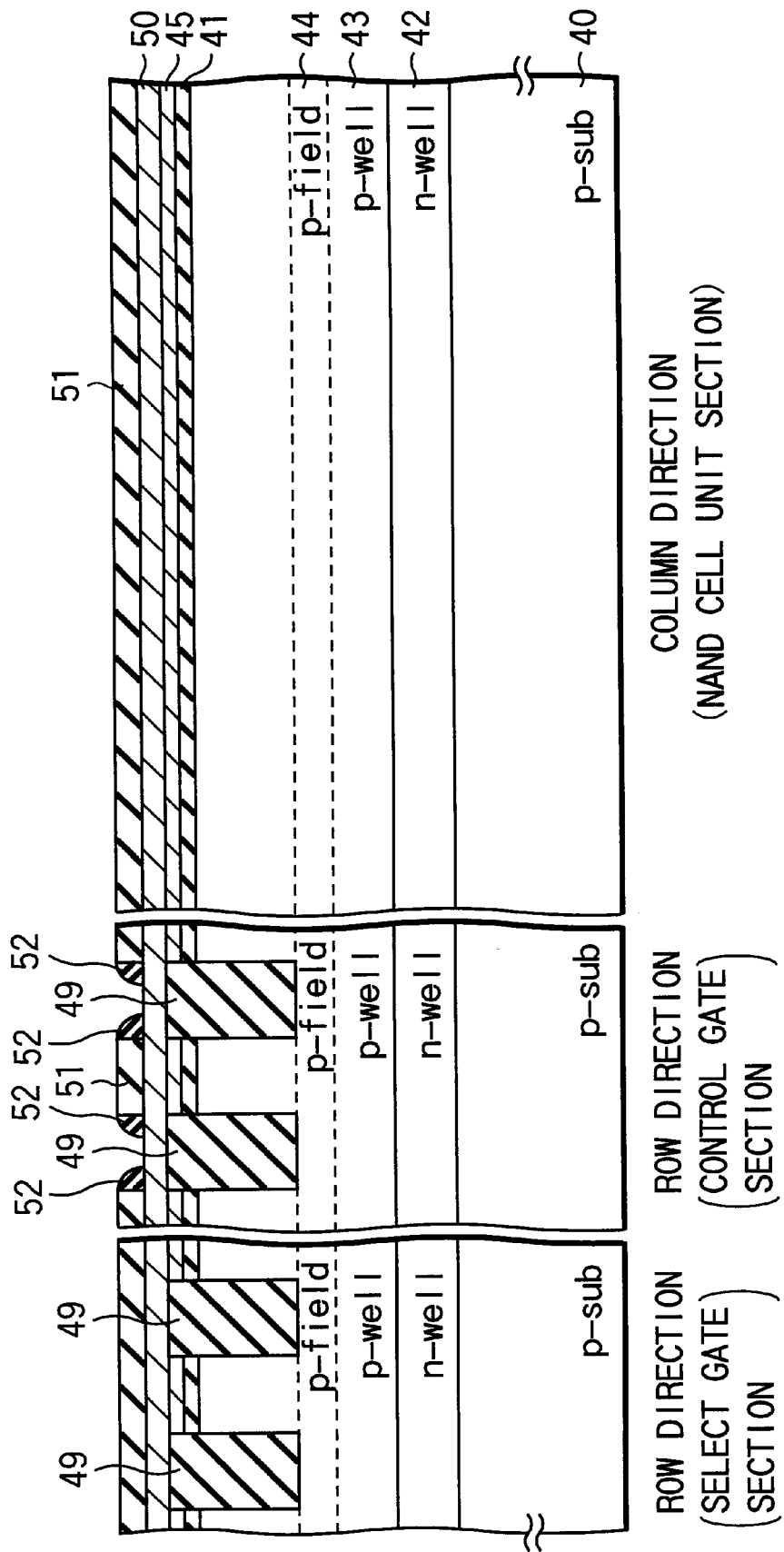
FIG. 31 is a sectional view showing one step of the first example of the manufacturing method of the present invention.

As shown in FIG. 31, a 200-nm thick silicon nitride film 51 is formed on the polysilicon film 50 by, e.g., CVD. The silicon nitride film 51 is patterned to form slits that extend in the column direction in the silicon nitride film 51 except for prospective formation regions of select gate transistors on the source and drain sides. Note that the width of each slit (width in the row direction) is 200 to 300 nm.

Furthermore, an 80-nm thick silicon nitride film 52 is formed on the silicon nitride film 51 by CVD. When the silicon nitride film 52 is etched by RIE, it is left on only the side walls of the slits of the silicon nitride film 51.

Figure 32:
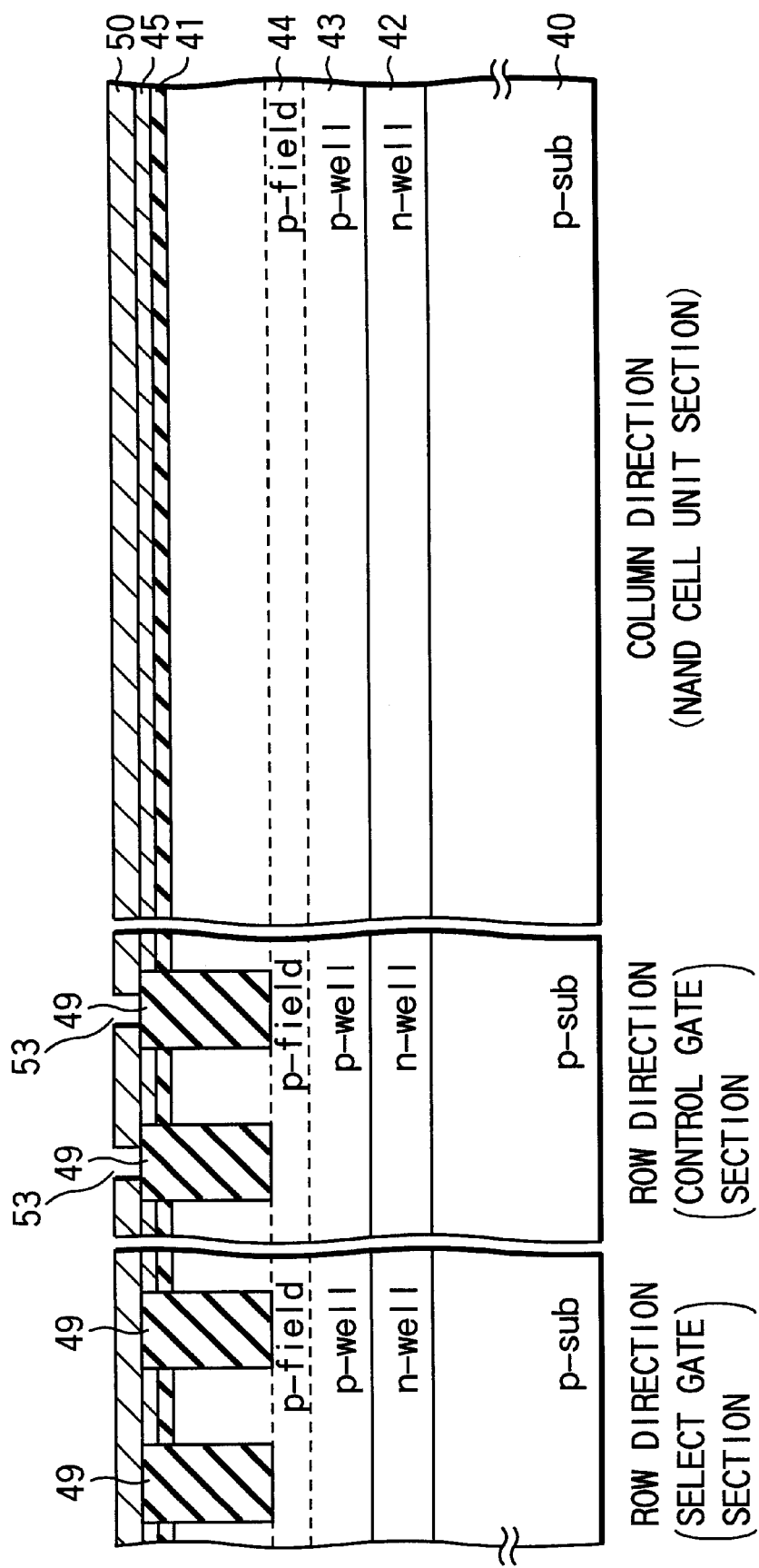
FIG. 32 is a sectional view showing one step of the first example of the manufacturing method of the present invention.

When the polysilicon film 50 is then etched by RIE using the silicon nitride films 51 and 52 as a mask, slit-like openings 53 are formed in the polysilicon film 50, as shown in FIG. 32. Since the width of each opening 53 (the width in the row direction) is smaller than that of the TEOS film 49 (the width in the row direction) that realizes the STI structure, the polysilicon films 45 and 50 serving as floating gates have a wing shape.

After that, the silicon nitride films 51 and 52 are removed.

Figure 33:
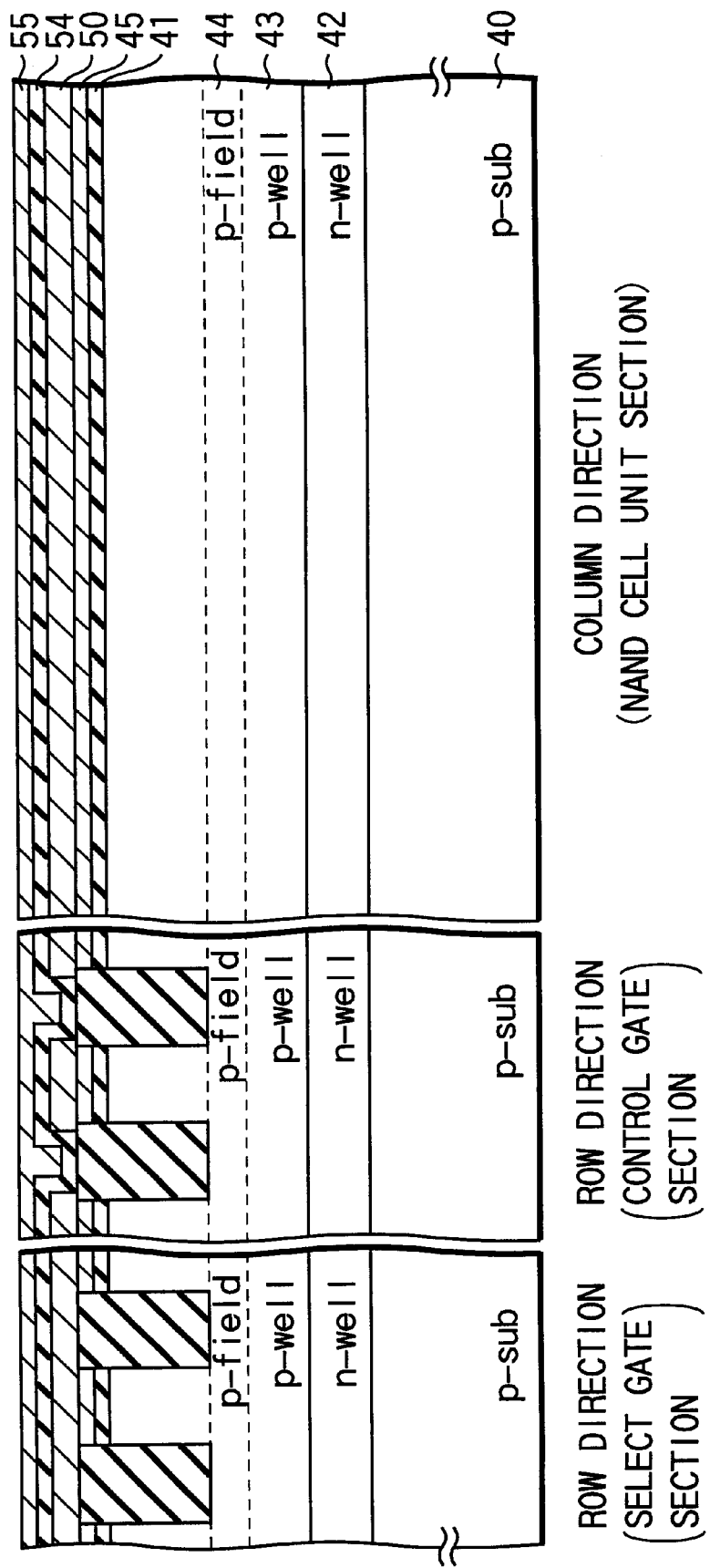
FIG. 33 is a sectional view showing one step of the first example of the manufacturing method of the present invention.

As shown in FIG. 33, an insulating film 54 is formed on the polysilicon film 50. The insulating film 54 is formed by, e.g., a 5-nm thick silicon oxide film, 8-nm thick silicon nitride film, and 5-nm thick silicon oxide film (so-called ONO film). Also, a 150-nm thick polysilicon film 55 is formed on the insulating film 54 by, e.g., CVD. An n-impurity (e.g., phosphorus) is doped into the polysilicon film 55 at a concentration of around $3.6 \times 10^{20}$ cm$^{-3}$ by thermal diffusion, thus decreasing the resistance of the polysilicon film 55.

Figure 34:
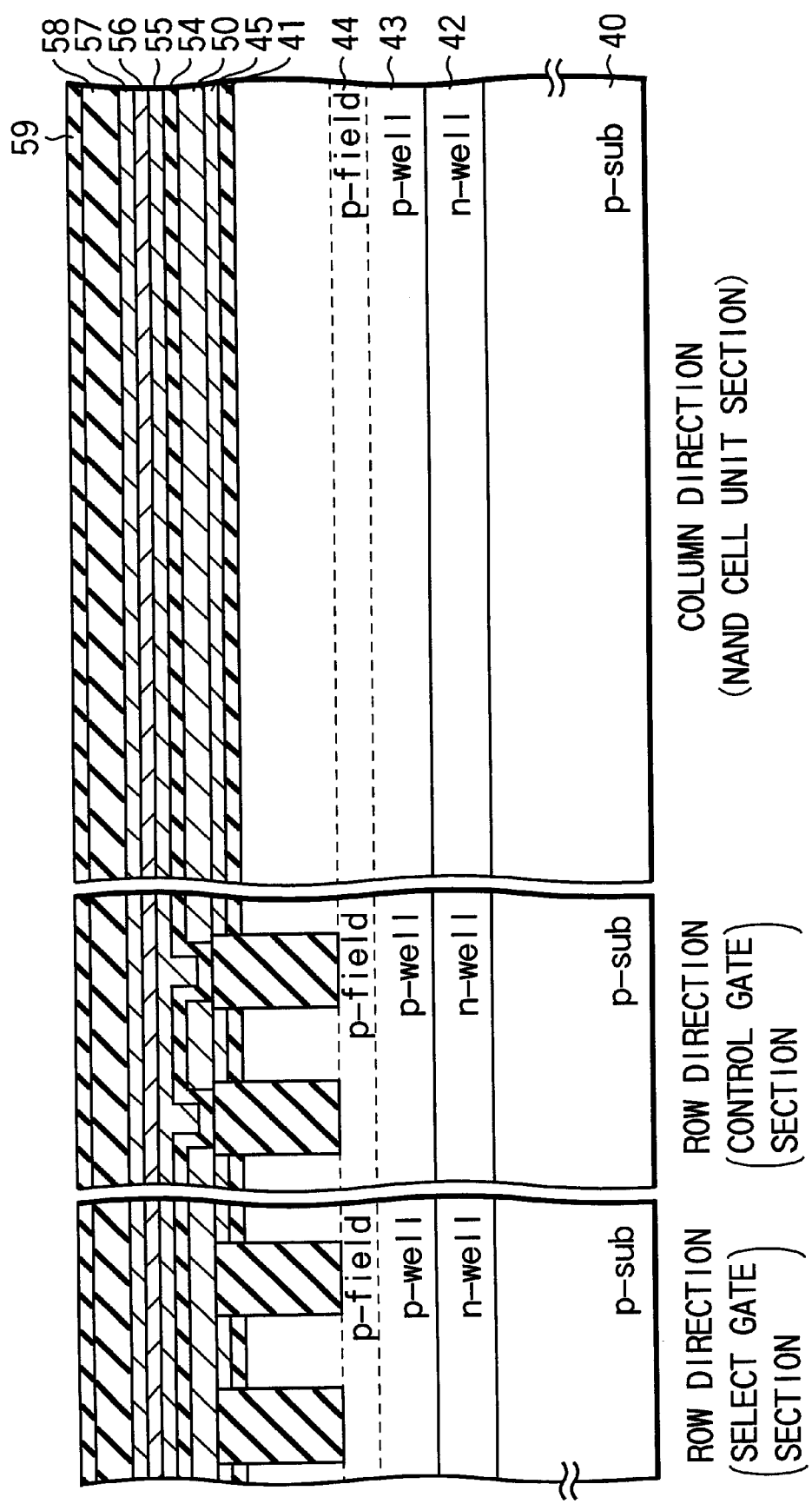
FIG. 34 is a sectional view showing one step of the first example of the manufacturing method of the present invention.

As shown in FIG. 34, a 100-nm thick polysilicon film 56 containing an n-impurity is formed on the polysilicon film 55 using, e.g., CVD. Also, a 200-nm thick tungsten silicide (WSi) film 57 is formed on the polysilicon film 57 by, e.g., CVD. Subsequently, a 100-nm thick silicon nitride film 58 is formed on the tungsten silicide film 57 by CVD. Furthermore, a 100-nm thick silicon oxide film (TEOS film) 59 is formed on the silicon nitride film 58 by CVD.

After that, resist pattern is formed on the silicon oxide film 59 by PEP (photoetching process), and the silicon oxide film 59 is etched by RIE using the resist pattern as a mask. Also, using the silicon oxide film 59 as a mask, the silicon nitride film 58 is etched by RIE and, after that, the silicon oxide film 59 is removed.

Figure 35:
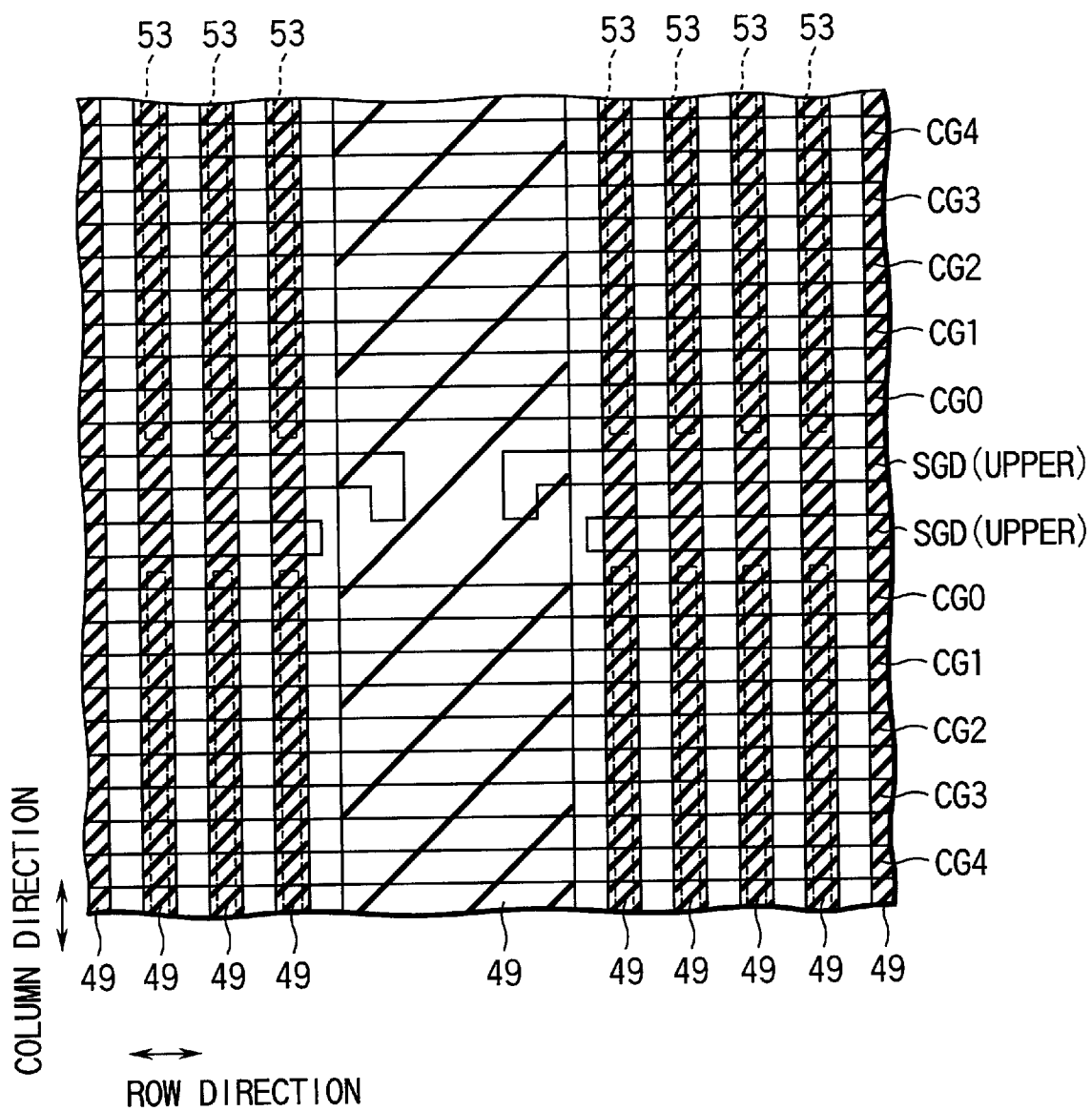
FIG. 35 is a sectional view showing one step of the first example of the manufacturing method of the present invention.
Figure 36:
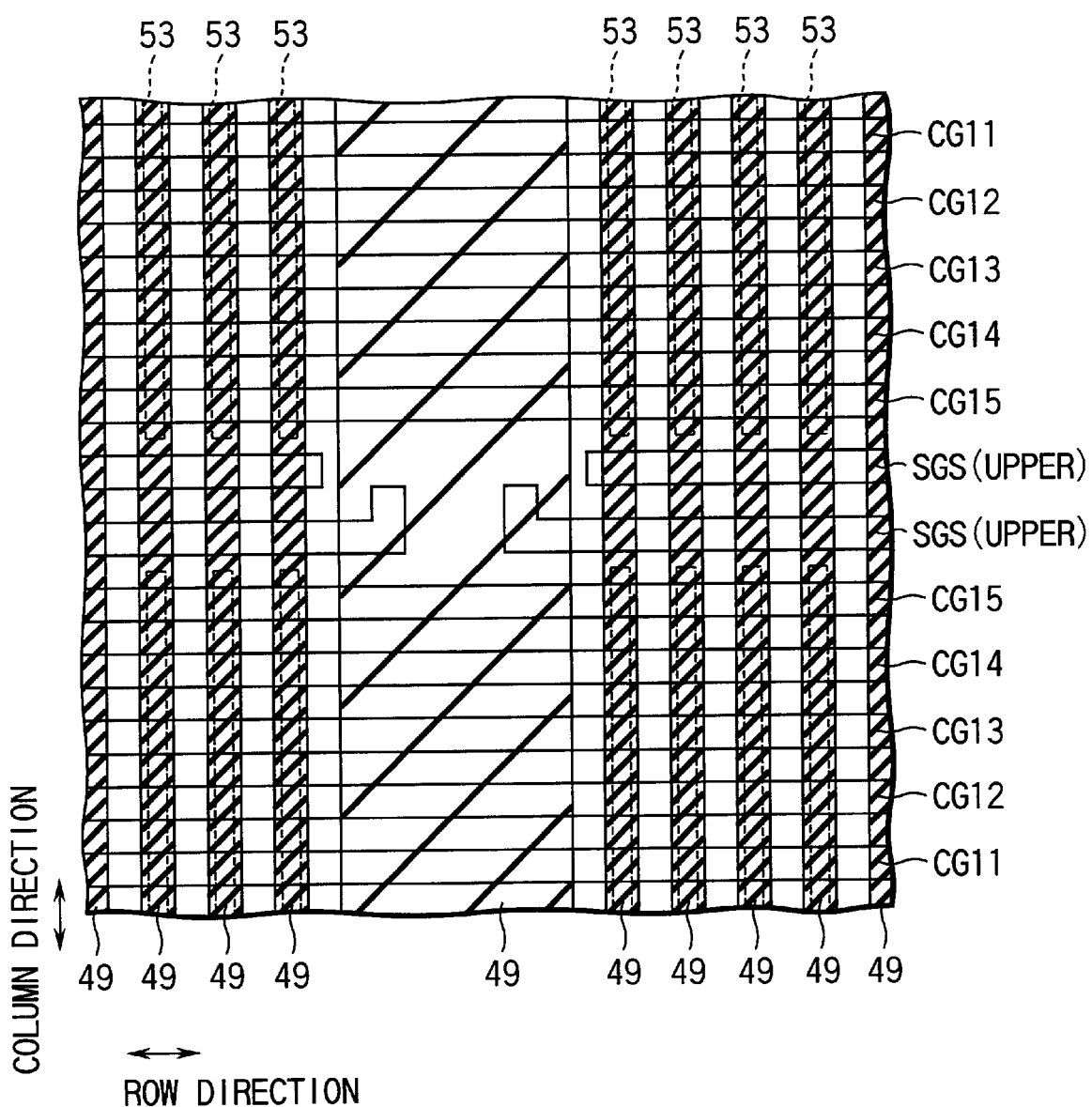
FIG. 36 is a sectional view showing one step of the first example of the manufacturing method of the present invention.
Figure 37:
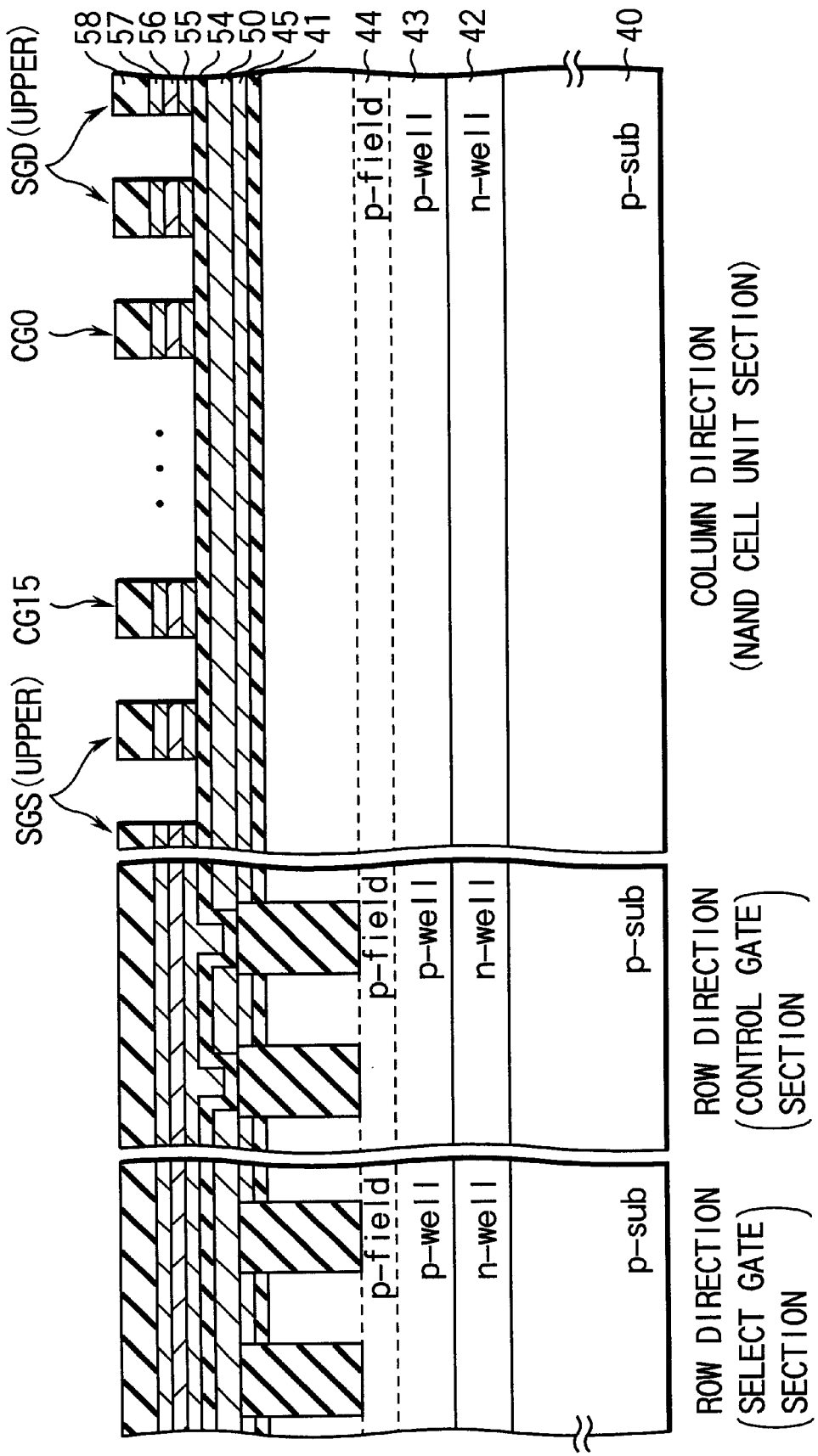
FIG. 37 is a sectional view showing one step of the first example of the manufacturing method of the present invention.
Figure 38:
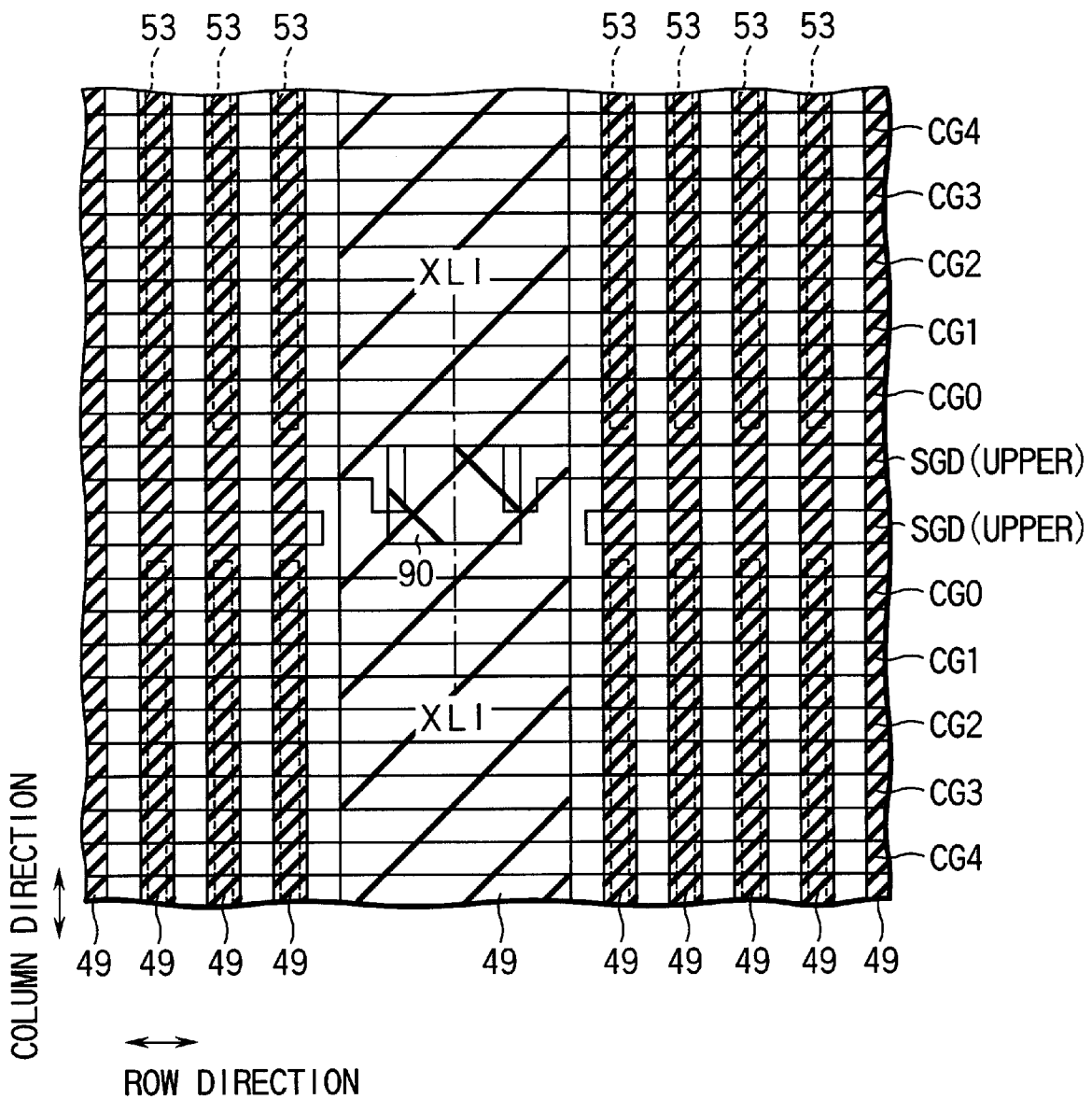
FIG. 38 is a sectional view showing one step of the first example of the manufacturing method of the present invention.
Figure 39:
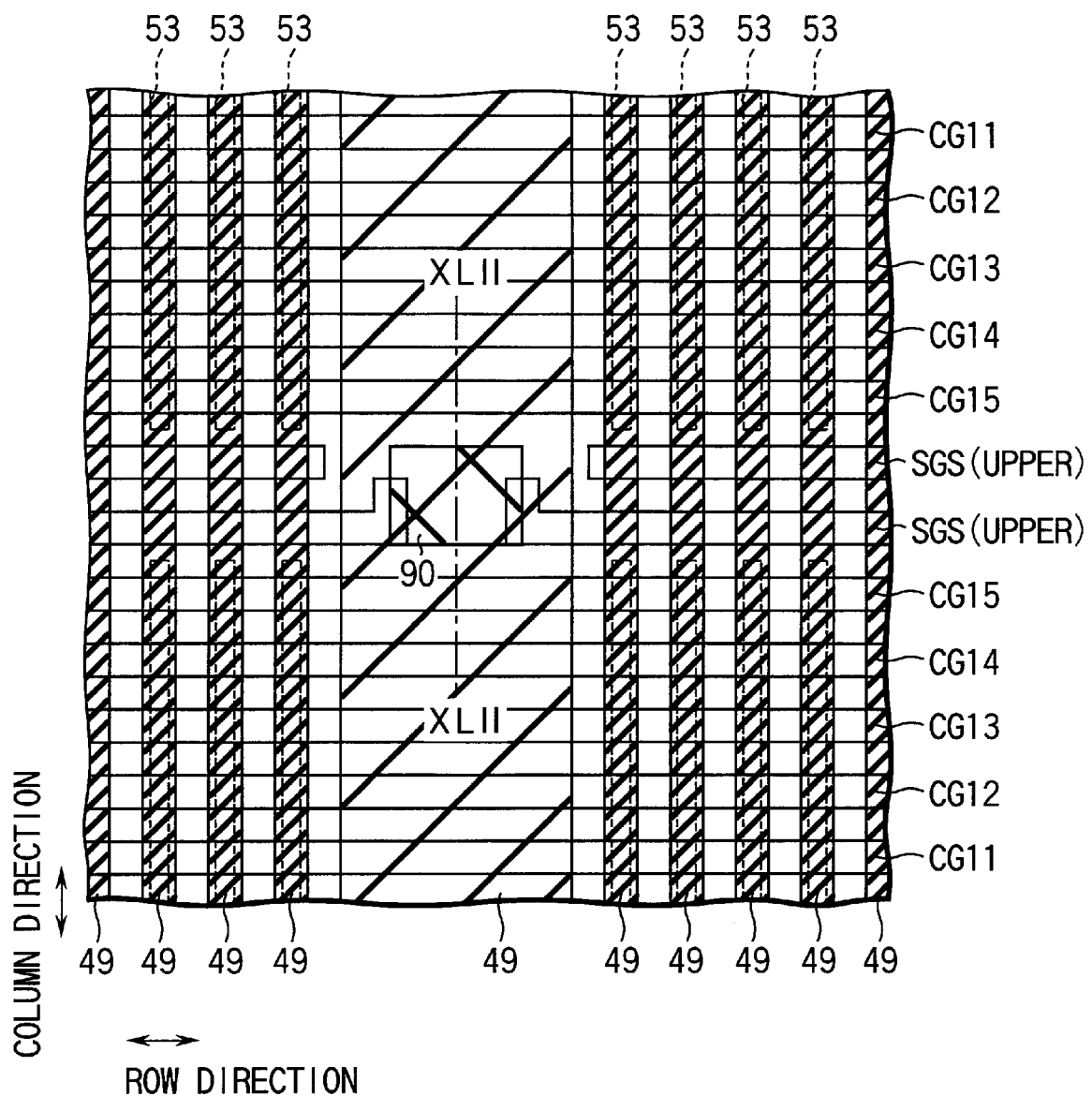
FIG. 39 is a sectional view showing one step of the first example of the manufacturing method of the present invention.
Figure 40:
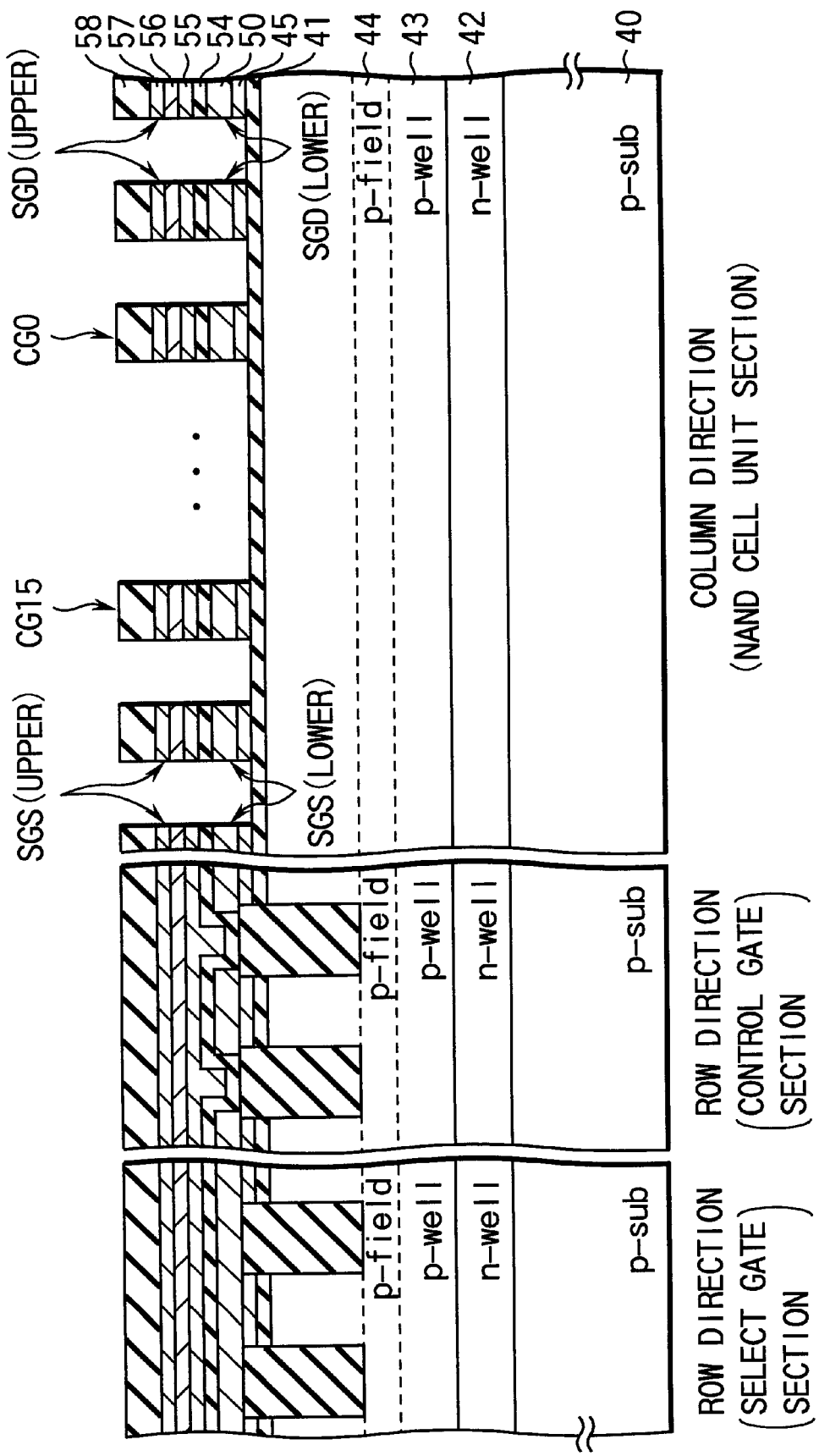
FIG. 40 is a sectional view showing one step of the first example of the manufacturing method of the present invention.
Figure 41:
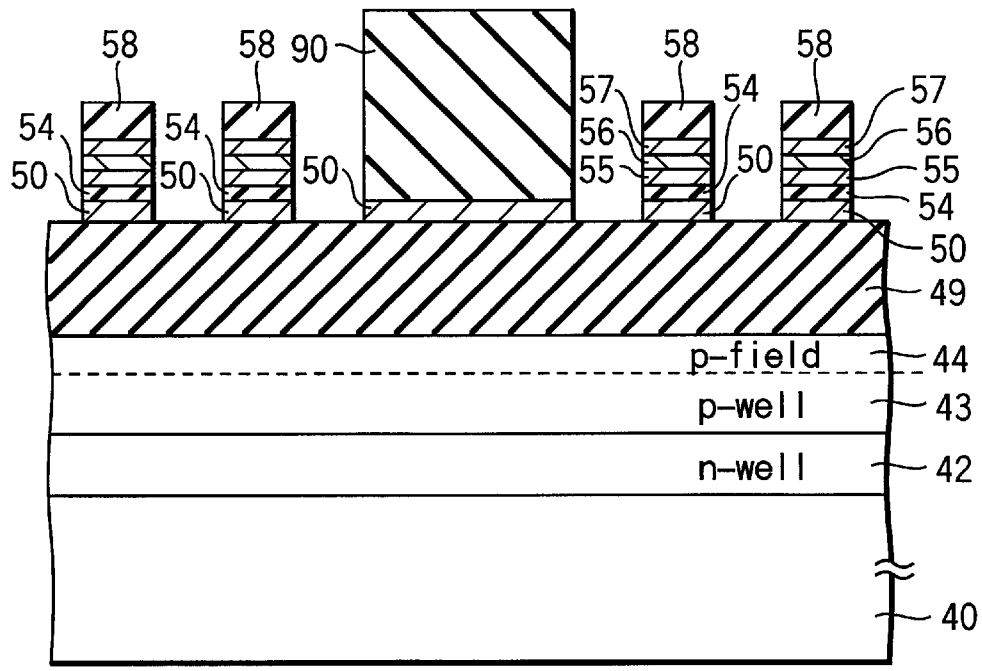
FIG. 41 is a sectional view taken along a line XLI—XLI in FIG. 38.
Figure 42:
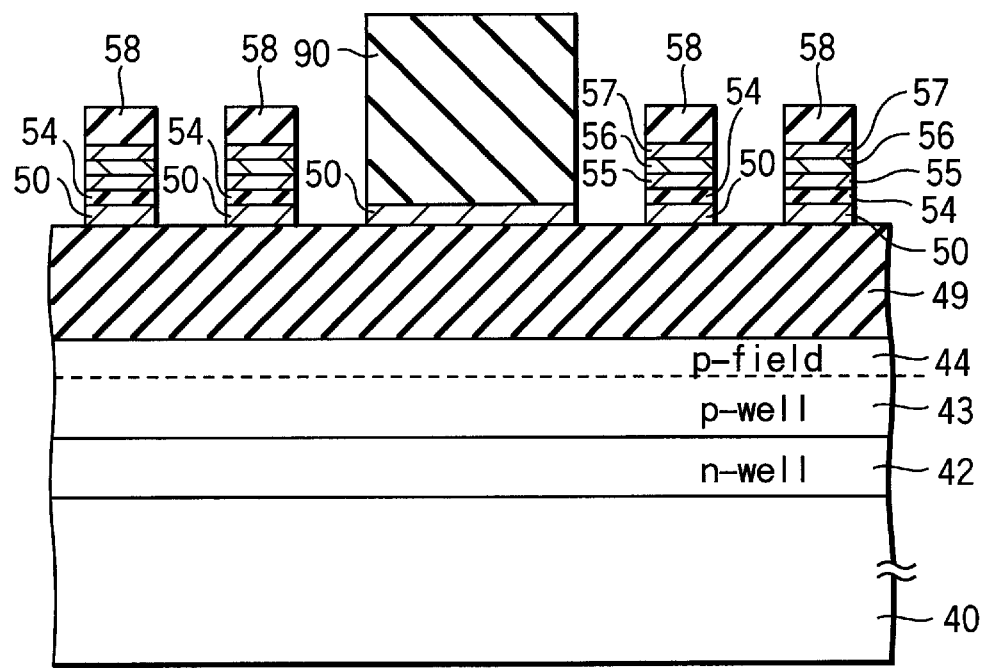
FIG. 42 is a sectional view taken along a line XLII—XLII in FIG. 39.

As shown in FIGS. 35 to 37, using the patterned silicon nitride film 58 as a mask, the tungsten silicide film 57 and polysilicon films 56 and 55 are etched in turn by RIE. In this manner, control gate electrodes CG0 to CG15, and select gate electrodes SGS (upper) and SGD (upper), which run in the row direction, are completed.

Note that each of the select gate electrodes SGS (upper) and SGD (upper) is formed in a pattern from which a portion where a contact region is formed is removed, and which is bent 90° in the column direction at that portion. Also, the portion where the contact region is formed is removed from the neighboring select gate electrodes SGS (upper) and SGD (upper).

Furthermore, the widths and spacings of the control gate electrodes CG0 to CG15 are respectively set at, e.g., 0.2 μm.

As shown in FIGS. 38 to 42, a resist pattern 90 is formed by PEP on a portion where a contact region is formed. Using the resist pattern 90 and silicon nitride film 58 as a mask, the insulating film 54, and polysilicon films 50 and 45 are etched in turn by RIE. In this manner, floating gate electrodes FG, and select gate electrodes SGS (lower) and SGD (lower) (gate and contact regions), which run in the row direction, are completed. After that, the resist pattern 90 is removed.

Figure 43:
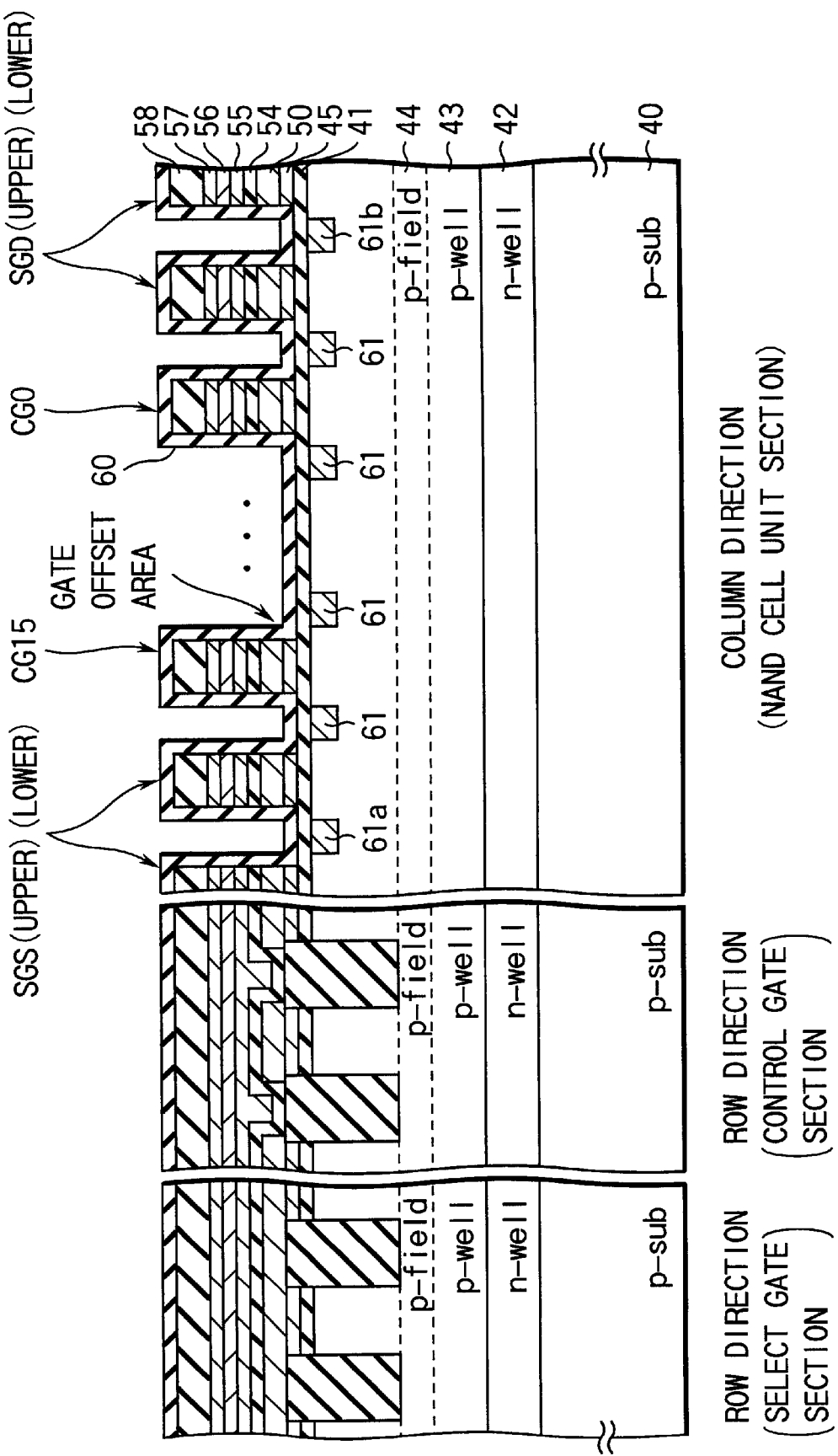
FIG. 43 is a sectional view showing one step of the first example of the manufacturing method of the present invention.

As shown in FIG. 43, using the silicon nitride film 58 (control gate electrodes and select gate electrodes) as a mask, an n-impurity (e.g., phosphorus) is ion-implanted into the p-well region 43 by self alignment, thus forming n-diffusion layers 61, 61a, and 61b. Note that the diffusion layer 61a serves as the source of the NAND cell unit, and the diffusion layer 61b serves as the drain of the NAND cell unit.

Note that the n-diffusion layers 61, 61a, and 61b are formed by ion implantation for narrow spaces (e.g., 0.2 μm) between neighboring control gate electrodes CG0 to CG15, and the select gate electrodes SGS and SGD. For this reason, the concentration of the n-impurity implanted by ion implantation is lower at the gate edge than at the center of the space.

On the other hand, the positions of the n-diffusion layers 61, 61a, and 61b are determined by the concentrations of the impurities in the surface portion of the silicon substrate 40, i.e., that of the p-impurity implanted by so-called channel implantation, and that of the n-impurity implanted by ion implantation for forming the n-diffusion layers (source/drain). That is, since the n-impurity implanted by ion implantation for forming the n-diffusion layers has a low concentration at the gate edge, it is canceled by the p-impurity which is present in advance and, hence, the n-diffusion layers 61, 61a, and 61b are not formed at gate edges.

In the present invention, it is important to form the gate offset area at the gate edge by adjusting conditions such as the dose of n-impurity upon ion implantation for forming the n-diffusion layers, and the like.

A 60-nm thick silicon nitride film 60 is formed on the side walls of the control gate electrodes CG0 to CG15, select gate electrodes SGS and SGD, and floating gate electrodes FG using, e.g., CVD. The silicon nitride film 60 is used as a mask. Therefore, ion implantation for forming the source/drain may be done after formation of the film 60.

Figure 44:
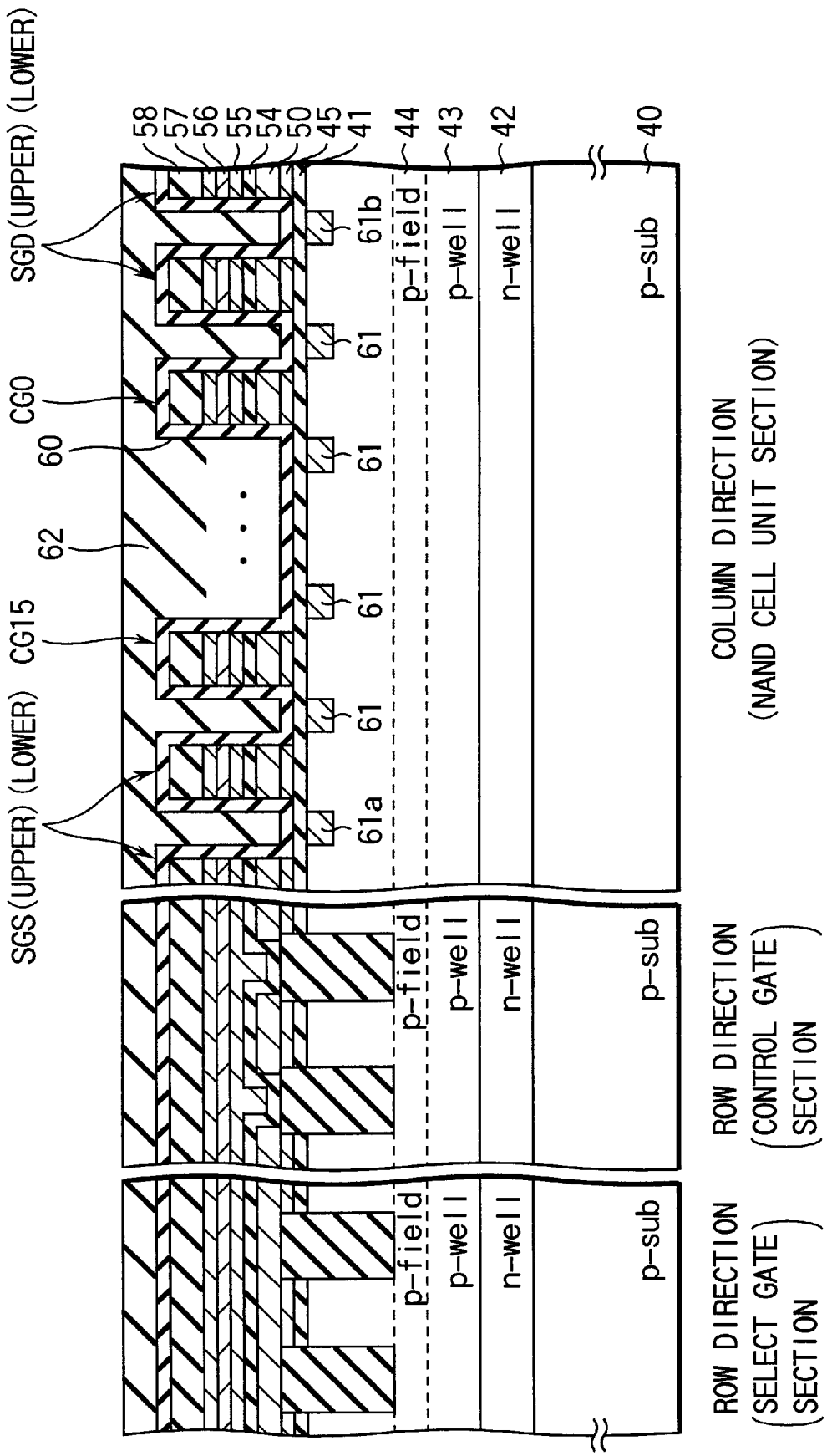
FIG. 44 is a sectional view showing one step of the first example of the manufacturing method of the present invention.
Figure 45:
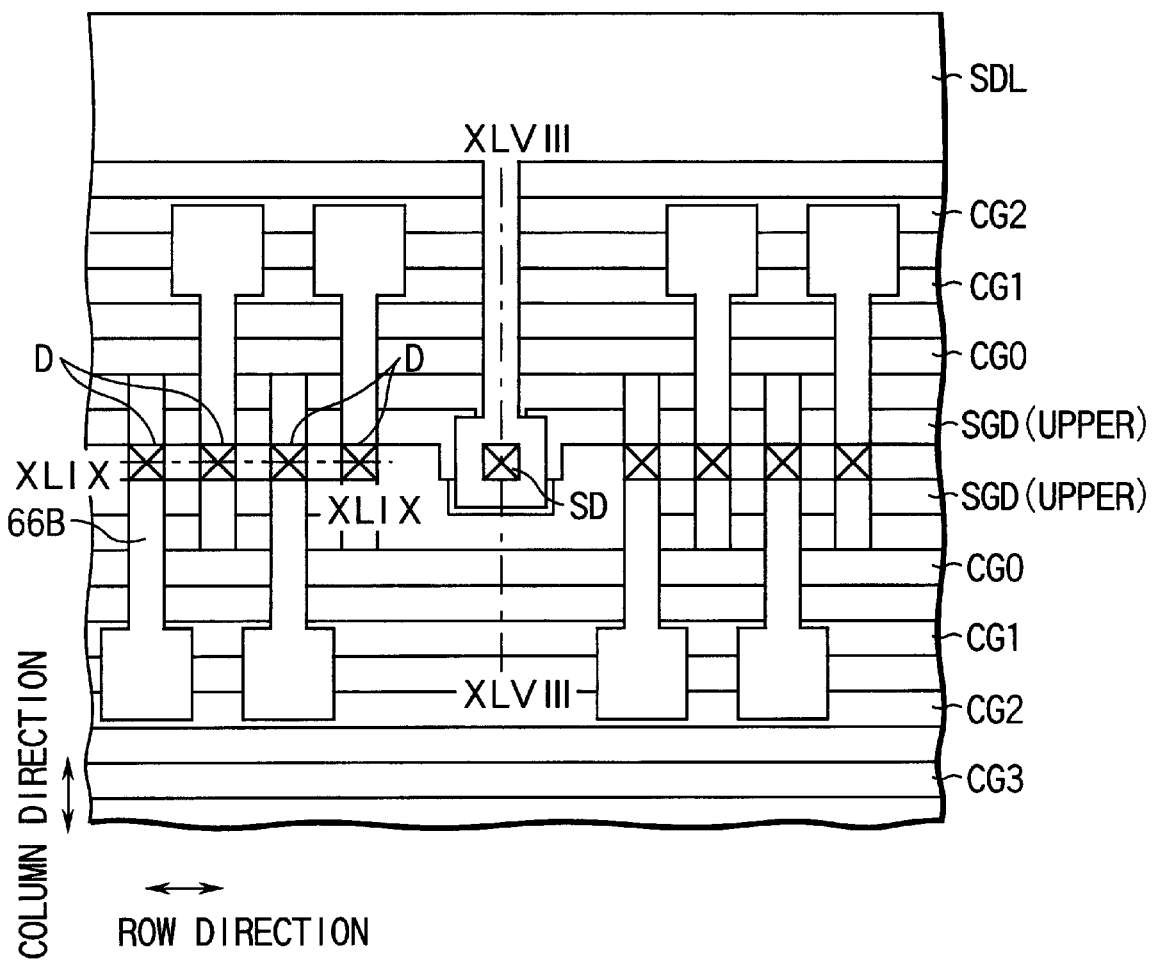
FIG. 45 is a plan view showing one step of the first example of the manufacturing method of the present invention.
Figure 46:
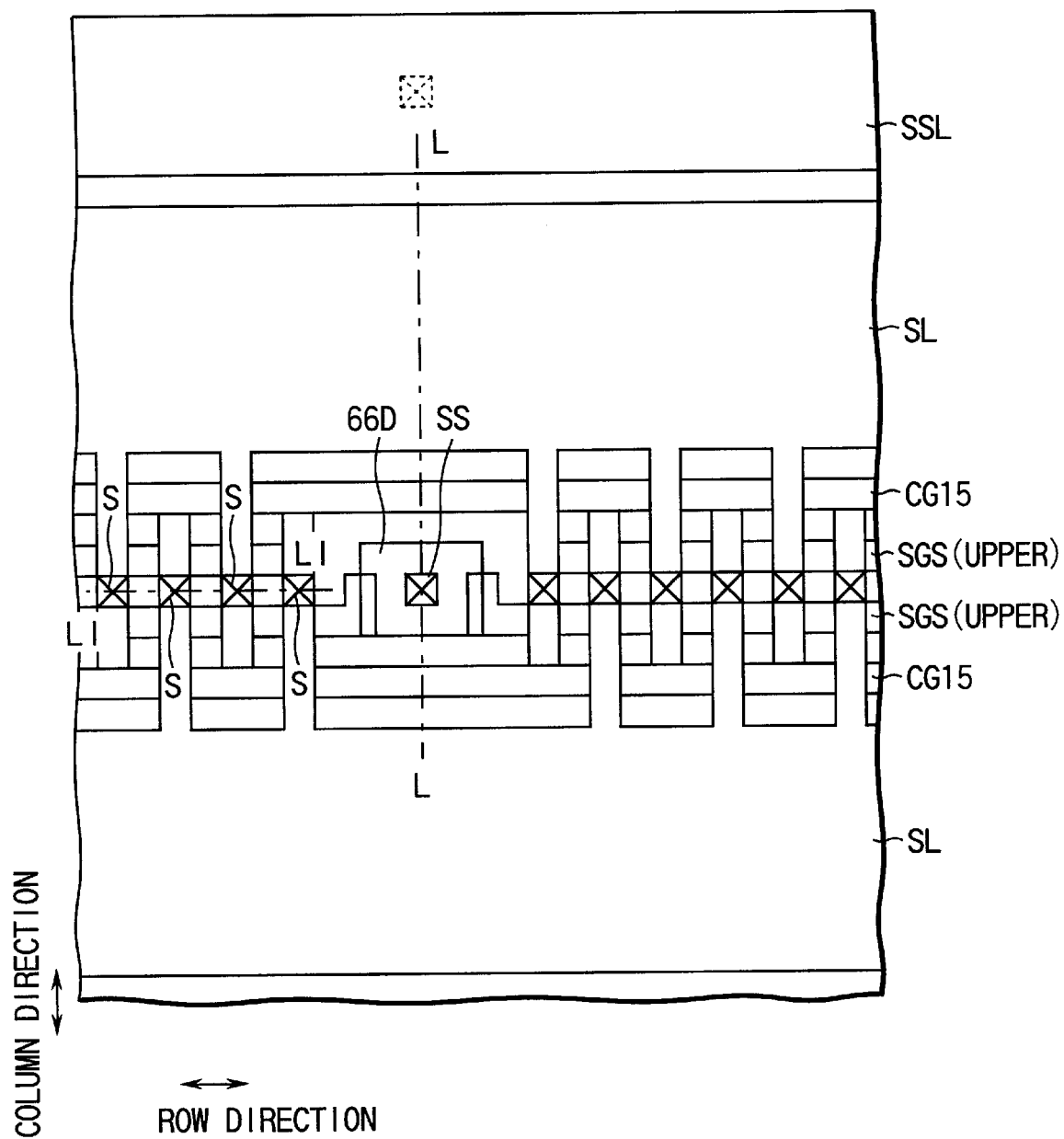
FIG. 46 is a plan view showing one step of the first example of the manufacturing method of the present invention.
Figure 47:
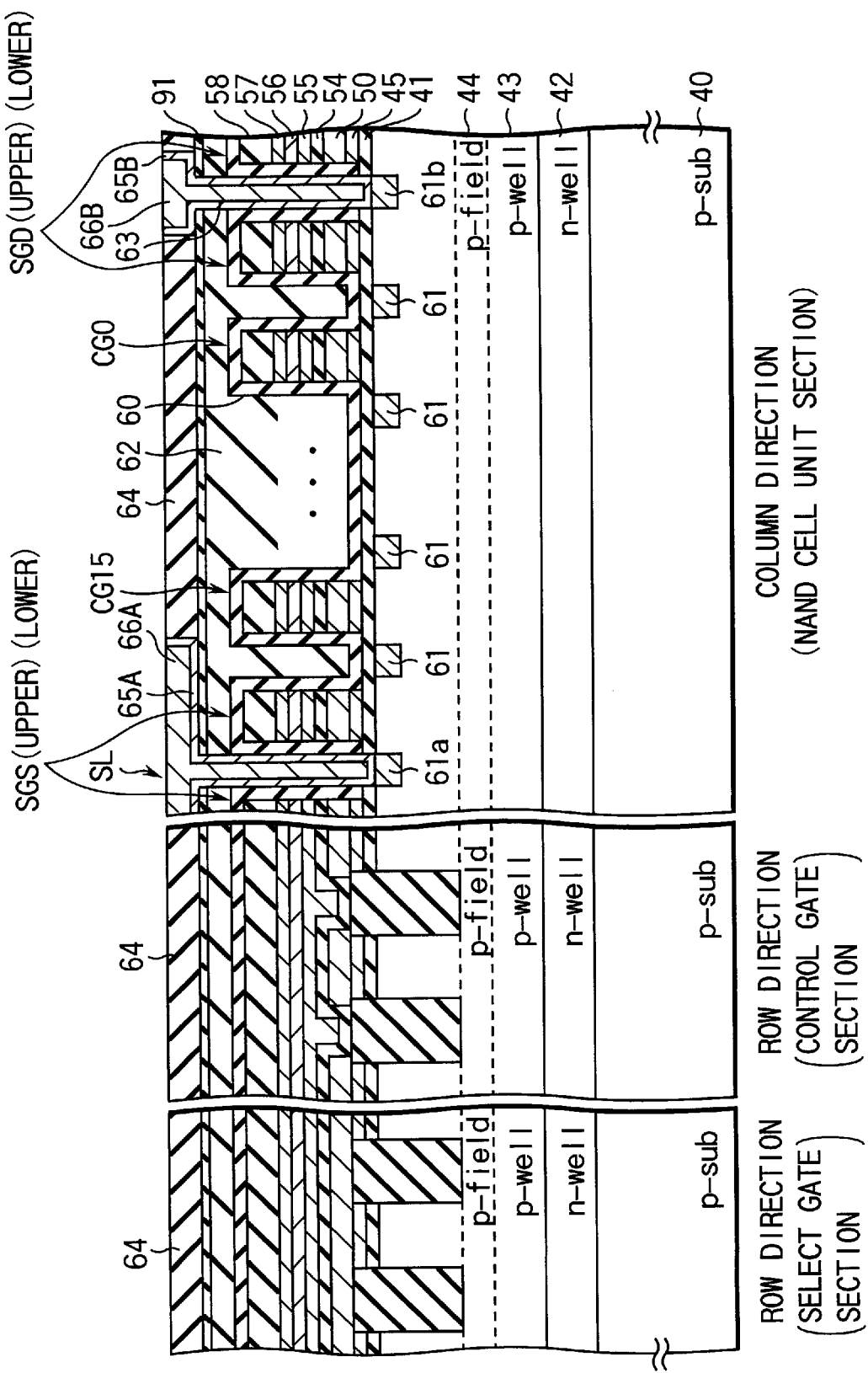
FIG. 47 is a sectional view showing one step of the first example of the manufacturing method of the present invention.
Figure 48:
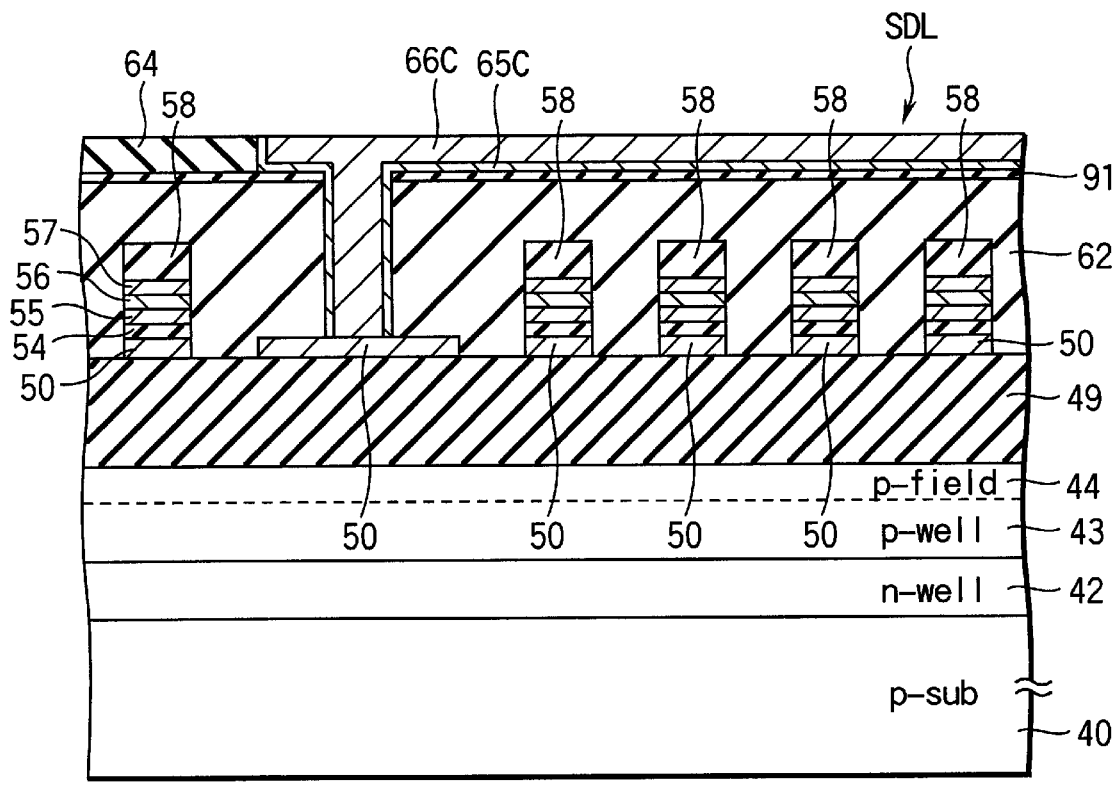
FIG. 48 is a sectional view taken along a line XLVIII—XLVIII in FIG. 45.
Figure 49:
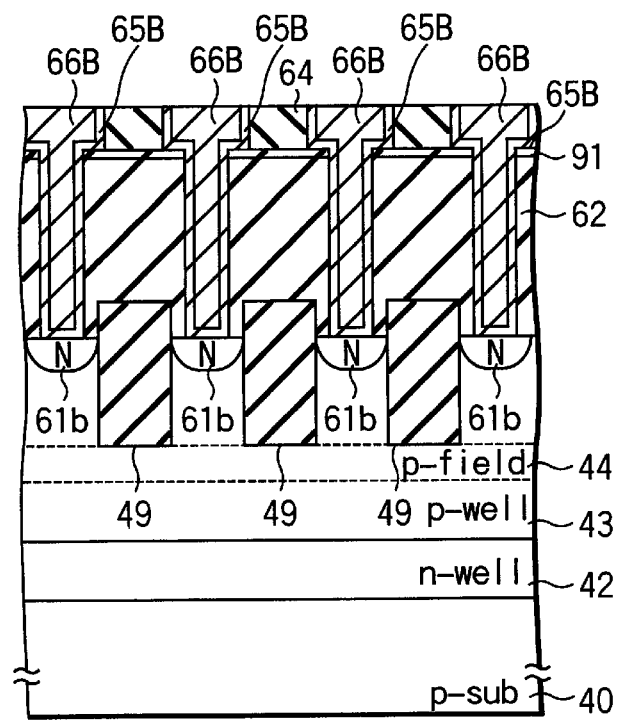
FIG. 49 is a sectional view taken along a line XLIX—XLIX in FIG. 45.
Figure 50:
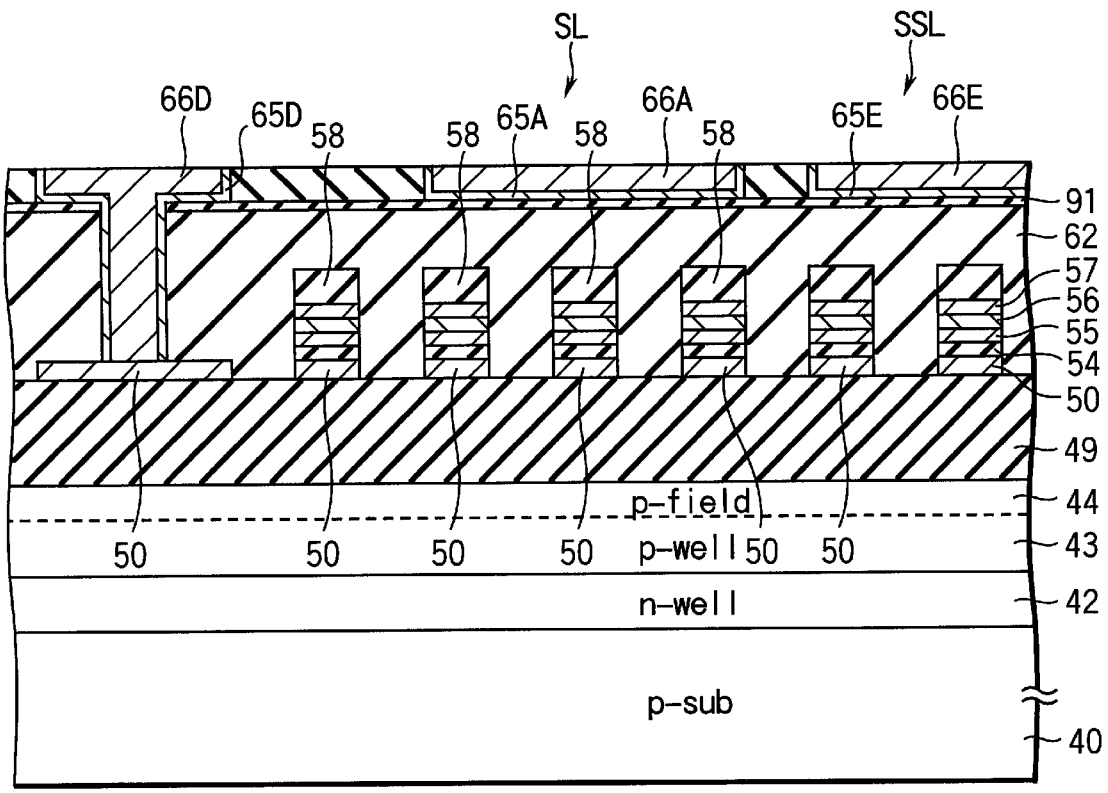
FIG. 50 is a sectional view taken along a line L—L in FIG. 46.
Figure 51:
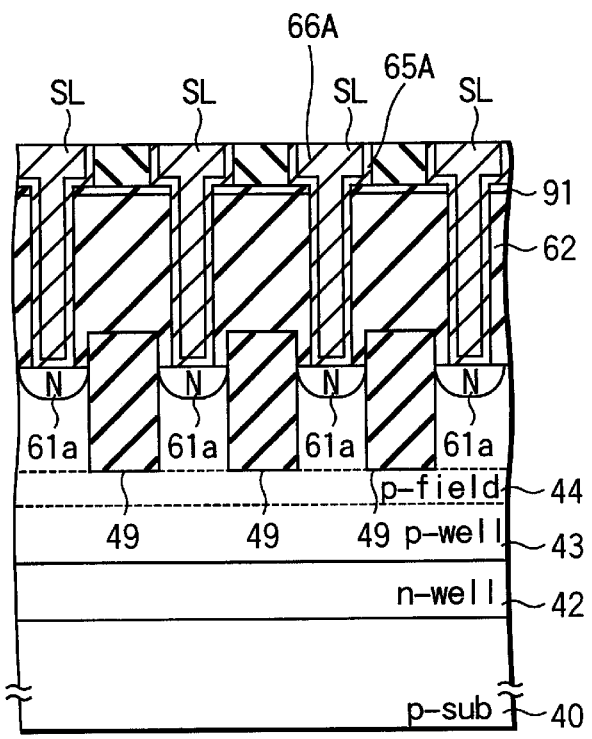
FIG. 51 is a sectional view taken along a line LI—LI in FIG. 46.

As shown in FIG. 44, a 1.45-μm thick BPSG film 62 is formed on the silicon nitride film 60. The BPSG film 62 is polished approximately 0.4 μm by CMP to planarize the surface of the BPSG film 62.

As shown in FIGS. 45 to 51, a silicon nitride film 91 serving as an etching stopper is formed on the BPSG film 62. Subsequently, a TEOS film 64 is formed on the silicon nitride film 91.

A resist pattern is formed by PEP. Using this resist pattern as a mask, the TEOS film 64 is etched by RIE to form interconnect grooves in the TEOS film 64. At this time, the silicon nitride film 91 serves as an etching stopper in RIE. After that, the resist pattern is removed.

A resist pattern is formed again by PEP. Using this resist pattern as a mask, contact holes S and D that reach the diffusion layer (source) 61a and the diffusion layer (drain) 61b are formed in the BPSG film 62, silicon nitride film 60, and silicon oxide film 41 by RIE. At the same time, contact holes SS and SD that reach the contact regions of the first layers of the select gate electrodes SGS (lower) and SGD (lower) are formed by that RIE. After that, the resist pattern is removed.

Barrier metal layers 65A to 65E each consisting of a titanium/titanium nitride multilayer are formed on the inner surfaces of the interconnect grooves and contact holes. Also, tungsten films 66A to 66E that completely fill the interconnect grooves and contact holes are formed on the TEOS film 64. These tungsten films 66A to 66E are polished by CMP to remain in only the interconnect grooves and contact holes, thus forming a source line SL connected to the sources of each NAND cell unit, interconnects 65B and 66B connected to the drains of each NAND cell unit, an interconnect SDL connected to the select gate electrode SGD (lower) on the drain side, and other interconnects 65D, 66D, and SSL.

Figure 52:
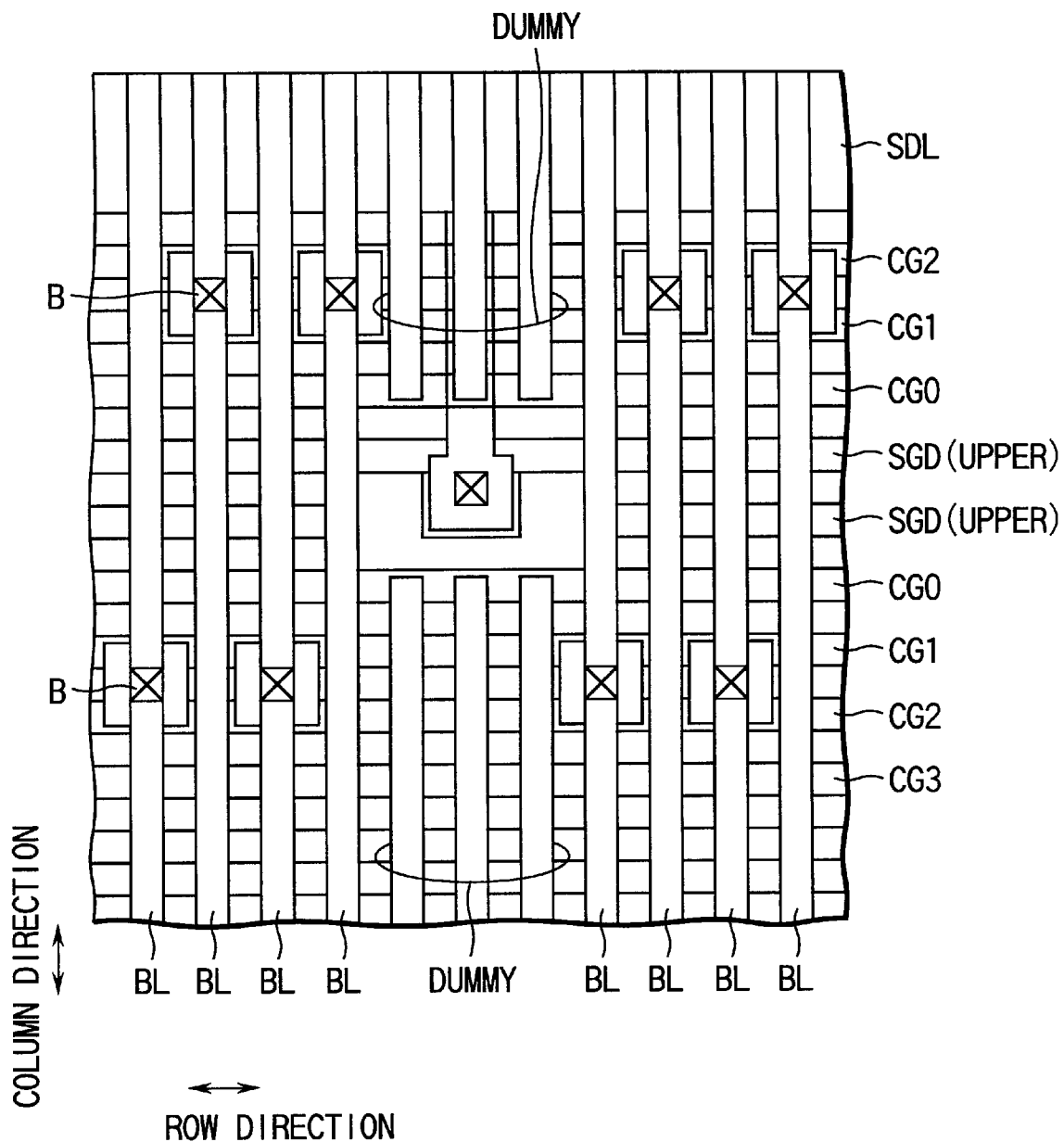
FIG. 52 is a plan view showing one step of the first example of the manufacturing method of the present invention.
Figure 53:
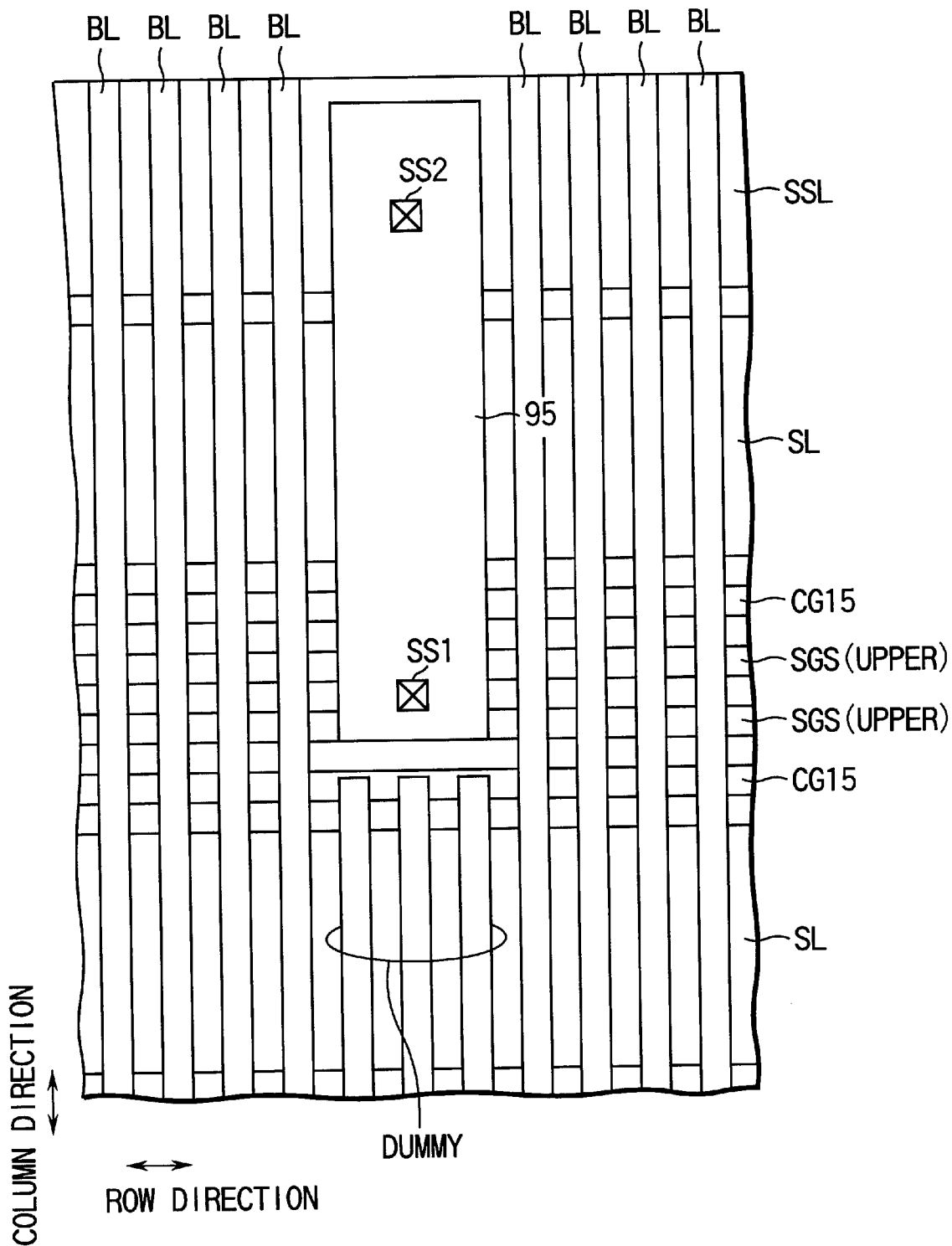
FIG. 53 is a plan view showing one step of the first example of the manufacturing method of the present invention.
Figure 54:
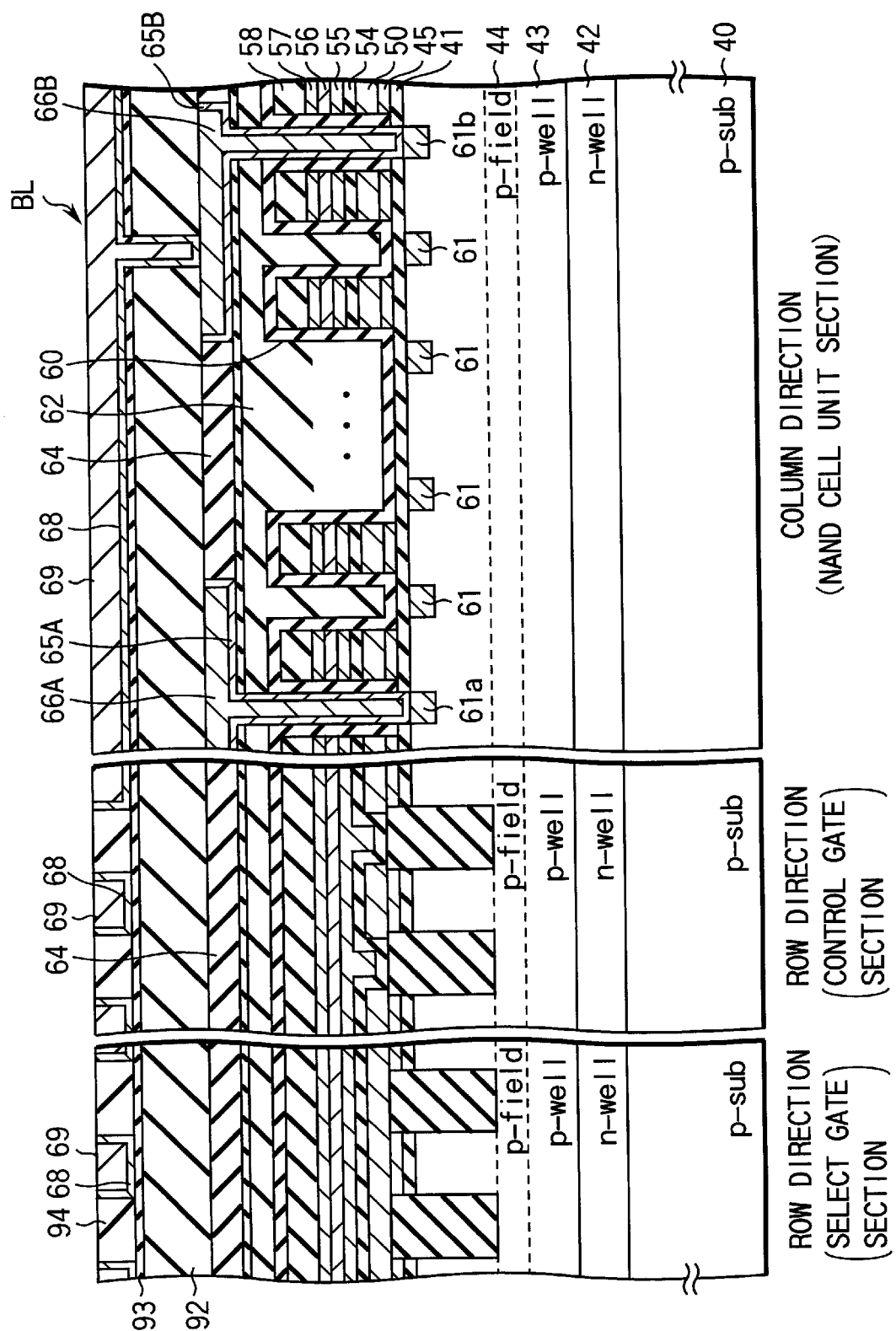
FIG. 54 is a sectional view showing one step of the first example of the manufacturing method of the present invention.

As shown in FIGS. 52 to 54, a TEOS film 92 is formed on the TEOS film 64. A silicon nitride film 93 serving as an etching stopper is formed on the TEOS film 92. Subsequently, a TEOS film 94 is formed on the silicon nitride film 93.

Also, a resist pattern is formed by PEP. Using this resist pattern as a mask, the TEOS film 94 is etched by RIE to form interconnect grooves for bit lines and dummy bit lines. At this time, the silicon nitride film 93 serves as an etching stopper in RIE. After that, the resist pattern is removed.

A resist pattern is formed again by PEP. Using this resist pattern as a mask, contact holes B that reach the interconnects 65B and 66B, and other contact holes SS1 and SS2 are formed in the silicon nitride film 93 and TEOS film 92 by RIE. After that, the resist pattern is removed.

Barrier metal layers 68 each consisting of a titanium/titanium nitride multilayer are then formed on the inner surfaces of the interconnect grooves and contact holes. Also, a metal film (e.g., an aluminum film) 69 that completely fills the interconnect grooves and contact holes is formed on the TEOS film 94. The metal film 69 is polished by CMP to leave it only in the interconnect grooves and contact holes, thus forming an interconnect for connecting a plurality of bit lines BL and the select gate electrode SGS (lower) on the source side to the interconnect SSL.

Note that a passivation film consisting of a silicon nitride film is formed on these interconnects.

With the aforementioned manufacturing processes, a NAND flash EEPROM having the memory cells and select gate transistors of the present invention is completed.

The second example of a method of manufacturing a memory cell array of a NAND flash EEPROM having the memory cells and select gate transistors of the present invention will be explained below.

A characteristic feature of the manufacturing method of this example lies in that side wall insulating films (spacers) having a predetermined thickness are formed on the side walls of the memory cells and select gate transistors before ion implantation for forming the n-diffusion layers (source/drain), so as to reliably form the gate offset areas at the gate edges of the memory cells and select gate transistors.

The processes until the control gate electrodes CG0 to CG15, select gate electrodes SGS and SGD, and floating gate electrodes FG are formed on the silicon substrate 40 are executed following the same procedures as those in the manufacturing method of the first example described above (FIGS. 25 to 42).

Figure 55:
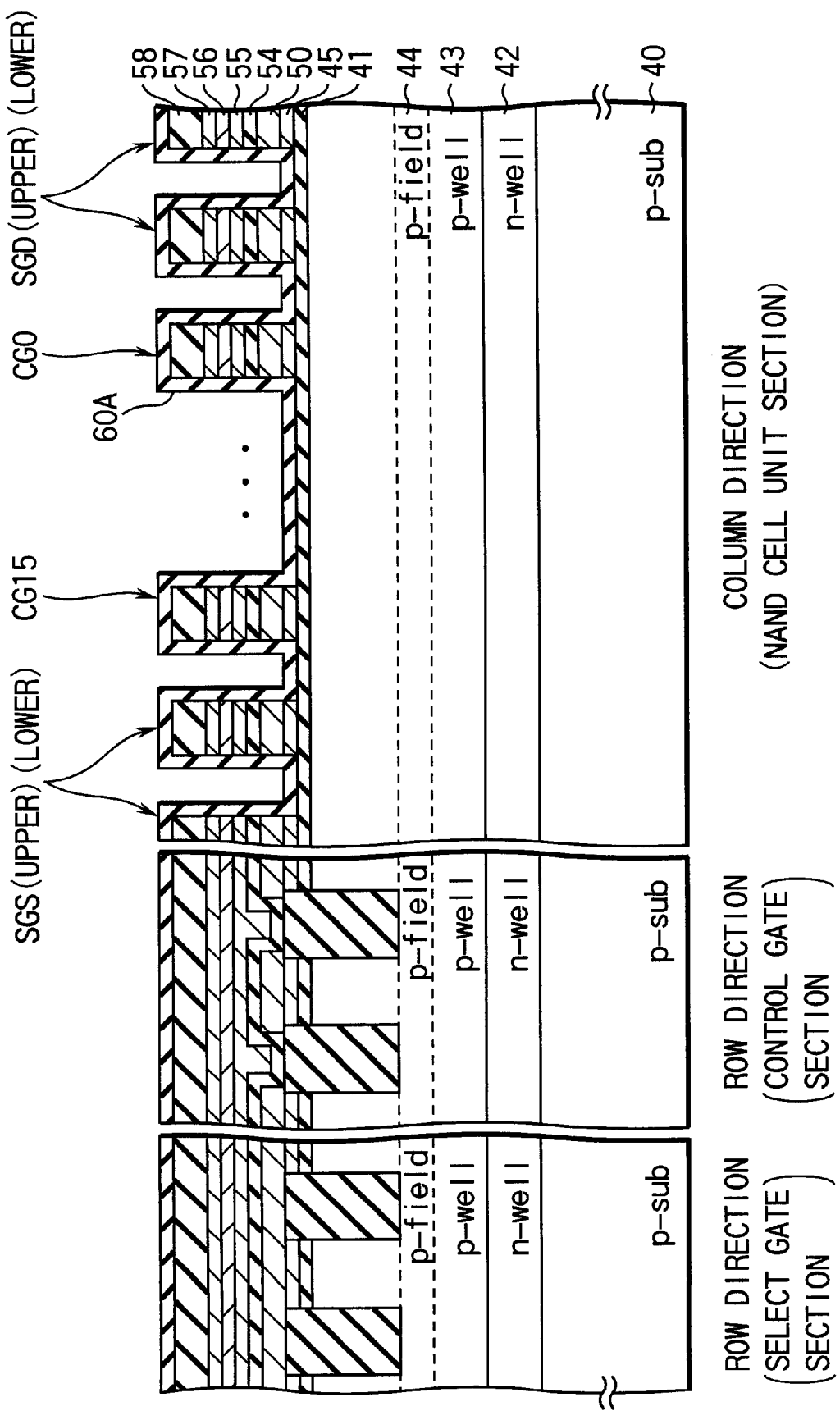
FIG. 55 is a sectional view showing one step of the second example of the manufacturing method of the present invention.

As shown in FIG. 55, a 40-nm thick silicon oxide film 60A that covers the control gate electrodes CG0 to CG15, select gate electrodes SGS and SGD, and floating gate electrodes FG is formed by, e.g., CVD. After that, when the silicon oxide film 60A is etched by RIE, the silicon oxide film 60A is left on the side walls of the control gate electrodes CG0 to CG15, select gate electrodes SGS and SGD, and floating gate electrodes FG.

Figure 56:
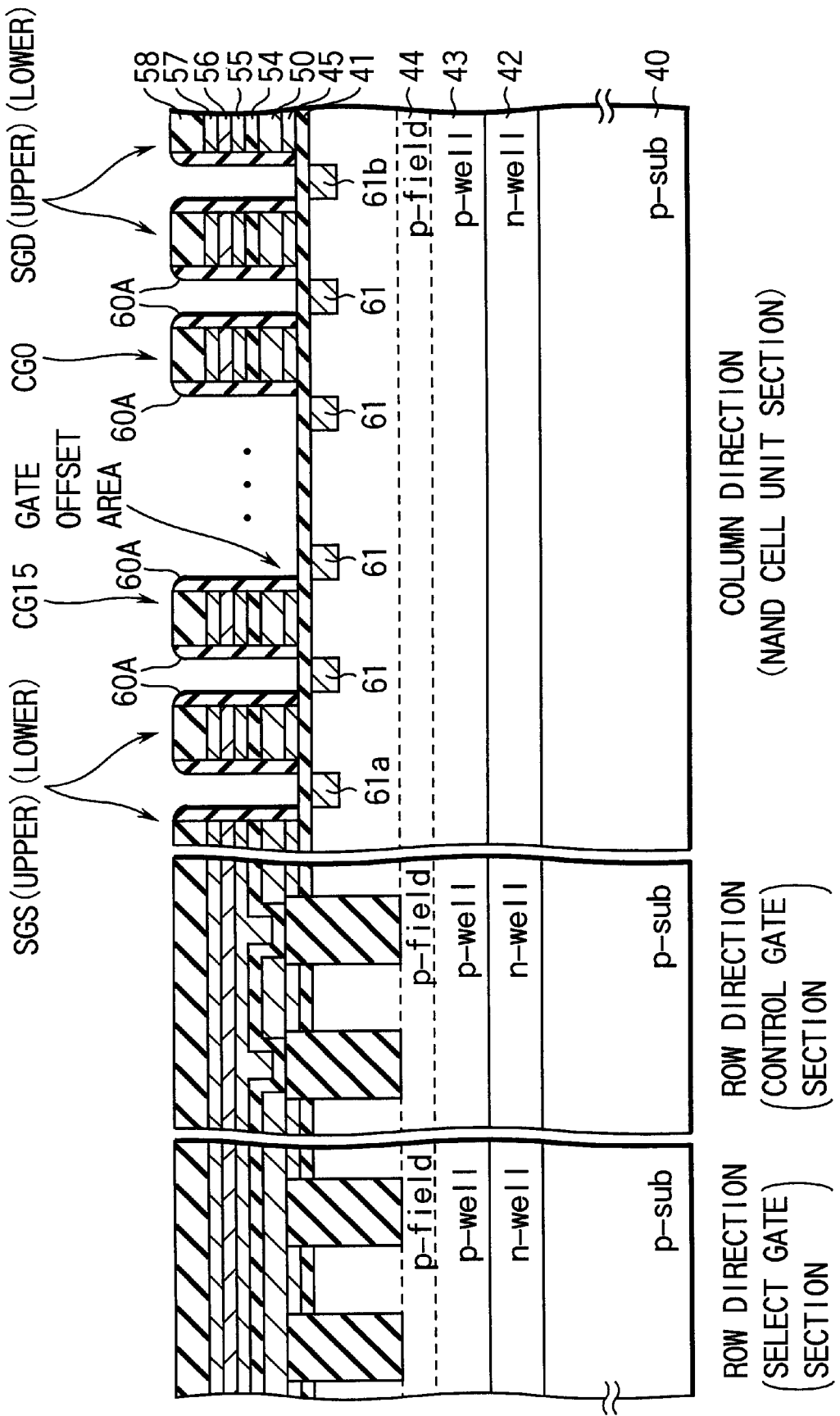
FIG. 56 is a sectional view showing one step of the second example of the manufacturing method of the present invention.

As shown in FIG. 56, an n-impurity (e.g., phosphorus) is ion-implanted into a p-well region 43 in self alignment using as a mask the silicon nitride film 58 (control gate electrodes and select gate electrodes) and the silicon oxide film 60A serving as side wall insulating films (spacers or side walls), thus forming n-diffusion layers 61, 61a, and 61b.

After that, a NAND flash EEPROM is completed following the same procedures as those in the manufacturing method of the first example mentioned above (FIGS. 44 to 54). Note that no silicon nitride film 60 is formed.

In this manner, by forming side wall insulating films (spacers or side walls) having a predetermined thickness on the side walls of the memory cells and select gate transistors before ion implantation for forming the n-diffusion layers (source/drain), the gate offset areas can be reliably formed at the gate edges of the memory cells and select gate transistors.

In this example, a silicon oxide film (TEOS) film is used as the side wall insulating films. Instead, a silicon nitride film may be used.

In this example, in order to prevent the tungsten silicide film that forms the control gate electrodes from being oxidized, a process for forming a silicon nitride film may be added. Also, the control gate electrodes may be formed of a polysilicon film alone.

The third example of a method of manufacturing a memory cell array of a NAND flash EEPROM having the memory cells and select gate transistors of the present invention will be explained below.

A characteristic feature of the manufacturing method of this example lies in that the gate offset areas are formed at the gate edges of the memory cells and select gate transistors using the oxidation process of the floating gate electrodes and control gate electrodes, which is done after ion implantation for forming the n-diffusion layers (source/drain).

In the NAND flash EEPROM, when the floating gate electrodes and control gate electrodes are respectively formed of a polysilicon film, the oxidation process for oxidizing the floating gate electrodes and control gate electrodes by thermal oxidation for the purpose of relaxing, e.g., local electric field concentration by rounding the edges of the floating gate electrodes is done.

In this oxidation process, a silicon oxide film is formed on the edges of the floating gate electrodes and control gate electrodes in a bird's beak pattern. Hence, by controlling the thickness of the silicon oxide film on the edges of the floating gate electrodes, so-called gate offset areas can be formed.

The processes until the control gate electrodes CG0 to CG15, select gate electrodes SGS and SGD, and floating gate electrodes FG are formed on the silicon substrate 40 are executed following the same procedures as those in the manufacturing method of the first example described above (FIGS. 25 to 42). In this example, assume that the floating gate electrodes and control gate electrodes are respectively formed of polysilicon films 70 and 71 alone (see FIGS. 57 and 58).

Figure 57:
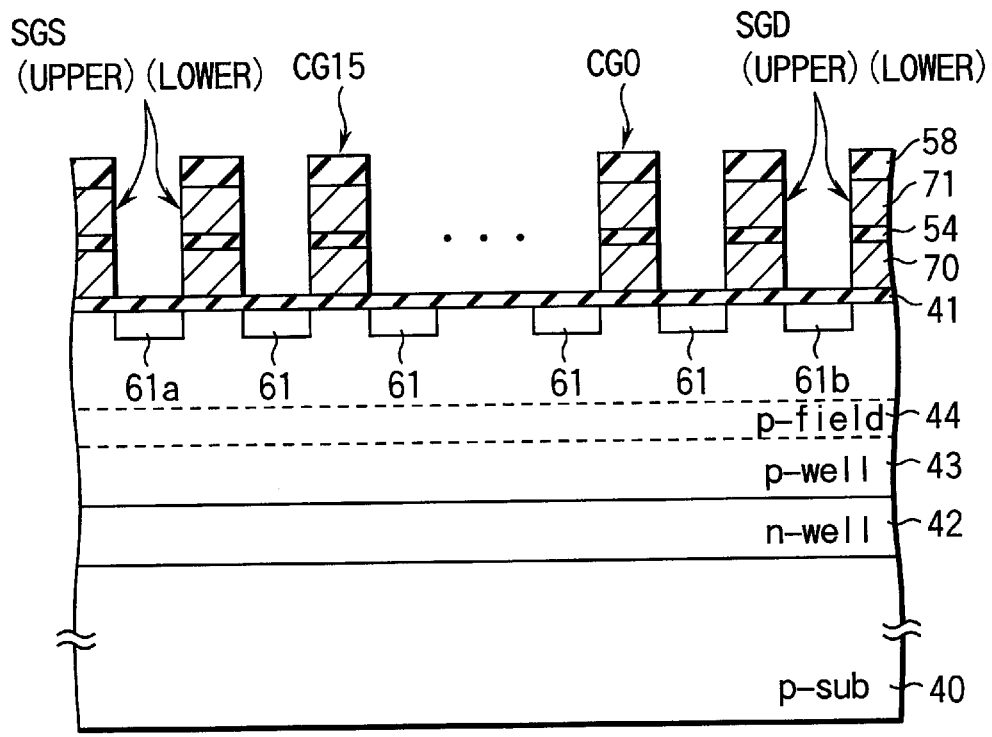
FIG. 57 is a sectional view showing one step of the third example of the manufacturing method of the present invention.

As shown in FIG. 57, an n-impurity (e.g., phosphorus) is ion-implanted into a p-well region 43 in self alignment using a silicon oxide film 58 (control gate electrodes and select gate electrodes) as a mask, thus forming n-diffusion layers 61, 61a, and 61b.

Figure 58:
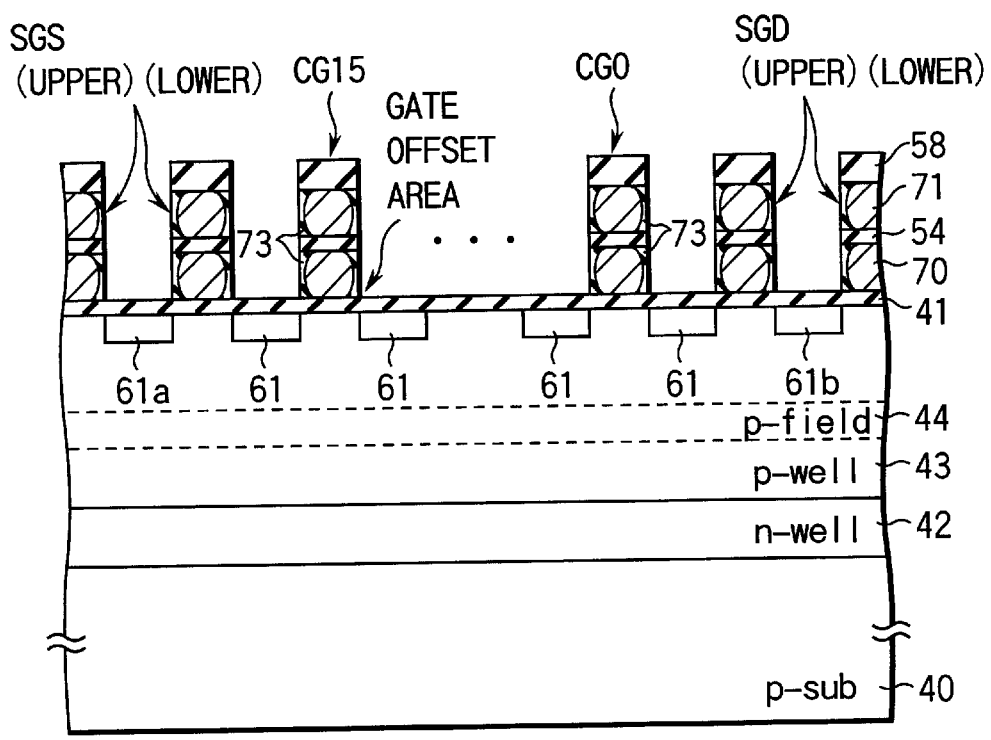
FIG. 58 is a sectional view showing one step of the third example of the manufacturing method of the present invention.

As shown in FIG. 58, floating gate electrodes (polysilicon films) 70 and control gate electrodes (polysilicon films) 71 are oxidized by thermal oxidation, thus forming 10-nm thick silicon oxide films 73. In this case, since the edges of the floating gate electrodes 70 and control gate electrodes 71 are oxidized in a bird's beak pattern, the silicon oxide films 73 have a largest thickness at the edges of the floating gate electrodes 70 and control gate electrodes 71.

Therefore, by controlling the thickness of the silicon oxide films 73 at the edges of the floating gate electrodes 70 on the substrate 40 side by adjusting the conditions in the oxidation process of the floating gate electrodes 70 and control gate electrodes 71, gate offset areas can be easily formed.

After that, a NAND flash EEPROM is completed following the same procedures as those in the manufacturing method of the first example mentioned above (FIGS. 44 to 54).

In this fashion, using the oxidation process of the floating gate electrodes and control gate electrodes, which is done after ion implantation for forming the n-diffusion layers (source/drain), the gate offset areas can also be formed at the gate edges of the memory cells and select gate transistors.

The fourth example of a method of manufacturing a memory cell array of a NAND flash EEPROM having the memory cells and select gate transistors of the present invention will be explained below.

A characteristic feature of the manufacturing method of this example lies in that gate offset areas are formed at the gate edges of the memory cells and select gate transistors by injecting a p-impurity into the silicon substrate by a predetermined amount in advance before ion implantation for forming the n-diffusion layers (source/drain).

The processes until the control gate electrodes CG0 to CG15, select gate electrodes SGS and SGD, and floating gate electrodes FG are formed on the silicon substrate 40 are executed following the same procedures as those in the manufacturing method of the first example described above (FIGS. 25 to 42).

Figure 59:
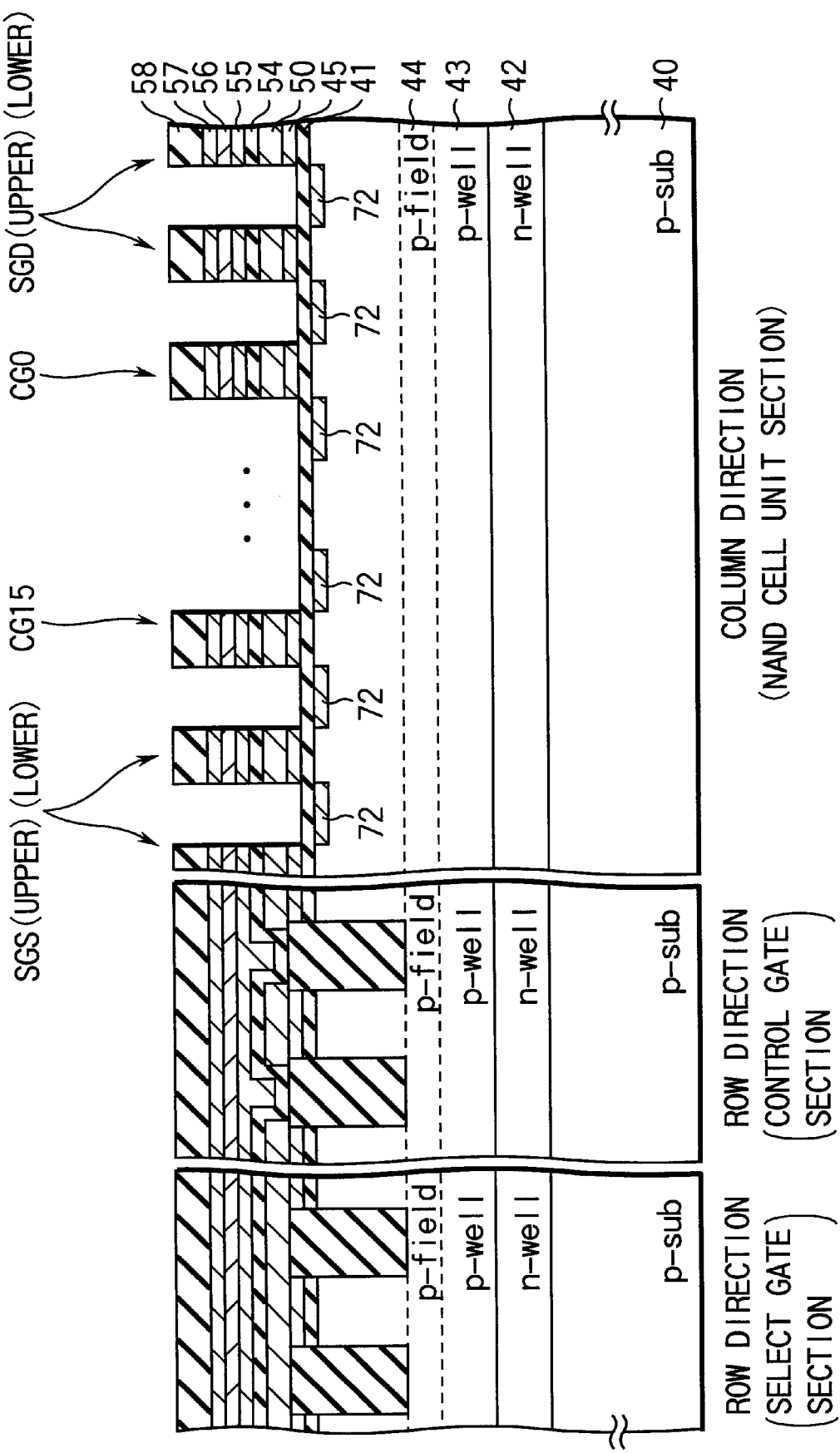
FIG. 59 is a sectional view showing one step of the fourth example of the manufacturing method of the present invention.

As shown in FIG. 59, a p-impurity (e.g., boron) is ion-implanted by a predetermined amount, e.g., at a dose of $2\times10^{13}$ cm$^{-2}$ in self alignment using a silicon nitride film 58 (control gate electrodes and select gate electrodes) as a mask.

Figure 60:
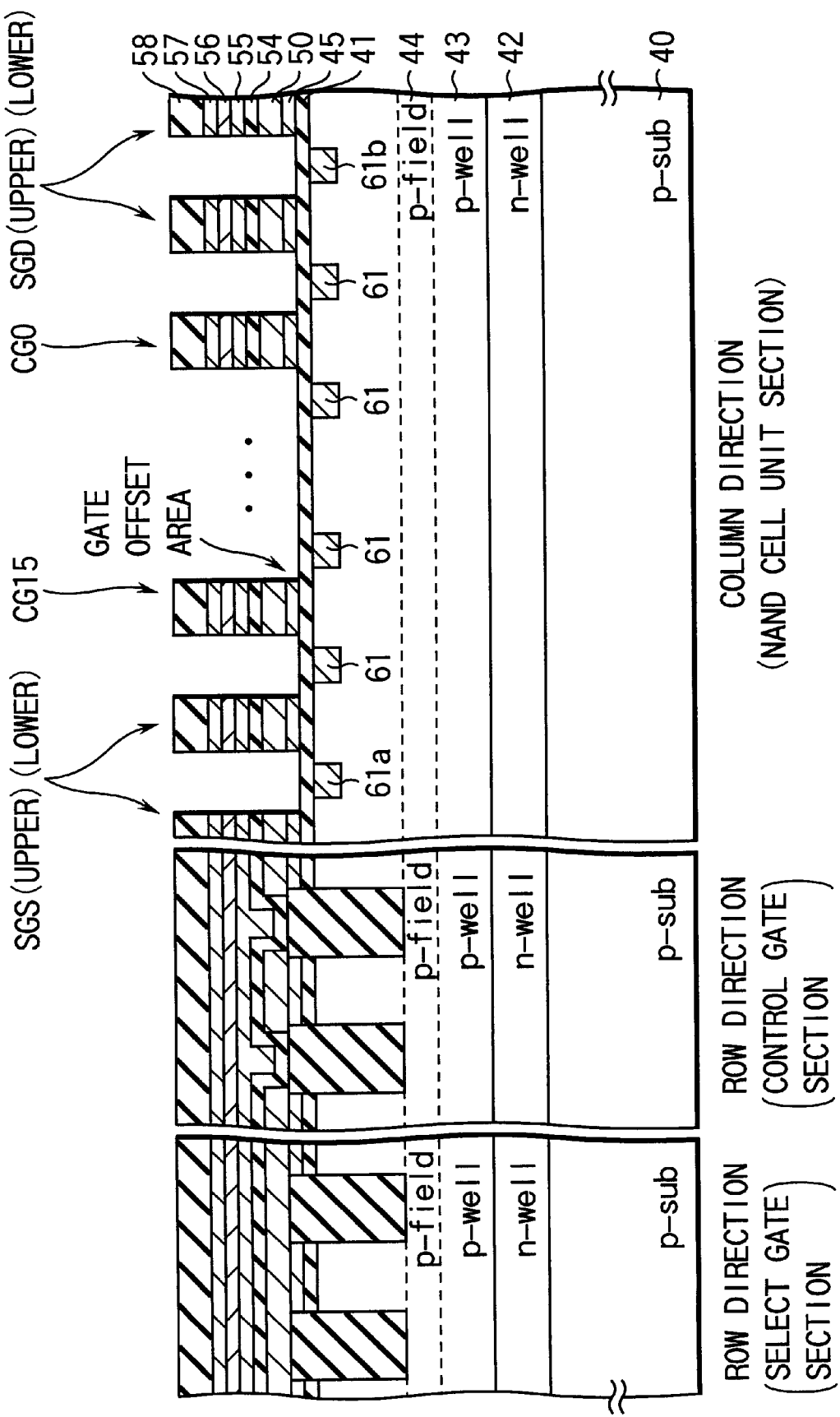
FIG. 60 is a sectional view showing one step of the fourth example of the manufacturing method of the present invention.

As shown in FIG. 60, an n-impurity (e.g., phosphorus) is then ion-implanted into a p-well region 43 in self alignment using the silicon nitride film 58 (control gate electrodes and select gate electrodes) as a mask. When the thermal diffusion process of the impurities in the silicon substrate 40 is then made, the p-impurity injected in advance into the source/ drain portions diffuses to the channels of the memory cells and select gate transistors. As a consequence, the threshold value of the gate edges of the memory cells and select gate transistors increases, and essentially gate offset areas are formed between the n-diffusion layers 61, 61a, and 61b and gate edges.

After that, a NAND flash EEPROM is completed following the same procedures as those in the manufacturing method of the first example mentioned above (FIGS. 44 to 54).

In the manufacturing method of this example, the gate offset areas may or may not be formed in the memory cells and select gate transistors depending on the ion implantation conditions, the conditions of the thermal diffusion process, and the like. That is, in this example, the ion implantation conditions, the conditions of the thermal diffusion process, and the like must be controlled to optimal values to form the gate offset areas.

When the gate offset areas are formed by the manufacturing method of this example, a high-performance NAND flash EEPROM which is free from any program errors even for miniaturization and an increase in the number of bits required for the multi-level configuration, can be provided. Since each gate offset area has a low resistance, a large read current can be obtained, thus achieving high-speed read operation.

The fifth example of a method of manufacturing a memory cell array of a NAND flash EEPROM having the memory cells and select gate transistors of the present invention will be explained below.

In this example, the aforementioned second and fourth examples of the manufacturing method are combined.

That is, as described in the manufacturing method of the fourth example, an ion having a conductivity type (p type) opposite to that of the source/drain, e.g., boron (B) is ion-implanted into the source/drain portions at a dose of $2 \times 10^{13}$ cm$^{-2}$. After that, side wall insulating films (spaces or side walls) are formed, as described in the manufacturing method of the second example. Using the control gate electrodes and side wall insulating films as a mask, an n-impurity (e.g., phosphorus) is ion-implanted into the p-well region in self alignment at, e.g., an acceleration voltage of 15 KeV and a dose of $2 \times 10^{13}$ cm$^{-2}$, thus forming n-diffusion layers (source/drain).

After that, a NAND flash EEPROM is completed following the same procedures as those in the manufacturing method of the first example mentioned above (FIGS. 44 to 54).

With such manufacturing method as well, the gate offset areas can be easily formed. Therefore, even when miniaturization evolves and the number of bits required for the multi-level configuration increases, parasitic transistors of the gate offset areas can be easily turned off by small Vpass upon programming. For this reason, any program errors in a memory cell to which Vpass is applied can be prevented. On the other hand, the channel of a memory cell which is connected to the selected word line and does not undergo "0"-programming can be sufficiently boosted by Vpp. Hence, any program errors in a memory cell which is applied with Vpp and does not undergo "0"-programming can also be prevented.

The sixth example of a method of manufacturing a memory cell array of a NAND flash EEPROM having the memory cells and select gate transistors of the present invention will be explained below.

A characteristic feature of the manufacturing method of this example lies in that etching is done under a condition that the side wall of each floating gate electrode has an inverted tapered shape (or overhang shape) upon forming the floating gate electrode, and ion implantation for the source/drain region is then done to form a gate offset area.

The processes until the tungsten silicide film 57, polysilicon films 56 and 55, and so-called interpoly insulating film (ONO film) 54 are etched in turn by RIE using the silicon nitride film 58 as a mask are executed following the same procedures as in the manufacturing method of the first example mentioned above (FIGS. 25 to 42).

Figure 61:
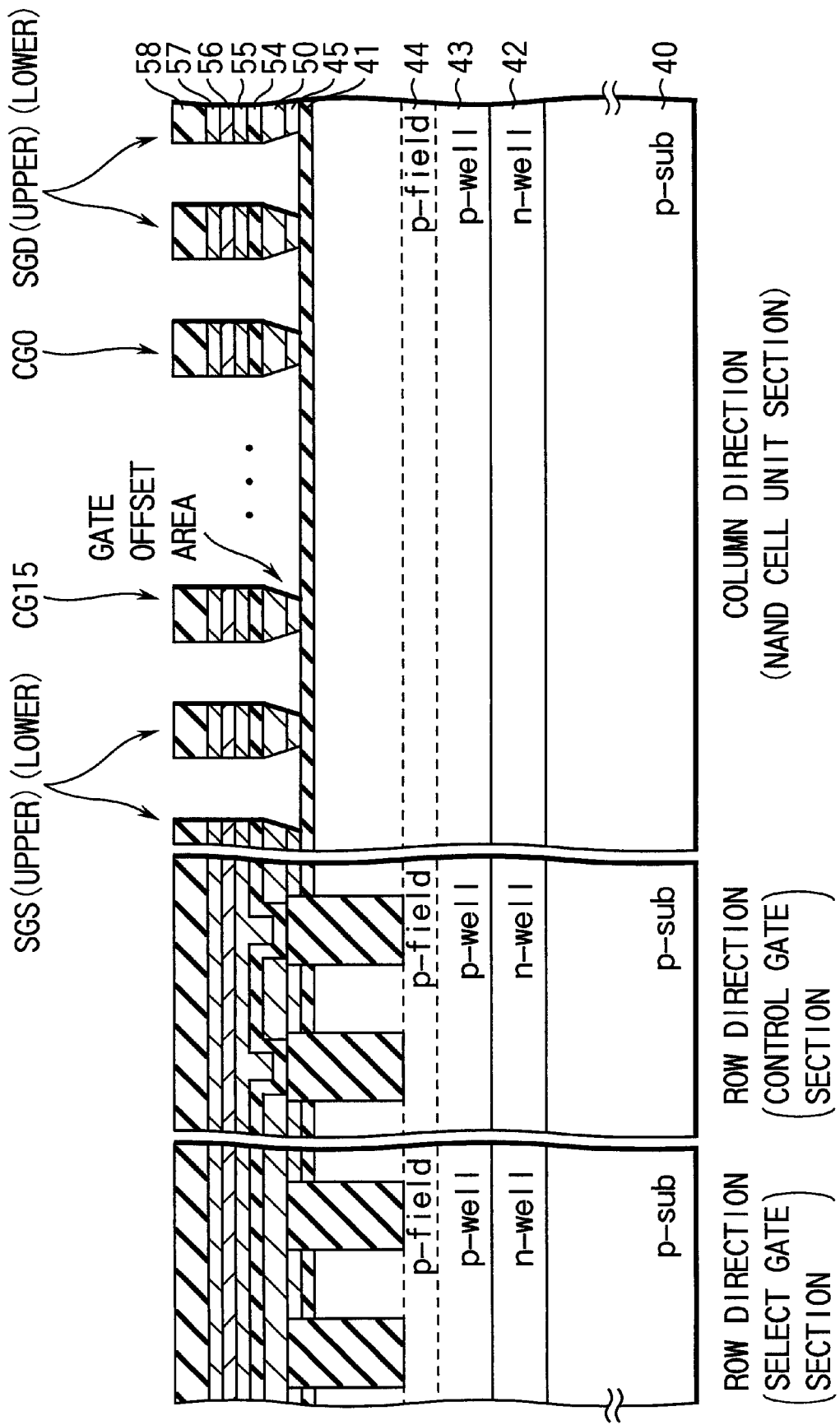
FIG. 61 is a sectional view showing one step of the sixth example of the manufacturing method of the present invention.

As shown in FIG. 61, the polysilicon films 50 and 45 are then etched by isotropic etching, e.g., wet etching. This etching is done under the condition in that the side walls of polysilicon films (floating gate electrodes) 50 and 45 have an inverted tapered shape (or overhang shape). As a result, the actual gate lengths of the memory cells and select gate transistors are smaller than the pre-set widths of the word lines (control gate lines) and select gate lines.

Figure 62:
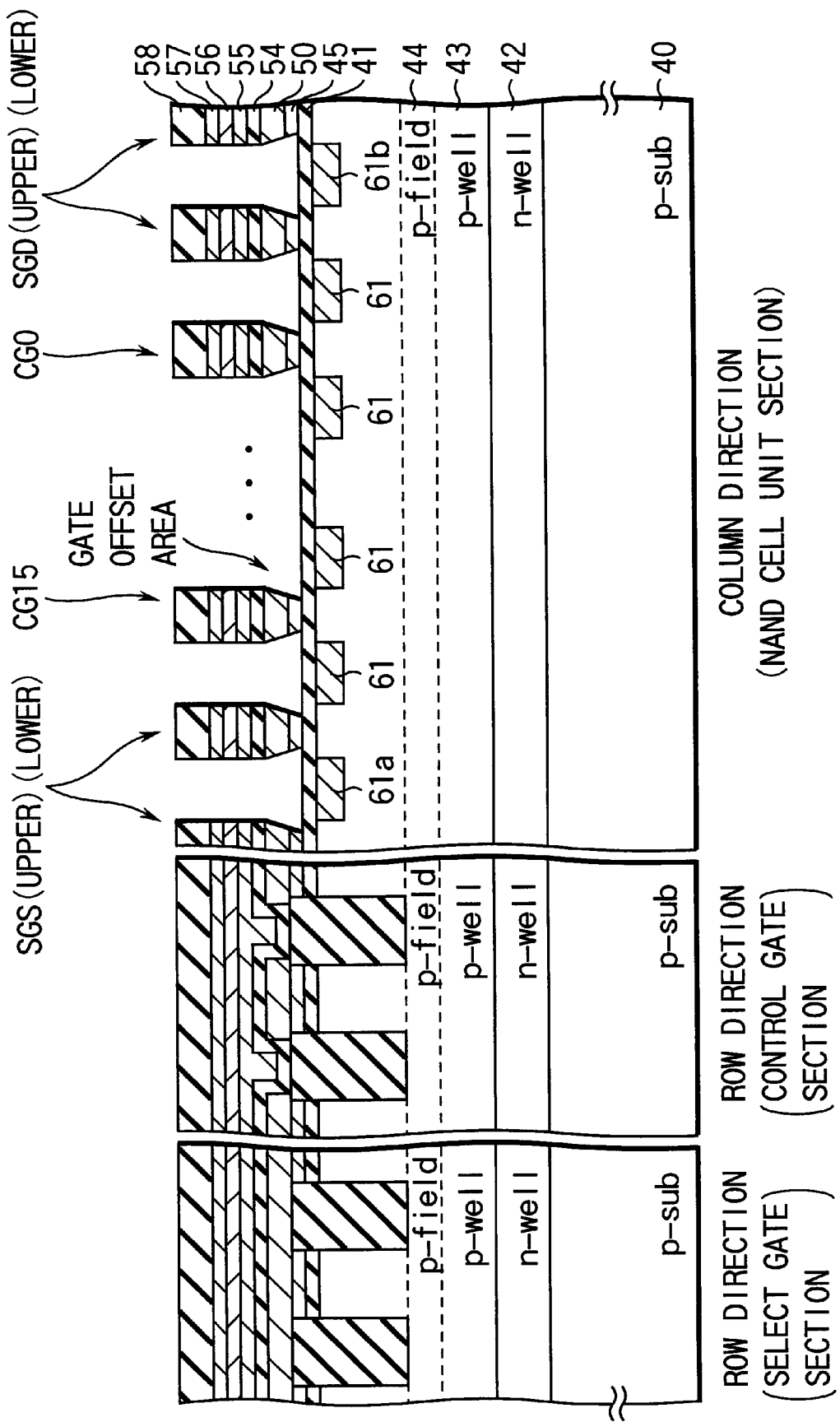
FIG. 62 is a sectional view showing one step of the sixth example of the manufacturing method of the present invention.

As shown in FIG. 62, using the silicon nitride films 58 (control gate electrodes and select gate electrode) as a mask, an n-impurity (e.g., phosphorus) is ion-implanted into a p-well region 43 in self alignment to form n-diffusion layers 61, 61a, and 61b. At this time, since the side walls of the polysilicon films (floating gate electrodes) 50 and 45 have an inverted tapered shape (or overhang shape), gate offset areas are formed at the gate edges of the memory cells and select gate transistors.

After that, a NAND flash EEPROM is completed following the same procedures as those in the manufacturing method of the first example mentioned above (FIGS. 44 to 54).

With the aforementioned manufacturing method as well, the gate offset areas can be easily formed. Therefore, even when miniaturization evolves and the number of bits required for the multi-level configuration increases, parasitic transistors of the gate offset areas can be easily turned off by small Vpass upon programming. For this reason, any program errors in a memory cell to which Vpass is applied can be prevented. On the other hand, the channel of a memory cell which is connected to the selected word line and does not undergo "0"-programming can be sufficiently boosted by Vpp. Hence, any program errors in a memory cell which is applied with Vpp and does not undergo "0"-programming can also be prevented.

The seventh example of a method of manufacturing a memory cell array of a NAND flash EEPROM having the memory cells and select gate transistors of the present invention will be explained below.

A characteristic feature of the manufacturing method of this example lies in that ion implantation for the source/drain region is done from an oblique direction with respect to the surface of the silicon substrate (normally done from a direction perpendicular to the substrate surface) to form gate offset areas at the gate edges of the memory cells and select gate transistors on the drain side.

More specifically, this example relates to the method of manufacturing the memory cells and select gate transistors shown in FIGS. 21A and 21B.

The processes until the control gate electrodes CG0 to CG15, select gate electrodes SGS and SGD, and floating gate electrodes FG are formed on the silicon substrate 40 are executed following the same procedures as those in the manufacturing method of the first example described above (FIGS. 25 to 42).

Figure 63:
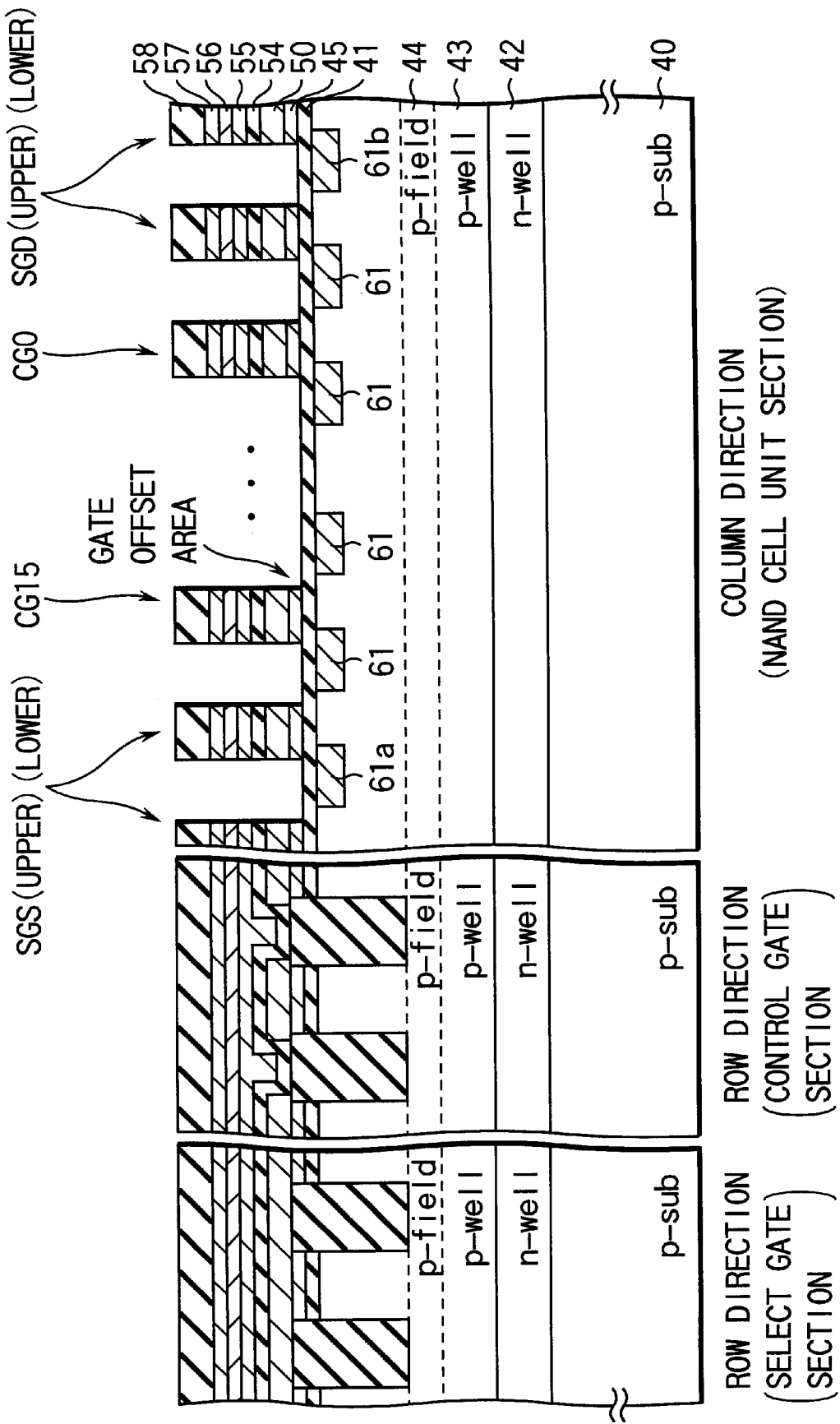
FIG. 63 is a sectional view showing one step of the seventh example of the manufacturing method of the present invention.

As shown in FIG. 63, using silicon nitride films 58 (control gate electrode and select gate electrodes) as a mask, an n-impurity (e.g., phosphorus) is ion-implanted into a p-well region 43 in self alignment to form n-diffusion layers 61, 61a, and 61b. At this time, ion implantation is done from an oblique direction with respect to the surface of the silicon substrate 40 in place of the direction perpendicular to the substrate surface. For example, ion implantation is done from a direction inclined around 7° with respect to the direction perpendicular to the surface of the silicon substrate 40. In this case, gate offset areas are formed at the gate edges of the memory cells and select gate transistors on the drain side.

After that, a NAND flash EEPROM is completed following the same procedures as those in the manufacturing method of the first example mentioned above (FIGS. 44 to 54).

With the aforementioned manufacturing method as well, the gate offset areas can be easily formed. Therefore, even when miniaturization evolves and the number of bits required for the multi-level configuration increases, parasitic transistors of the gate offset areas can be easily turned off by small Vpass upon programming. For this reason, any program errors in a memory cell to which Vpass is applied can be prevented. On the other hand, the channel of a memory cell which is connected to the selected word line and does not undergo "0"-programming can be sufficiently boosted by Vpp. Hence, any program errors in a memory cell which is applied with Vpp and does not undergo "0"-programming can also be prevented.

According to the present invention, by forming high-resistance offset areas that do not largely influence a read operation at the gate edges of the memory cells and select gate transistors or those of the memory cells or select gate transistors, or by forming an impurity profile different from that of a normal diffusion regions (sources/drains, channels, and the like), parasitic transistors which are parasitic on these memory cells and select gate transistors and have threshold values larger than those of these transistors can be formed.

The parasitic transistors serve as cutoff transistors upon self boost or local self boost programming. Since the effects of the cutoff transistors are enhanced in conventional cases wherein program errors readily occur, these transistors are very effective to prevent program errors upon programming.

Also, since the channel of a memory cell which is connected to the selected word line and remains erased upon programming can be set to float due to the presence of the parasitic transistors, a pseudo local self boost programming state can be generated in the potential relationship of normal self boost programming.

Using the memory cells with such structure, memory cells which are connected to the selected word line and unselected bit lines can have a very large channel potential upon self boost or local self boost programming of the NAND flash EEPROM, thus greatly improving program error characteristics.

The memory cells and select gate transistors of the present invention can suppress various problems resulting from a short channel effect, which becomes more conspicuous as the gate length becomes smaller. The problems include, e.g., a variation of program characteristics, long program/erase times, deterioration of data holding characteristics upon read operation, and the like.

The present invention is particularly effective in a multi-level memory which is designated according to the design rule of 0.25 µm or less, and stores three or more data per memory cell. That is, in a conventional multi-level memory, as the program threshold value increases, program errors frequently occur upon self boost or local self boost programming, thus disturbing miniaturization and an increase in the number of bits required for the multi-level configuration of the memory. However, since the cutoff characteristics of the memory cell of the present invention improve with increasing threshold value, miniaturization and an increase in the number of bits required for the multi-level configuration free from any program errors can be achieved.

The memory cell structure of the present invention is much simple, is easy to manufacture, and suffers little increase in cost, compared to the memory cell structures conventionally proposed to prevent program errors (e.g., a booster plate structure, channel boost capacitance (CBC) structure, and the like).

Therefore, the present invention is most effective when used in combination with a memory having a multi-level configuration, in which the data value (number of bits) to be stored per memory cell increases from a two-level value to a four-level value, eight-level value, . . . in a NAND flash EEPROM having a memory size of 256 Gbits or more. Even in such case, any program errors can be prevented, and a highly reliable NAND flash EEPROM can be provided.

To recapitulate, the memory cell of the present invention is most suitable for miniaturization and an increase in number of bits for the multi-level configuration in a future NAND flash EEPROM.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory comprising:
   a NAND cell series having one and another ends, and said NAND cell series including a plurality of memory cells connected in series;
   a first select gate transistor connected between the one end of said NAND cell series and a bit line; and
   a second select gate transistor connected between the another end of said NAND cell series and a source line,
   wherein each of the plurality of memory cells consists of a main transistor, and parasitic transistors that sandwich said main transistor, and
   said main transistor and said parasitic transistors share a gate electrode, and threshold values of said parasitic transistors are higher than a threshold value of said main transistor.

2. A nonvolatile semiconductor memory according to claim 1, wherein said main transistor is located at a central portion of the gate electrode, and said parasitic transistors are located at edge portions of the gate electrode.

3. A nonvolatile semiconductor memory according to claim 1, wherein offset areas defined by spaces are located between edge portions of the gate electrode and source/drain layers, and
   said parasitic transistors are located in said offset areas.

4. A nonvolatile semiconductor memory according to claim 1, wherein offset areas defined by side-wall spaces are located between edge portions of the gate electrode and source/drain layers, and
   said parasitic transistors are located in said offset areas.

5. A nonvolatile semiconductor memory according to claim 1, wherein offset areas defined by bird's beak insulators are located at edge portions of the gate electrode, and said parasitic transistors are located in said offset areas.

6. A nonvolatile semiconductor memory according to claim 1, wherein the gate electrode has a lower portion and an upper portion, a width of the lower portion is narrower than that of the upper portion, said parasitic transistors are located in offset areas defined by the edge portions.

7. A nonvolatile semiconductor memory according to claim 1, wherein upon a program operation, a memory cell in an erase state of the plurality of memory cells is turned on when a channel is at a ground potential, and is turned off when the channel is at a positive potential.

8. A nonvolatile semiconductor memory according to claim 1, wherein upon a program operation, a channel potential of a program inhibit cell of the plurality of memory cells is boosted by potentials applied to control gate electrodes of the plurality of memory cells.

9. A nonvolatile semiconductor memory according to claim 1, wherein a substrate bias effect of said parasitic transistors is larger than a substrate bias effect of said main transistor.

10. A nonvolatile semiconductor memory according to claim 1, wherein a rate of change in threshold value of the plurality of memory cells due to a substrate bias effect differs between a range where a channel potential is smaller than a predetermined value and a range where the channel potential is larger than the predetermined value.

11. A nonvolatile semiconductor memory according to claim 1, wherein each of the plurality of memory cells stores multi-level data.

12. A nonvolatile semiconductor memory comprising:
a NAND cell series having one and another ends, and said NAND cell series including a plurality of memory cells connected in series;
a first select gate transistor connected between the one end of said NAND cell series and a bit line; and
a second select gate transistor connected between the another end of said NAND cell series and a source line,
wherein each of the plurality of memory cells consists of a main transistor, and a parasitic transistor connected in series with said main transistor, and
said main transistor and said parasitic transistor share a gate electrode, and a threshold value of said parasitic transistor is higher than a threshold value of said main transistor.

13. A nonvolatile semiconductor memory according to claim 12, wherein said parasitic transistor is located on the bit line side of said main transistor.

14. A nonvolatile semiconductor memory according to claim 12, wherein said parasitic transistor is located on the source line side of said main transistor.

15. A nonvolatile semiconductor memory according to claim 12, wherein said main transistor is located at a central portion of the gate electrode, and said parasitic transistor is located at an edge portion of the gate electrode.

16. A nonvolatile semiconductor memory according to claim 12, wherein an offset area defined by a space is located between an edge portion of the gate electrode and a source/drain layer, and said parasitic transistor is located in said offset area.

17. A nonvolatile semiconductor memory according to claim 12, wherein an offset area defined by a side-wall space is located between an edge portion of the gate electrode and a source/drain layer, and said parasitic transistor is located in said offset area.

18. A nonvolatile semiconductor memory according to claim 12, wherein an offset area defined by a bird's beak insulator is located at an edge portion of the gate electrode, and said parasitic transistor is located in said offset area.

19. A nonvolatile semiconductor memory according to claim 12, wherein the gate electrode has a lower portion and an upper portion, a width of the lower portion is narrower than that of the upper portion, and said parasitic transistor is located in an offset area defined by the edge portion.

20. A nonvolatile semiconductor memory according to claim 12, wherein upon a program operation, a memory cell in an erase state of the plurality of memory cells is turned on when a channel is at a ground potential, and is turned off when the channel is at a positive potential.

21. A nonvolatile semiconductor memory according to claim 12, wherein upon a program operation, a channel potential of a program inhibit cell of the plurality of memory cells is boosted by potentials applied to control gate electrodes of the plurality of memory cells.

22. A nonvolatile semiconductor memory according to claim 12, wherein a substrate bias effect of said parasitic transistor is larger than a substrate bias effect of said main transistor.

23. A nonvolatile semiconductor memory according to claim 12, wherein a rate of change in threshold value of the plurality of memory cells due to a substrate bias effect differs between a range where a channel potential is smaller than a predetermined value and a range where the channel potential is larger than the predetermined value.

24. A nonvolatile semiconductor memory according to claim 12, wherein each of the plurality of memory cells stores multi-level data.

25. A nonvolatile semiconductor memory comprising:
a NAND cell series having one and another ends, and said NAND cell series including a plurality of memory cells connected in series;
a first select gate transistor connected between the one end of said NAND cell series and a bit line; and
a second select gate transistor connected between the another end of said NAND cell series and a source line,
wherein at least one of said first and second select gate transistors consists of a main transistor, and parasitic transistors that sandwich said main transistor, and
said main transistor and said parasitic transistors share a gate electrode, and threshold values of said parasitic transistors are higher than a threshold value of said main transistor.

26. A nonvolatile semiconductor memory according to claim 25, wherein said main transistor is located at a central portion of the gate electrode, and said parasitic transistors are located at edge portions of the gate electrode.

27. A nonvolatile semiconductor memory according to claim 25, wherein offset areas defined by spaces are located between edge portions of the gate electrode and source/drain layers, and said parasitic transistors are located in said offset areas.

28. A nonvolatile semiconductor memory according to claim 25, wherein offset areas defined by side-wall spaces are located between edge portions of the gate electrode and source/drain layers, and said parasitic transistors are located in said offset areas.

29. A nonvolatile semiconductor memory according to claim 25, wherein offset areas defined by bird's beak insulators are located at edge portions of the gate electrode, and said parasitic transistors are located in said offset areas.

30. A nonvolatile semiconductor memory according to claim 25, wherein the gate electrode has a lower portion and an upper portion, a width of the lower portion is narrower than that of the upper portion, and said parasitic transistors are located in offset areas defined by the edge portions.

31. A nonvolatile semiconductor memory according to claim 25, wherein upon a program operation, a memory cell in an erase state of the plurality of memory cells is turned on when a channel is at a ground potential, and is turned off when the channel is at a positive potential.

32. A nonvolatile semiconductor memory according to claim 25, wherein upon a program operation, a channel potential of a program inhibit cell of the plurality of memory cells is boosted by potentials applied to control gate electrodes of the plurality of memory cells.

33. A nonvolatile semiconductor memory according to claim 25, wherein a substrate bias effect of said parasitic transistors is larger than a substrate bias effect of said main transistor.

34. A nonvolatile semiconductor memory according to claim 25, wherein a rate of change in threshold value of one of said first and second select gate transistors due to a substrate bias effect differs between a range where a channel potential is smaller than a predetermined value and a range where the channel potential is larger than the predetermined value.

35. A nonvolatile semiconductor memory according to claim 25, wherein each of the plurality of memory cells stores multi-level data.

36. A nonvolatile semiconductor memory comprising:
a NAND cell series having one and another ends, and said NAND cell series including a plurality of memory cells connected in series;
a first select gate transistor connected between the one end of said NAND cell series and a bit line; and
a second select gate transistor connected between the another end of said NAND cell series and a source line,
wherein at least one of said first and second select gate transistors consists of a main transistor, and a parasitic transistor connected in series with said main transistor, and
said main transistor and said parasitic transistor share a gate electrode, and a threshold value of said parasitic transistor is higher than a threshold value of said main transistor.

37. A nonvolatile semiconductor memory according to claim 36, wherein said parasitic transistor is located on the bit line side of said main transistor.

38. A nonvolatile semiconductor memory according to claim 36, wherein said parasitic transistor is located on the source line side of said main transistor.

39. A nonvolatile semiconductor memory according to claim 36, wherein said main transistor is located at a central portion of the gate electrode, and said parasitic transistor is located at an edge portion of the gate electrode.

40. A nonvolatile semiconductor memory according to claim 36, wherein an offset area defined by a space is located between an edge portion of the gate electrode and a source/drain layer, and
said parasitic transistor is located in said offset area.

41. A nonvolatile semiconductor memory according to claim 36, wherein an offset area defined by a side-wall space is located between an edge portion of the gate electrode and a source/drain layer, and
said parasitic transistor is located in said offset area.

42. A nonvolatile semiconductor memory according to claim 36, wherein an offset area defined by a bird's beak insulator is located at an edge portion of the gate electrode, and
said parasitic transistor is located in said offset area.

43. A nonvolatile semiconductor memory according to claim 36, wherein the gate electrode has a lower portion and an upper portion, a width of the lower portion is narrower than that of the upper portion, and
said parasitic transistor is located in an offset area defined by the edge portion.

44. A nonvolatile semiconductor memory according to claim 36, wherein upon a program operation, a memory cell in an erase state of the plurality of memory cells is turned on when a channel is at a ground potential, and is turned off when the channel is at a positive potential.

45. A nonvolatile semiconductor memory according to claim 36, wherein upon a program operation, a channel potential of a program inhibit cell of the plurality of memory cells is boosted by potentials applied to control gate electrodes of the plurality of memory cells.

46. A nonvolatile semiconductor memory according to claim 36, wherein a substrate bias effect of said parasitic transistor is larger than a substrate bias effect of said main transistor.

47. A nonvolatile semiconductor memory according to claim 36, wherein a rate of change in threshold value of one of said first and second select gate transistors due to a substrate bias effect differs between a range where a channel potential is smaller than a predetermined value and a range where the channel potential is larger than the predetermined value.

48. A nonvolatile semiconductor memory according to claim 36, wherein each of the plurality of memory cells stores multi-level data.

* * * * *